(12) United States Patent
Sano

(10) Patent No.: US 11,039,094 B2
(45) Date of Patent: Jun. 15, 2021

(54) LIGHT RECEIVING ELEMENT, IMAGING ELEMENT, AND IMAGING DEVICE

(71) Applicant: SONY SEMICONDUCTOR SOLUTIONS CORPORATION, Kanagawa (JP)

(72) Inventor: Takuya Sano, Tokyo (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 0 days.

(21) Appl. No.: 16/344,182

(22) PCT Filed: Jan. 5, 2018

(86) PCT No.: PCT/JP2018/000097
§ 371 (c)(1),
(2) Date: Apr. 23, 2019

(87) PCT Pub. No.: WO2018/135320
PCT Pub. Date: Jul. 26, 2018

(65) Prior Publication Data
US 2019/0342510 A1    Nov. 7, 2019

(30) Foreign Application Priority Data

Jan. 19, 2017  (JP) .............................. JP2017-007479
Dec. 26, 2017  (JP) .............................. JP2017-248888

(51) Int. Cl.
*H01L 27/146*      (2006.01)
*H04N 5/3745*     (2011.01)
(Continued)

(52) U.S. Cl.
CPC ............. *H04N 5/351* (2013.01); *G01S 7/481* (2013.01); *G01S 17/89* (2013.01);
(Continued)

(58) Field of Classification Search
CPC ............... H01L 31/11; H01L 27/14609; H01L 27/1464; H01L 31/101; H01L 27/1461;
(Continued)

(56) References Cited

U.S. PATENT DOCUMENTS 6,423,980 B1 *  7/2002  Wilson ................... B82Y 20/00
                                                              257/21
9,117,712 B1     8/2015  Oggier
(Continued)

FOREIGN PATENT DOCUMENTS

EP        2960952        12/2015
JP        2008-122342     5/2008
(Continued)

OTHER PUBLICATIONS

International Search Report prepared by the Japan Patent Office dated Feb. 14, 2018, for International Application No. PCT/JP2018/000097.

(Continued)

*Primary Examiner* — Clifford Hilaire
(74) *Attorney, Agent, or Firm* — Sheridan Ross P.C.

(57) ABSTRACT

The present technology relates to a light receiving element, an imaging element, and an imaging device. A light receiving element includes an on-chip lens, a wiring layer, and a semiconductor layer arranged between the on-chip lens and the wiring layer. The semiconductor layer includes a first voltage application unit to which a first voltage is applied, a second voltage application unit to which a second voltage is applied, a first charge detection unit, and a second charge detection unit. The wiring layer includes at least one layer including first voltage application wiring configured to supply the first voltage, second voltage application wiring configured to supply the second voltage, and a reflection member that overlaps the first charge detection unit or the (Continued)

second charge detection unit, in plan view. The present technology, for example, can be applied to a light receiving element configured to measure a distance.

20 Claims, 47 Drawing Sheets

(51) Int. Cl.
H04N 5/351 (2011.01)
G01S 7/481 (2006.01)
G01S 17/89 (2020.01)

(52) U.S. Cl.
CPC .. *H01L 27/14612* (2013.01); *H01L 27/14623* (2013.01); *H01L 27/14627* (2013.01); *H01L 27/14629* (2013.01); *H01L 27/14636* (2013.01); *H01L 27/14643* (2013.01); *H04N 5/3745* (2013.01)

(58) Field of Classification Search
CPC ....... G01S 7/4863; G01S 17/894; H04N 3/15; H04N 5/369
See application file for complete search history.

(56) References Cited

U.S. PATENT DOCUMENTS

| | | | |
|---|---|---|---|
| 2006/0132633 A1* | 6/2006 | Nam | H01L 27/14603 348/308 |
| 2007/0001100 A1* | 1/2007 | Hsu | H01L 27/1464 250/214.1 |
| 2009/0295979 A1* | 12/2009 | Matsuo | H01L 27/14636 348/335 |
| 2010/0078749 A1 | 4/2010 | Sahara et al. | |
| 2011/0255071 A1 | 10/2011 | Van Der Tempel et al. | |
| 2013/0193546 A1 | 8/2013 | Webster et al. | |
| 2014/0061439 A1 | 3/2014 | Toda | |
| 2014/0069496 A1* | 3/2014 | Biswas | B82Y 20/00 136/256 |
| 2015/0001664 A1 | 1/2015 | Van Der Tempel et al. | |
| 2015/0356351 A1 | 12/2015 | Saylor et al. | |
| 2017/0194367 A1* | 7/2017 | Fotopoulou | H01L 27/14609 |
| 2017/0301708 A1 | 10/2017 | Fotopoulou et al. | |
| 2018/0054581 A1 | 2/2018 | Sano | |
| 2018/0182806 A1* | 6/2018 | Jin | H01L 27/14649 |

FOREIGN PATENT DOCUMENTS

| | | |
|---|---|---|
| JP | 2011-086904 | 4/2011 |
| JP | 2014-053429 | 3/2014 |
| JP | 2015-510259 | 4/2015 |
| JP | 2016-510467 | 4/2016 |
| JP | 2017-522727 | 6/2017 |
| WO | WO 2016/167044 | 12/2015 |
| WO | WO 20161063727 | 4/2016 |
| WO | WO 2015/197685 | 10/2016 |

OTHER PUBLICATIONS

Official Action (no English translation available) for Japanese Patent Application No. 2017248888, dated Jan. 7, 2020, 7 pages.
Partial European Search Report for European Patent Application No. 18740995.8, dated Jan. 31, 2020, 11 pages.
Official Action (with English translation) for Korean Patent Application No. 10-2019-7011030, dated Feb. 20, 2020, 9 pages.

* cited by examiner

FIG. 33
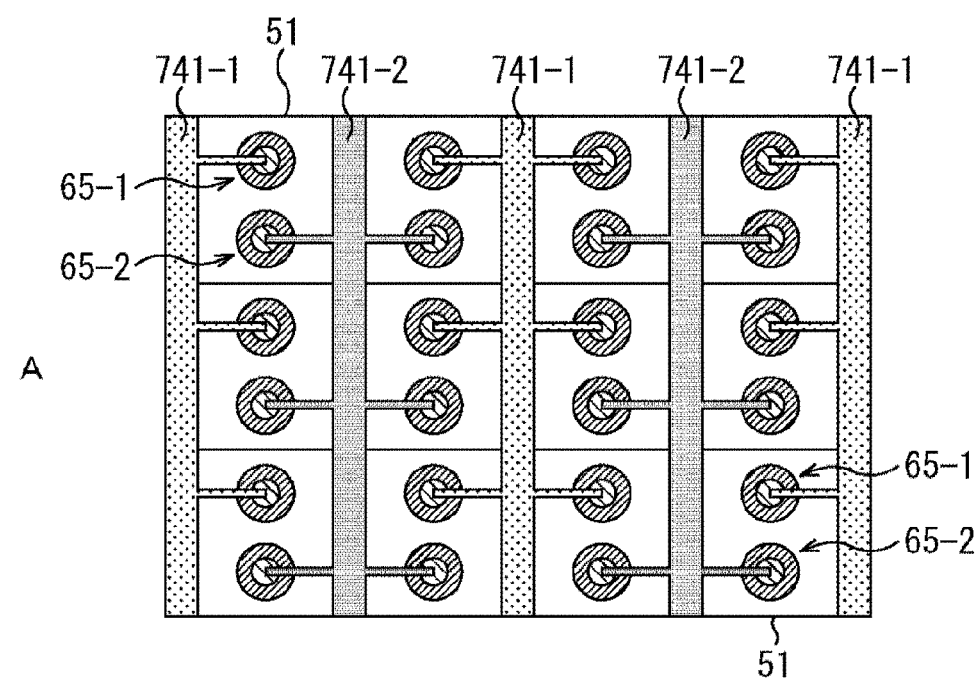
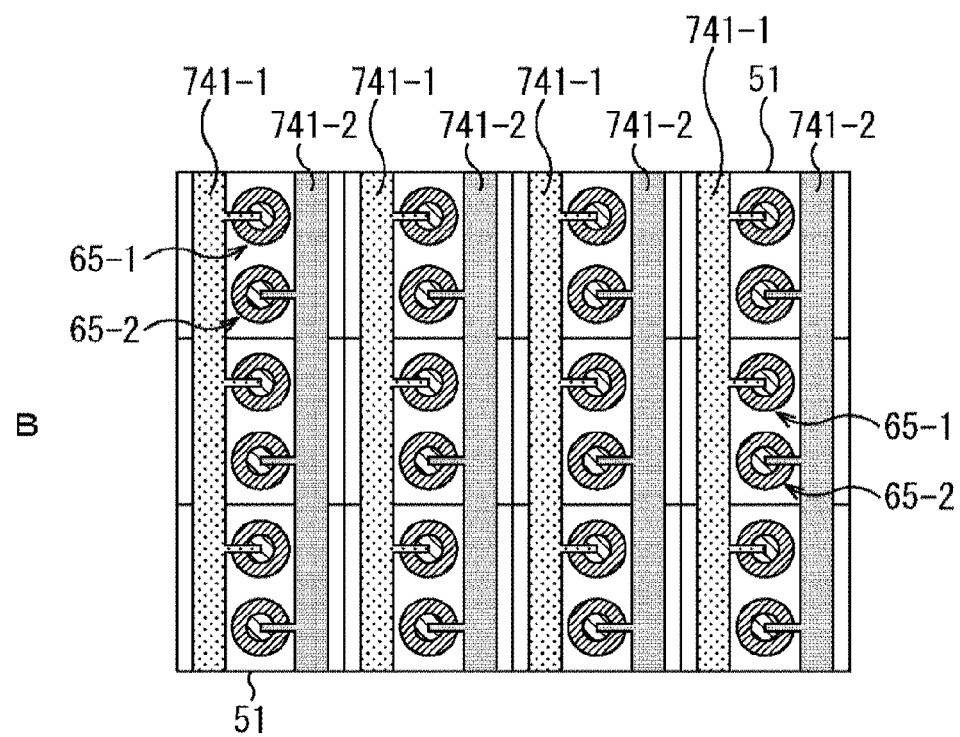

LIGHT RECEIVING ELEMENT, IMAGING ELEMENT, AND IMAGING DEVICE

CROSS REFERENCE TO RELATED APPLICATIONS

This application is a national stage application under 35 U.S.C. 371 and claims the benefit of PCT Application No. PCT/JP2018/000097 having an international filing date of 5 Jan. 2018, which designated the United States, which PCT application claimed the benefit of Japanese Patent Application Nos. 2017-007479 filed 19 Jan. 2017 and 2017-248888 filed 26 Dec. 2017, the entire disclosures of each of which are incorporated herein by reference.

TECHNICAL FIELD

The present technology relates to a light receiving element, an imaging element, and an imaging device, and in particular, relates to a light receiving element, an imaging element, and an imaging device, in which characteristics can be improved.

BACKGROUND ART

In the related art, a distance measuring system using an indirect time of flight (ToF) method is known. In such a distance measuring system, a sensor capable of sorting signal charges obtained by receiving active light that is emitted by using a light emitting diode (LED) or a laser in a certain phase, and is reflected on a target, into different regions at a high speed, is absolutely imperative.

Therefore, for example, a technology has been proposed in which a voltage is directly applied to a substrate of a sensor, and a current is generated in the substrate, and thus, it is possible to modulate a region over a wide range in the substrate at a high speed (for example, refer to Patent Document 1). Such a sensor is also referred to as a current assisted photonic demodulator (CAPD) sensor.

CITATION LIST

Patent Document

Patent Document 1: Japanese Patent Application Laid-Open No. 2011-86904

SUMMARY OF THE INVENTION

Problems to be Solved by the Invention

However, in the technology described above, it was difficult to obtain a CAPD sensor having sufficient characteristics.

For example, the CAPD sensor described above is a front surface irradiation type sensor in which wiring or the like is arranged on a surface of the substrate on a side receiving light from the outside.

In order to ensure a photoelectric conversion region, it is desirable that a constituent shielding a light path of light to be incident, such as the wiring, is not provided on a light receiving surface side of a photodiode (PD), that is, a photoelectric conversion unit. However, in a front surface irradiation type CAPD sensor, it is necessary to arrange wiring for charge extraction, various control lines, or a signal line on the light receiving surface side of the PD, according to a structure, and thus, the photoelectric conversion region is limited. That is, it is not possible to ensure a sufficient photoelectric conversion region, and there is a case where characteristics such as a pixel sensitivity decrease.

In addition, in the case of considering that the CAPD sensor is used in the presence of external light, an external light component becomes a noise component for the indirect ToF method of measuring a distance by using active light, and thus, in order to obtain distance information by ensuring a sufficient signal to noise ratio (SN ratio), it is necessary to ensure sufficient saturated signal quantity (Qs). However, in the front surface irradiation type CAPD sensor, there is a limitation in a wiring layout, and thus, it was necessary to devise to use a method other than wiring capacity, such as a method of providing an additional transistor for ensuring capacity.

Further, in the front surface irradiation type CAPD sensor, a signal extraction unit referred to as a Tap, is arrange on a side of the substrate on which light is incident. On the other hand, in the case of considering photoelectric conversion in an Si substrate, there is a difference in an attenuation rate at a wavelength of light, but a ratio that photoelectric conversion is performed on a light incidence surface side, increases. For this reason, in a front surface type CAPD sensor, there is a possibility of performing the photoelectric conversion in an inactive tap region that is a Tap region to which the signal charge is not sorted, in a Tap region where the signal extraction unit is provided, increases. In the indirect ToF sensor, distance measuring information is obtained by using a signal sorted to each charge accumulation region according to the phase of the active light, and thus, a component directly subjected to the photoelectric conversion in the inactive tap region, becomes a noise, and as a result thereof, there is a possibility that a distance measuring accuracy is degraded. That is, there is a possibility that the characteristics of the CAPD sensor decrease.

The present technology has been made in consideration of such circumstances, and is intended to improve characteristics.

Solutions to Problems

A light receiving element of a first aspect of the present technology, including:

an on-chip lens;
a wiring layer; and
a semiconductor layer arranged between the on-chip lens and the wiring layer,
in which the semiconductor layer includes
a first voltage application unit to which a first voltage is applied,
a second voltage application unit to which a second voltage is applied, the second voltage being different from the first voltage,
a first charge detection unit arranged around the first voltage application unit, and
a second charge detection unit arranged around the second voltage application unit,
the wiring layer includes
at least one layer including first voltage application wiring configured to supply the first voltage, second voltage application wiring configured to supply the second voltage, and a reflection member, and
the reflection member is provided to overlap with the first charge detection unit or the second charge detection unit, in plan view.

In the first aspect of the present technology, the on-chip lens, the wiring layer, and the semiconductor layer arranged between the on-chip lens and the wiring layer, are provided, and the first voltage application unit to which the first voltage is applied, the second voltage application unit to which the second voltage is applied, the second voltage being different from the first voltage, the first charge detection unit arranged around the first voltage application unit, and the second charge detection unit arranged around the second voltage application unit, are provided in the semiconductor layer. At least one layer including the first voltage application wiring configured to supply the first voltage, the second voltage application wiring configured to supply the second voltage, and the reflection member, is provided in the wiring layer, and the reflection member is provided to overlap with the first charge detection unit or the second charge detection unit, in plan view.

An imaging element of a second aspect of the present technology, including:

a pixel array portion including a plurality of pixels configured to perform photoelectric conversion with respect to incident light, in which the pixel includes a substrate configured to perform the photoelectric conversion with respect to the incident light, and a signal extraction unit including a voltage application unit for generating an electrical field by applying a voltage to the substrate, and a charge detection unit for detecting a signal carrier generated by the photoelectric conversion, the signal extraction unit being provided on a surface of the substrate on a side opposite to an incidence surface on which the light is incident, in the substrate.

It is possible to form two of the signal extraction units in the pixel.

It is possible to form one of the signal extraction units in the pixel.

It is possible to form three or more of the signal extraction units in the pixel.

It is possible to share the signal extraction unit between the pixel, and another pixel adjacent to the pixel.

It is possible to share the voltage application unit between the pixel, and another pixel adjacent to the pixel.

It is possible to provide a P type semiconductor region as the voltage application unit, and an N type semiconductor region as the charge detection unit, in the signal extraction unit, the N type semiconductor region being formed to surround the P type semiconductor region.

It is possible to provide an N type semiconductor region as the charge detection unit, and a P type semiconductor region as the voltage application unit, in the signal extraction unit, the P type semiconductor region being formed to surround the N type semiconductor region.

It is possible to provide a first N type semiconductor region and a second N type semiconductor region as the charge detection unit, and a P type semiconductor region as the voltage application unit, in the signal extraction unit, the P type semiconductor region being formed in a position interposed between the first N type semiconductor region and the second N type semiconductor region.

It is possible to provide a first P type semiconductor region and a second P type semiconductor region as the voltage application unit, and an N type semiconductor region as the charge detection unit, in the signal extraction unit, the N type semiconductor region being formed in a position interposed between the first P type semiconductor region and the second P type semiconductor region.

It is possible to apply a voltage to the incidence surface side in the substrate.

It is possible to further provide a reflection member configured to reflect the light incident on the substrate from the incidence surface, in the pixel, the reflection member being formed on a surface of the substrate on a side opposite to the incidence surface.

It is possible for the signal carrier to include an electron.

It is possible for the signal carrier to include a hole.

It is possible to further provide a lens configured to condense the light, and to allow the light to be incident on the substrate, in the pixel.

It is possible to further provide an inter-pixel light shielding unit configured to shield the incident light, in the pixel, the inter-pixel light shielding unit being formed in a pixel end portion on the incidence surface of the substrate.

It is possible to further provide a pixel separation region configured to penetrate through at least a part of the substrate and to shield the incident light, in the pixel, the pixel separation region being formed in a pixel end portion in the substrate.

It is possible for the substrate to include a P type semiconductor substrate having resistance of greater than or equal to 500 [Ωcm].

It is possible for the substrate to include an N type semiconductor substrate having resistance of greater than or equal to 500 [Ωcm].

In the second aspect of the present technology, the pixel array port ion including the plurality of pixels configured to perform the photoelectric conversion with respect to the incident light, is provided in the imaging element, and the substrate configured to perform the photoelectric conversion with respect to the incident light, and the extraction unit including the signal extraction unit including the voltage application unit for generating the electrical field by applying the voltage to the substrate, and the charge detection unit for detecting the signal carrier generated by the photoelectric conversion, are provided in the pixel, the extraction unit being provided on the surface of the substrate on a side opposite to the incidence surface on which the light is incident, in the substrate.

An imaging device of a third aspect of the present technology, including:

a pixel array portion including a plurality of pixels configured to perform photoelectric conversion with respect to incident light; and a signal processor configured to calculate distance information to a target, on a basis of a signal output from the pixel, in which the pixel includes a substrate configured to perform the photoelectric conversion with respect to the incident light, and a signal extraction unit including a voltage application unit for generating an electrical field by applying a voltage to the substrate, and a charge detection unit for detecting a signal carrier generated by the photoelectric conversion, the signal extraction unit being provided on a surface of the substrate on a side opposite to an incidence surface on which the light is incident, in the substrate.

In the third aspect of the present technology, the pixel array portion including the plurality of pixels configured to perform the photoelectric conversion with respect to the incident light; and the signal processor configured to calculate the distance information to the target, on the basis of the signal output from the pixel, are provided in the imaging device, and the substrate configured to perform the photoelectric conversion with respect to the incident light, and the extraction unit including the signal extraction unit including the voltage application unit for generating the electrical field by applying the voltage to the substrate, and the charge detection unit for detecting the signal carrier generated by the photoelectric conversion, are provided in the pixel, the extraction unit being provided on the surface of the substrate on a side opposite to the incidence surface on which the light is incident, in the substrate.

Effects of the Invention

According to the first aspect to the third aspect of the present technology, it is possible to improve characteristics.

Furthermore, the effects described here are not necessarily limited, but may include any of the effects described in the present disclosure.

BRIEF DESCRIPTION OF DRAWINGS

FIG. 33 is a diagram illustrating an arrangement example of a voltage supply line to which Periodic arrangement is adopted.

MODE FOR CARRYING OUT THE INVENTION

Hereinafter, embodiments to which the present technology is applied, will be described with reference to the drawings.

First Embodiment

<Configuration Example of Solid-State Imaging Element>

The present technology is intended to improve characteristics such as a pixel sensitivity by a CAPD sensor having a rear surface irradiation type configuration.

The present technology, for example, can be applied to a solid-state imaging element configuring a distance measuring system measuring a distance by an indirect ToF method, an imaging device including such a solid-state imaging element, or the like.

For example, the distance measuring system is mounted on a vehicle, and can be applied to an in-vehicle system that measures a distance to a target outside the vehicle, a gesture recognition system that measures a distance to a target such as the hand of a user, and recognizes a gesture of the user on the basis of a measurement result, or the like. In this case, a gesture recognition result, for example, can be used for manipulating a car navigation system, or the like.

Figure 1:
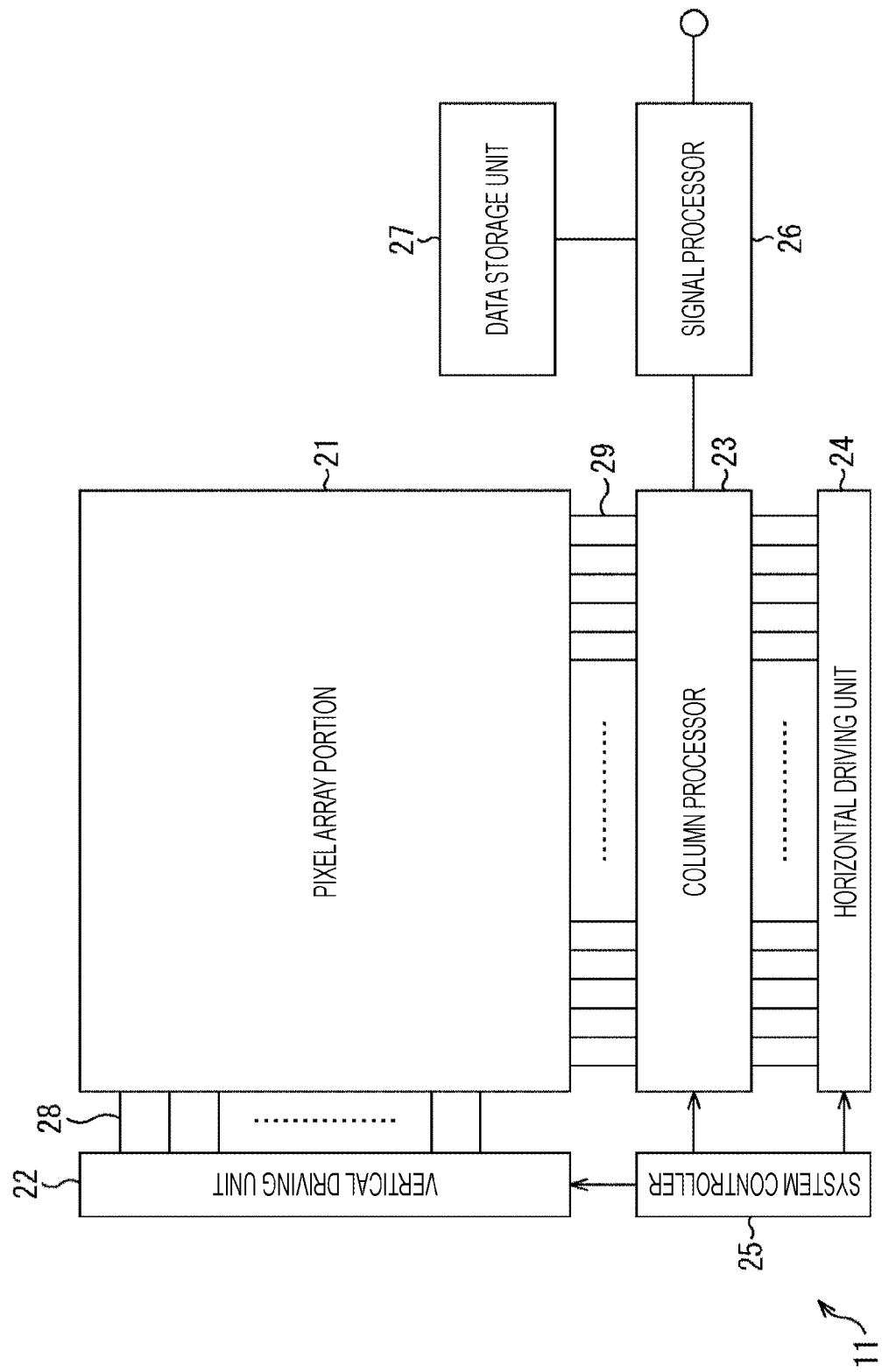
FIG. 1 is a diagram illustrating a configuration example of a solid-state imaging element.

FIG. 1 is a diagram illustrating a configuration example of one embodiment of a solid-state imaging element (a light receiving element) to which the present technology is applied.

A solid-state imaging element 11 illustrated in FIG. 1 is a rear surface irradiation type CAPD sensor, and is provided in an imaging device having a distance measuring function.

The solid-state imaging element 11 includes a pixel array portion 21 formed on a semiconductor substrate (not illustrated), and a peripheral circuit portion integrated on the same semiconductor substrate as that of the pixel array portion 21. The peripheral circuit portion, for example, includes a vertical driving unit 22, a column processor 23, a horizontal driving unit 24, and a system controller 25.

A signal processor 26 and a data storage unit 27 are further provided in the solid-state imaging element 11. Furthermore, the signal processor 26 and the data storage unit 27 may be mounted on the same substrate as that of the solid-state imaging element 11, or may be arranged on another substrate of an imaging device, different from that of the solid-state imaging element 11.

In the pixel array portion 21, unit pixels (hereinafter, also simply referred to as pixels) that generate a charge according to the amount of received light, and output a signal according to the charge, are two-dimensionally arranged in a row direction and a column direction, that is, into the shape of a matrix. That is, the pixel array portion 21 includes a plurality of pixels that perform photoelectric conversion with respect to incident light, and outputs a signal according to a charge obtained by the photoelectric conversion.

Here, the row direction indicates an array direction of the pixels in a pixel row (that is, a horizontal direction), and the column direction indicates an array direction of the pixels in a pixel column (that is, a vertical direction). That is, the row direction is the horizontal direction in the drawings, and the column direction is the vertical direction in the drawings.

In the pixel array portion 21, a pixel driving line 28 is wired along the row direction for each pixel row, and two vertical signal lines 29 are wired along the column direction for each pixel column, with respect to a matrix-like pixel array. For example, the pixel driving line 28 transmits a driving signal for performing driving at the time of reading out a signal from the pixel. Furthermore, in FIG. 1, the pixel driving line 28 is illustrated as one wiring, but is not limited to one wiring. One end of the pixel driving line 28 is connected to an output end corresponding to each row of the vertical driving unit 22.

The vertical driving unit 22 includes a shift register, an address decoder, or the like, and drives each of the pixels of the pixel array portion 21, at the same time for all of the pixels, in row unit, or the like. That is, the vertical driving unit 22 configures a driving unit controlling the operation of each of the pixels of the pixel array portion 21, along with a system controller 25 controlling the vertical driving unit 22.

Furthermore, in distance measurement of the indirect ToF method, the number of elements (CAPD elements) to be driven at a high speed, connected to one control line, affects controllability of high speed driving or a driving accuracy. There are many cases where the solid-state imaging element used in the distance measurement of the indirect ToF method, is formed as a long pixel array in the horizontal direction. Therefore, in such a case, the vertical signal line 29 or another control line long in the vertical direction may be used in the control line of the element to be driven at a high speed. In this case, for example, a plurality of pixels arrayed in the vertical direction, are connected to the vertical signal line 29 or another control line long in the vertical direction, and the pixel is driven, that is, the CAPD sensor is driven by a driving unit provided separated from the vertical driving unit 22, the horizontal driving unit 24, or the like, through the vertical signal line 29 or another control line.

The signal output from each of the pixels in the pixel row according to driving control of the vertical driving unit 22, is input into the column processor 23 through the vertical signal line 29. The column processor 23 performs predetermined signal processing with respect to the signal output from each of the pixels through the vertical signal line 29, and temporarily retains a pixel signal after the signal processing.

Specifically, the column processor 23 performs noise removal processing, analog to digital (AD) conversion processing, or the like, as the signal processing.

The horizontal driving unit 24 includes a shift register, an address decoder, or the like, and sequentially selects a unit circuit corresponding to the pixel column of the column processor 23. According to selection scanning of the horizontal driving unit 24, the pixel signal subjected to the signal processing, is sequentially output for each of the unit circuits in the column processor 23.

The system controller 25 includes a timing generator generating various timing signals, or the like, and performs driving control of the vertical driving unit 22, the column processor 23, the horizontal driving unit 24, and the like, on the basis of various timing signals generated by the timing generator.

The signal processor 26 has at least an arithmetic processing function, and performs various signal processing such as arithmetic processing, on the basis of the pixel signal output from the column processor 23. The data storage unit 27 temporarily stores data necessary for the signal processing of the signal processor 26.

<Configuration Example of Pixel>

Next, a configuration example of the pixel provided in the pixel array portion 21 will be described. The pixel provided in the pixel array portion 21, for example, has a configuration as illustrated in FIG. 2.

Figure 2:
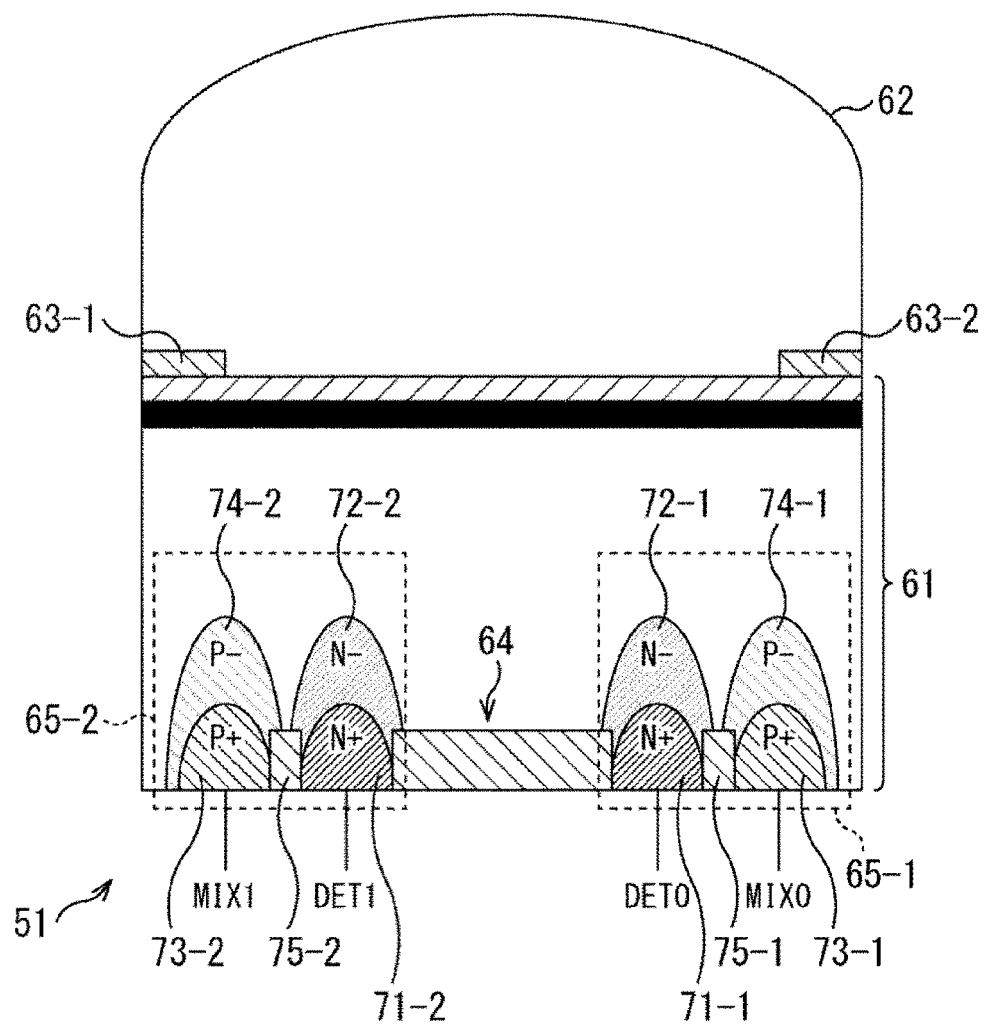
FIG. 2 is a diagram illustrating a configuration example of a pixel.

FIG. 2 illustrates a sectional surface of one pixel 51 provided in the pixel array portion 21, and the pixel 51 receives light incident from the outside, in particular, infrared light, performs photoelectric conversion with respect to the light, and outputs a signal according to a charge obtained by the photoelectric conversion.

The pixel 51, for example, includes a silicon substrate, that is, a substrate 61 (a semiconductor layer) that is a P type semiconductor substrate including a P type semiconductor region, and an on-chip lens 62 formed on the substrate 61.

For example, in the drawings, the thickness of the substrate 61 in the vertical direction, that is, the thickness of the substrate 61 in a direction vertical to the surface of the substrate 61, is less than or equal to 20 μm. Furthermore, the thickness of the substrate 61 may be greater than or equal to 20 μm, and it is sufficient that the thickness is set according to target characteristics of the solid-state imaging element 11, or the like.

In addition, the substrate 61, for example, includes a P-Epi substrate having high resistance, of which a substrate concentration is less than or equal to 1E+13 order, or the like, and the resistance (a resistivity) of the substrate 61, for example, is greater than or equal to 500 [Ωcm].

Here, in a relationship between the substrate concentration and the resistance of the substrate 61, for example, the resistance is 2000 [Ωcm] when the substrate concentration is 6.48E+12 [cm$^3$], the resistance is 1000 [Ωcm] when the substrate concentration is 1.30E+13 [cm$^3$], the resistance is 500 [Ωcm] when the substrate concentration is 2.59E+13 [cm$^3$], the resistance is 100 [Ωcm] when the substrate concentration is 1.30E+14 [cm$^3$], and the like.

In the drawings, the on-chip lens 62 that condenses the light incident from the outside and allows the light to be incident on the substrate 61, is formed on a front surface of the substrate 61 on an upper side, that is, a surface of the substrate 61 on a side on which light is incident from the outside (hereinafter, also referred to as an incidence surface).

Further, in the pixel 51, an inter-pixel light shielding unit 63-1 and an inter-pixel light shielding unit 63-2 for preventing a color mixture between the adjacent pixels, are formed in an end portion of the pixel 51 on the incidence surface of the substrate 61.

In this example, the light from the outside is incident on the substrate 61 through the on-chip lens 62, but the light incident from the outside is not incident on a region of the other pixel provided adjacent to the pixel 51 of the substrate 61, through the on-chip lens 62 or a part of the substrate 61. That is, the light that is incident on the on-chip lens 62 from the outside and is directed towards the other pixel adjacent to the pixel 51, is shielded by the inter-pixel light shielding unit 63-1 or the inter-pixel light shielding unit 63-2, and is not incident on the adjacent other pixel. Hereinafter, in a case where it is not necessary to particularly discriminate the inter-pixel light shielding unit 63-1 from the inter-pixel light shielding unit 63-2, the inter-pixel light shielding unit 63-1 and the inter-pixel light shielding unit 63-2 will be also simply referred to as an inter-pixel light shielding unit 63.

The solid-state imaging element 11 is the rear surface irradiation type CAPD sensor, and thus, the incidence surface of the substrate 61 is a so-called rear surface, and a wiring layer including wiring or the like, is not formed on the rear surface. In addition, the wiring layer including wiring for driving a transistor or the like, formed in the pixel 51, wiring for reading out the signal from the pixel 51, or the like, is formed by being laminated, in a portion of a surface of the substrate 61 on a side opposite to the incidence surface.

An oxide film 64, and a signal extraction unit 65-1 and a signal extraction unit 65-2, referred to as a Tap, are formed on the surface of the substrate 61 on a side opposite to the incidence surface, that is, in the drawings, in a portion on an inner side of a surface on a lower side.

In this example, the oxide film 64 is formed in the center portion of the pixel 51 in the vicinity of the surface of the substrate 61 on a side opposite to the incidence surface, and the signal extraction unit 65-1 and the signal extraction unit 65-2 are formed on both ends of the oxide film 64, respectively.

Here, the signal extraction unit 65-1 includes an N+ semiconductor region 71-1 that is an N type semiconductor region, an N− semiconductor region 72-1 having a donor impurity concentration lower than that of the N+ semiconductor region 71-1, a P+ semiconductor region 73-1 that is a P type semiconductor region, and a P− semiconductor region 74-1 having an acceptor impurity concentration lower than that of the P+ semiconductor region 73-1. Here, examples of the donor impurity include elements belonging to Group 5 of the periodic table of elements, such as phosphorus (P) or arsenic (As), with respect to Si, and examples of the acceptor impurity include elements belonging to Group 3 of the periodic table of elements, such as boron (B), with respect to Si. The element to be the donor impurity, will be referred to as a donor element, and the element to be the acceptor impurity, will be referred to as an acceptor element.

That is, in the drawings, the N+ semiconductor region 71-1 is formed in a position adjacent to a right side of the oxide film 64, in a portion on a front inner side of the surface of the substrate 61 on a side opposite to the incidence surface. In addition, in the drawings, the N− semiconductor region 72-1 is formed on an upper side of the N+ semiconductor region 71-1 to cover (to surround) the N+ semiconductor region 71-1.

Further, in the drawings, the P+ semiconductor region 73-1 is formed in a position adjacent to a right side of the N+ semiconductor region 71-1, in a portion on a front inner side of the surface of the substrate 61 on a side opposite to the incidence surface. In addition, in the drawings, the P− semiconductor region 74-1 is formed on an upper side of the P+ semiconductor region 73-2 to cover (to surround) the P+ semiconductor region 73-1.

Furthermore, here, even though it is not illustrated, more specifically, when the substrate 61 is seen from the direction vertical to the surface of the substrate 61, the N+ semiconductor region 71-1 and the N− semiconductor region 72-1 are formed to surround the P+ semiconductor region 73-1 and the P− semiconductor region 74-1 around the P+ semiconductor region 73-1 and the P− semiconductor region 74-1.

Similarly, the signal extraction unit 65-2 includes an N+ semiconductor region 71-2 that is an N type semiconductor region, an N− semiconductor region 72-2 having a donor impurity concentration lower than that of the N+ semiconductor region 71-2, a P+ semiconductor region 73-2 that is a P type semiconductor region, and a P− semiconductor region 74-2 having an acceptor impurity concentration lower than that of the P+ semiconductor region 73-2.

That is, in the drawings, the N+ semiconductor region 71-2 is formed in a position adjacent to a left side of the oxide film 64, in a portion on a front inner side of the surface of the substrate 61 on a side opposite to the incidence surface. In addition, in the drawings, the N− semiconductor region 72-2 is formed on an upper side of the N+ semiconductor region 71-2 to cover (to surround) the N+ semiconductor region 71-2.

Further, in the drawings, the P+ semiconductor region 73-2 is formed in a position adjacent to a left side of the N+ semiconductor region 71-2, in a portion on a front inner side of the surface of the substrate 61 on a side opposite to the incidence surface. In addition, in the drawings, the P− semiconductor region 74-2 to formed on an upper side of the P+ semiconductor region 73-2 to cover (to surround) the P+ semiconductor region 73-2.

Furthermore, here, even though it is not illustrated, more specifically, when the substrate 61 is seen from the direction vertical to the surface of the substrate 61, the N+ semiconductor region 71-2 and the N− semiconductor region 72-2 are formed to surround the P+ semiconductor region 73-2 and the P− semiconductor region 74-2 around the P+ semiconductor region 73-2 and the P− semiconductor region 74-2.

Hereinafter, in a case where it is not necessary to particularly discriminate the signal extraction unit 65-1 from the signal extraction unit 65-2, the signal extraction unit 65-1 and the signal extraction unit 65-2 will also be simply referred to as a signal extraction unit 65.

In addition, hereinafter, in a case where it is not necessary to particularly discriminate the N+ semiconductor region 71-1 from the N+ semiconductor region 72-2, the N+ semiconductor region 71-1 and the N+ semiconductor region 71-2 will also be simply referred to as an N+ semiconductor region 71, and in a case where it is not necessary to particularly discriminate the N− semiconductor region 72-1 from the N− semiconductor region 72-2, the N− semiconductor region 72-1 and the N− semiconductor region 72-2 will also be simply referred to as an N− semiconductor region 72.

Further, hereinafter, in a case where it is not necessary to particularly discriminate the P+ semiconductor region 73-1 front the P+ semiconductor region 73-2, the P+ semiconductor region 73-1 and the P+ semiconductor region 73-2 will also be simply referred to as a P+ semiconductor region 73, and in a case where it is not necessary to particularly discriminate the P− semiconductor region 74-1 from the P− semiconductor region 74-2, the P− semiconductor region 74-1 and the P− semiconductor region 74-2 will also be simply referred to as a P− semiconductor region 74.

In addition, in the substrate 61, a separation portion 75-1 for separating a region between the N+ semiconductor region 71-1 and the P+ semiconductor region 73-1, includes an oxide film or the like. Similarly, a separation portion 75-2 for separating a region between the N+ semiconductor region 71-2 and the P+ semiconductor region 73-2, includes an oxide film or the like. Hereinafter, in a case where it is not necessary to particularly discriminate the separation portion 75-1 from the separation portion 75-2, the separation portion 75-1 and the separation portion 75-2 will also be simply referred to as a separation portion 75.

The N+ semiconductor region 71 provided on the substrate 61 functions as a charge detection unit for detecting the amount of light incident on the pixel 51 from the outside, that is, the amount of signal carrier generated by the photoelectric conversion of the substrate 61. Furthermore, the N− semiconductor region 72 having a low donor impurity concentration, can also be regarded as the charge detection unit, in addition to the N+ semiconductor region 71. In addition, the P+ semiconductor region 73 functions as a voltage application unit for injecting a plurality of carrier currents into the substrate 61, that is, for generating an electrical field in the substrate 61 by directly applying a voltage to the substrate 61. Furthermore, the P− semiconductor region 74 having a low acceptor impurity concentration, can also be regarded as the voltage application unit, in addition to the P+ semiconductor region 73.

In the pixel 51, a floating diffusion (FD) portion that is a floating diffusion region (not illustrated) (hereinafter, in particular, also referred to as an FD portion A), is directly connected to the N+ semiconductor region 71-1, and the FD portion A is further connected to the vertical signal line 29 through an amplification transistor (not illustrated) or the like.

Similarly, the other FD portion different from the FD portion A (hereinafter, in particular, also referred to as an FD portion B) is directly connected to the N+ semiconductor region 71-2, the FD portion B is further connected to the vertical signal line 29 through an amplification transistor (not illustrated) or the like. Here, the FD portion A and the FD portion B are connected to the vertical signal lines 29 different from each other.

For example, in the case of measuring the distance to the target by the indirect ToF method, infrared light is emitted from the imaging device in which the solid-state imaging element 11 is provided towards the target. Then, in a case where the infrared light is reflected on the target, and is returned to the imaging device as reflection light, the substrate 61 of the solid-state imaging element 11 receives the reflection light (the infrared light) that has been incident, and performs the photoelectric conversion.

At this time, the vertical driving unit 22 drives the pixel 51, and sorts the signal according to the charge obtained by the photoelectric conversion, into the FD portion A and the FD portion B. Furthermore, as described above, the pixel 51 may be driven not by the vertical driving unit 22, but by a driving unit that is separately provided, the horizontal driving unit 24, or the like, through the vertical signal line 29 or another control line long in the vertical direction.

For example, the vertical driving unit 22 applies a voltage to two P+ semiconductor regions 73 through a contact or the like, at a certain timing. Specifically, for example, the vertical driving unit 22 applies a voltage of 1.5 V to the P− semiconductor region 73-1, and applies a voltage of 0 V to the P+ semiconductor region 73-2.

Then, an electrical field is generated between two P+ semiconductor regions 73 in the substrate 61, and a current flows from the P+ semiconductor region 73-1 to the P+ semiconductor region 73-2. In this case, a hole in the substrate 61 is moved in the direction of the P+ semiconductor region 73-2, and thus, an electron is moved in the direction of the P+ semiconductor region 73-1.

Therefore, in such a state, in a case where the infrared light (the reflection light) from the outside is incident on the substrate 61 through the on-chip lens 62, and the infrared light is subjected to the photoelectric conversion of the substrate 61, and is converted into a pair of the electron and the hole, the obtained electron is guided in the direction of the P+ semiconductor region 73-1 by the electrical field between the P+ semiconductor regions 73, and is moved into the N+ semiconductor region 71-1.

In this case, the electron generated by the photoelectric conversion, is used as a signal carrier for detecting a signal according to the amount of infrared light incident on the pixel 51, that is, the amount of received infrared light.

With this arrangement, a charge according to the electron moved into the N+ semiconductor region 71-1, is accumulated in the semiconductor region 71-1, and the charge is detected by the column processor 23 through the FD portion A, the amplification transistor, the vertical signal line 29, or the like.

That is, the accumulated charge of the N+ semiconductor region 71-1 is transferred to the FD portion A that is directly connected to the N+ semiconductor region 71-1, and the signal according to the charge transferred to the FD portion A, is read out by the column processor 23 through the amplification transistor ox the vertical signal line 29. Then, processing such as AD conversion processing, is performed with respect to the read signal, in the column processor 23, and a pixel signal obtained by the processing, is supplied to the signal processor 26.

The pixel signal is a signal indicating the amount of charge according to the electron detected by the N+ semiconductor region 71-1, that is, the amount of charge accumulated in the FD portion A. In other words, the pixel signal can be a signal indicating the amount of infrared light received by the pixel 51.

Furthermore, at this time, as with the N+ semiconductor region 71-1, the pixel signal according to the electron detected by the N+ semiconductor region 71-2, may suitably be used for measuring a distance.

In addition, at the next timing, a voltage is applied to two P+ semiconductor regions 73 by the vertical driving unit 22 through a contact or the like, such that an electrical field in a direction opposite to the electrical field generated in the substrate 61 so far, is generated. Specifically, for example, a voltage of 1.5 V is applied to the semiconductor region 73-2, and a voltage of 0 V is applied to the P+ semiconductor region 73-1.

With this arrangement, the electrical field is generated between two P+ semiconductor regions 73 on the substrate 61, and a current flows from the P+ semiconductor region 73-2 to the P+ semiconductor region 73-1.

In such a state, in a case where the infrared light (the reflection light) from the outside is incident on the substrate 61 through the on-chip lens 62, and the infrared light is subjected to the photoelectric conversion in the substrate 61, and is converted into a pair of the electron and the hole, the obtained electron is guided in the direction of the P+ semiconductor region 73-2 by the electrical field between the P+ semiconductor regions 73, and is moved into the N+ semiconductor region 71-2.

With this arrangement, a charge according to the electron moved into the N+ semiconductor region 71-2, is accumulated in the N+ semiconductor region 71-2, and the charge is detected by the column processor 23 through the FD portion B, the amplification transistor, the vertical signal line 29, or the like.

That is, the accumulated charge of the N+ semiconductor region 71-2 is transferred to the FD portion B that is directly connected to the N+ semiconductor region 72-2, and the signal according to the charge transferred to the FD portion B is read out by the column processor 23 through the amplification transistor or the vertical signal line 29. Then, processing such as AD conversion processing, is performed with respect to the read signal, in the column processor 23, and a pixel signal obtained by the processing, is supplied to the signal processor 26.

Furthermore, at this time, as with the N+ semiconductor region 71-2, the pixel signal according to the electron detected by the N+ semiconductor region 71-1, may be suitably used for measuring a distance.

Thus, in the case of obtaining the pixel signals obtained by the photoelectric conversion in periods different from each other, in the same pixel 51, the signal processor 26 calculates distance information indicating the distance to the target, on the basis of the pixel signals, and outputs the distance information to the subsequent stage.

Thus, a method of sorting the signal carriers into the N+ semiconductor regions 71 different from each other, and of calculating the distance information, on the basis of the signal according to the signal carriers, will be referred to as the indirect ToF method.

Furthermore, here, an example has been described in which the application of the voltage with respect to the P+ semiconductor region 73 is controlled by the vertical driving unit 22, as described above, a driving unit (a block) functioning as a voltage applying controller controlling the application of the voltage with respect to the P+ semiconductor region 73, may be provided in the solid-state imaging element 11, separately from the vertical driving unit 22.

Figure 3:
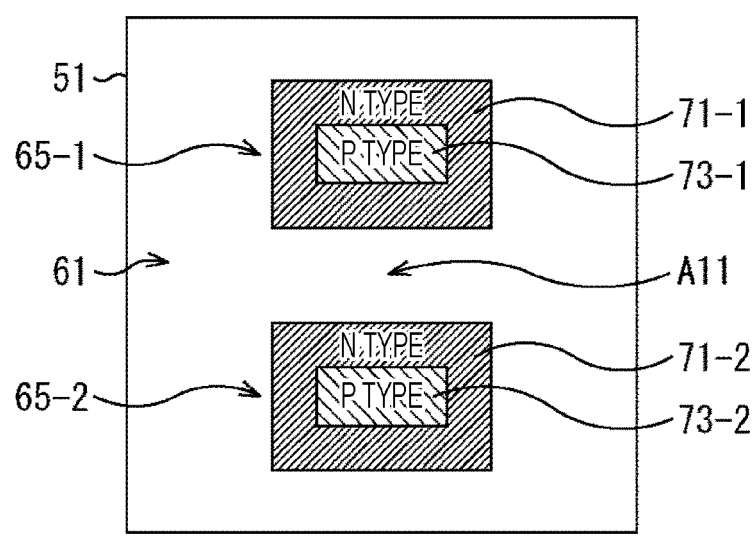
FIG. 3 is a diagram illustrating a configuration example of a portion of a signal extraction unit of the pixel.

In addition, in a case where a portion of the signal extraction unit 65 in the pixel 51, is seen from a direction from the top to the bottom in FIG. 2, that is, the direction vertical to the surface of the substrate 61, for example, as illustrated in FIG. 3, the P+ semiconductor region 73 is surrounded by the N+ semiconductor region 71. Furthermore, in FIG. 3, the same reference numerals will be applied to portions corresponding to those in FIG. 2, and the description thereof will be suitably omitted.

In the example illustrated in FIG. 3, the oxide film 64 (not illustrated) is formed in the central portion of the pixel 51, and the signal extraction unit 65 is formed in a portion slightly on an end side from the center of the pixel 51. In particular, here, two signal extraction units 65 are formed in the pixel 51.

Then, in each of the signal extraction units 65, the P+ semiconductor region 73 is formed in the center position into the shape of a rectangle, and the P+ semiconductor region 73 is surrounded by a rectangular semiconductor region 71, more specifically, a rectangular frame-like N+ semiconductor region 71, around the P+ semiconductor region 73. That is, the N+ semiconductor region 71 is formed to surround the P+ semiconductor region 73.

In addition, in the pixel 51, the on-chip lens 62 is formed such that the infrared light incident from the outside is condensed in the center portion of the pixel 51, that is, in a portion illustrated by an arrow A11. In other words, the infrared light incident on the on-chip lens 62 from the outside is condensed by the on-chip lens 62, in the position illustrated by the arrow A11, that is, in FIG. 2, a position of the oxide film 64 on an upper side of FIG. 2.

Therefore, the infrared light is condensed in a position between the signal extraction unit 65-1 and the signal extraction unit 65-2. With this arrangement, it is possible to prevent the infrared light from being incident on a pixel adjacent to the pixel 51 and from causing a color mixture, and to prevent the infrared light from being directly incident on the signal extraction unit 65.

For example, in a case where the infrared light is directly incident on the signal extraction unit 65, a charge separation efficiency, that is, a contrast between active and inactive tap (C mod) or a Modulation contrast decreases.

Here, the signal extraction unit 65 (the tap) in which the signal according to the charge (the electron) obtained by the photoelectric conversion is read out, that is, the signal extraction unit 65 in which the charge obtained by the photoelectric conversion detected, will also be referred to as an active tap.

On the contrary, the signal extraction unit 65 (the tap) in which the signal according to the charge obtained by the photoelectric conversion is not basically read out, that is, the signal extraction unit 65 that is not the active tap, will also be referred to as an inactive tap.

In the example described above, the signal extraction unit 65 in which a voltage of 1.5 V is applied to the P+ semiconductor region 73, is the active tap, and the signal extraction unit 65 in which a voltage of 0 V is applied to the P+ semiconductor region 73, is the inactive tap.

The C mod is an index indicating what percentage of the charge can be detected by the N+ semiconductor region 71 of the signal extraction unit 65 that is the active tap, in the charges generated by the photoelectric conversion of the incident infrared light, that is, whether or not the signal according to the charge is extracted, and indicates the charge separation efficiency.

Therefore, for example, in a case where the infrared light incident from the outside is incident on a region of the inactive tap, and the photoelectric conversion is performed in the inactive tap, a possibility that an electron that is the signal carrier generated by the photoelectric conversion, is moved to the N+ semiconductor region 71 in the inactive tap, is high. Then, a charge of a part of the electrons obtained by the photoelectric conversion, is not detected by the N+ semiconductor region 71 in the active tap, and thus, the C mod, that is, the charge separation efficiency decreases.

Therefore, in the pixel 51, the infrared light is condensed in the vicinity of the center portion of the pixel 51 in a position of an approximately equal distance from two signal extraction units 65, and thus, a probability that the infrared light incident from the outside is subjected to the photoelectric conversion in the region of the inactive tap, is reduced, and the charge separation efficiency can be improved. In addition, in the pixel 51, it is also possible to improve the Modulation contrast. In other words, the electron obtained by the photoelectric conversion can be easily induced to the N+ semiconductor region 71 in the active tap.

According to the solid-state imaging element 11 as described above, the following effects can be obtained.

That is, first, the solid-state imaging element 11 is the rear surface irradiation type sensor, and thus, it is possible to maximize Quantum Efficiency (QE)×Aperture Ratio (Fill Factor (FF)), and to improve distance measuring characteristics of the solid-state imaging element 11.

Figure 4:
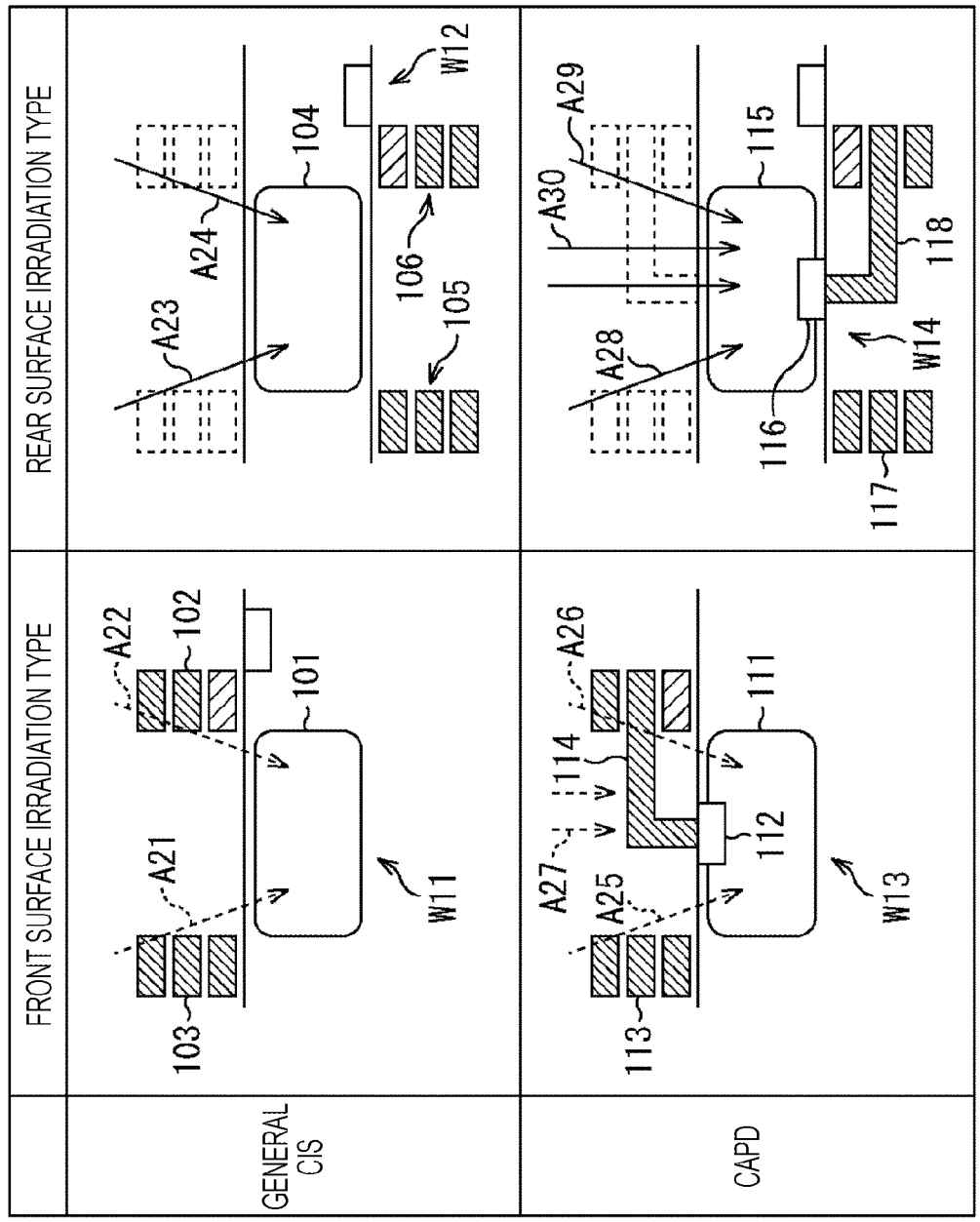
FIG. 4 is a diagram illustrating sensitivity improvement.

For example, as illustrated by the arrow W11 in FIG. 4, a general front surface irradiation type image sensor has a structure in which wiring 102 or wiring 103 is formed on an incidence surface side of a PD 101 that is a photoelectric conversion unit on which light from the outside is incident.

For this reason, for example, as illustrated by an arrow A21 or an arrow A22, there is a case where a part of light obliquely incident on the PD 101 with a certain degree of angle, from the outside, is not incident on the PD 101 by being shielded by the wiring 102 or the wiling 103.

In contrast, the rear surface irradiation type image sensor, for example, as illustrated by an arrow W12, has a structure in which the wiring 105 or the wiring 106 is formed on a surface of a PD 104 that is the photoelectric conversion unit, on a side opposite to an incidence surface on which light is incident from the outside.

For this reason, it is possible to ensure a sufficient aperture ratio, compared to the front surface irradiation type image sensor. That is, for example, as illustrated by an arrow A23 or an arrow A24, light obliquely incident on the PD 104 with a certain degree of angle, from the outside, is incident on the PD 104 without being shielded by the wiring. With this arrangement, it is possible to improve pixel sensitivity by receiving more light.

Such an improvement effect of the pixel sensitivity to be obtained by the rear surface irradiation type image sensor, can also be obtained in the solid-state imaging element 11 that is the rear surface irradiation type CAPD sensor.

In addition, for example, in the front surface irradiation type CAPD sensor, as illustrated by an arrow W13, a signal extraction unit 112 to be referred to as a tap, more specifically, a P+ semiconductor region or an N+ semiconductor region of the tap is formed on an incidence surface side on which light from the outside is incident, in a PD 111 that is the photoelectric conversion unit. In addition, the front surface irradiation type CAPD sensor has a structure in which wiring 113, or wiring 114 connected to the signal extraction unit 112, such as a contact or a metal, is formed incidence surface side.

For this reason, for example, there is a case where as illustrated by an arrow A25 or an arrow A26, a part of light obliquely incident on the PD 111 with a certain degree of angle, from the outside, is not incident on the PD 111 by being shielded by the wiring 113 or the like, and as illustrated by an arrow A27, light vertically incident on the PD 111 is also not incident on the PD 111 by being shielded by the wiring 114.

In contrast, the rear surface irradiation type CAPD sensor, for example, as illustrated by an arrow W14, has a structure in which a signal extraction unit 116 is formed in a portion of a surface of a PD 115 that is the photoelectric conversion unit, on a side opposite to an incidence surface on which light from the outside is incident. In addition, wiring 117, or wiring 118 connected to the signal extraction unit 116, such as a contact or a metal, is formed on the surface of the PD 115 on a side opposite to the incidence surface.

Here, the PD 115 corresponds to the substrate 61 illustrated in FIG. 2, and the signal extraction unit 116 corresponds to the signal extraction unit 65 illustrated in FIG. 2.

In the rear surface irradiation type CAPD sensor having such a structure, it is possible to ensure a sufficient aperture ratio, compared to the front surface irradiation type sensor. Therefore, it is possible to maximize Quantum Efficiency (QE)×Aperture Ratio (FF), and to improve the distance measuring characteristics.

That is, for example, as illustrated by an arrow A28 or an arrow A29, light obliquely incident on the PD 115 with a certain degree of angle, from the outside, is incident on the PD 115 without being shielded by the wiring. Similarly, as illustrated by an arrow A30, light vertically incident on the PD 115 is also incident on the PD 115 without being shielded by the wiring or the like.

Thus, in the rear surface irradiation type CAPD sensor, it is possible to receive not only the light that is incident with a certain degree of angle, but also the light that is vertically incident on the FD 115, and is reflected on the wiring or the like connected to the signal extraction unit (the tap) in the front surface irradiation type sensor. With this arrangement, it is possible to improve the pixel sensitivity by receiving more light. In other words, it is possible to maximize Quantum Efficiency (QE)×Aperture Ratio (FF), and thus, to improve the distance measuring characteristics.

In particular, in a case where the tap is arranged in the vicinity of the center of the pixel, but not on the outer edge of the pixel, in the front surface irradiation type CAPD sensor, it is no possible to ensure a sufficient aperture ratio, and the pixel sensitivity decreases, but in the solid-state imaging element 11 that is the rear surface irradiation type CAPD sensor, it is possible to ensure a sufficient aperture ratio regardless of an arrangement position of the tap, and to improve the pixel sensitivity.

In addition, the signal extraction unit 65 is formed in the vicinity of the rear surface irradiation type solid-state imaging element 11, the surface of the substrate 61 on a side opposite to the incidence surface on which the infrared light from the outside is incident, and thus, it is possible to reduce the occurrence of the photoelectric conversion of the infrared light in the region of the inactive tap. With this arrangement, the C mod, that is, the charge separation efficiency can be improved.

Figure 5:
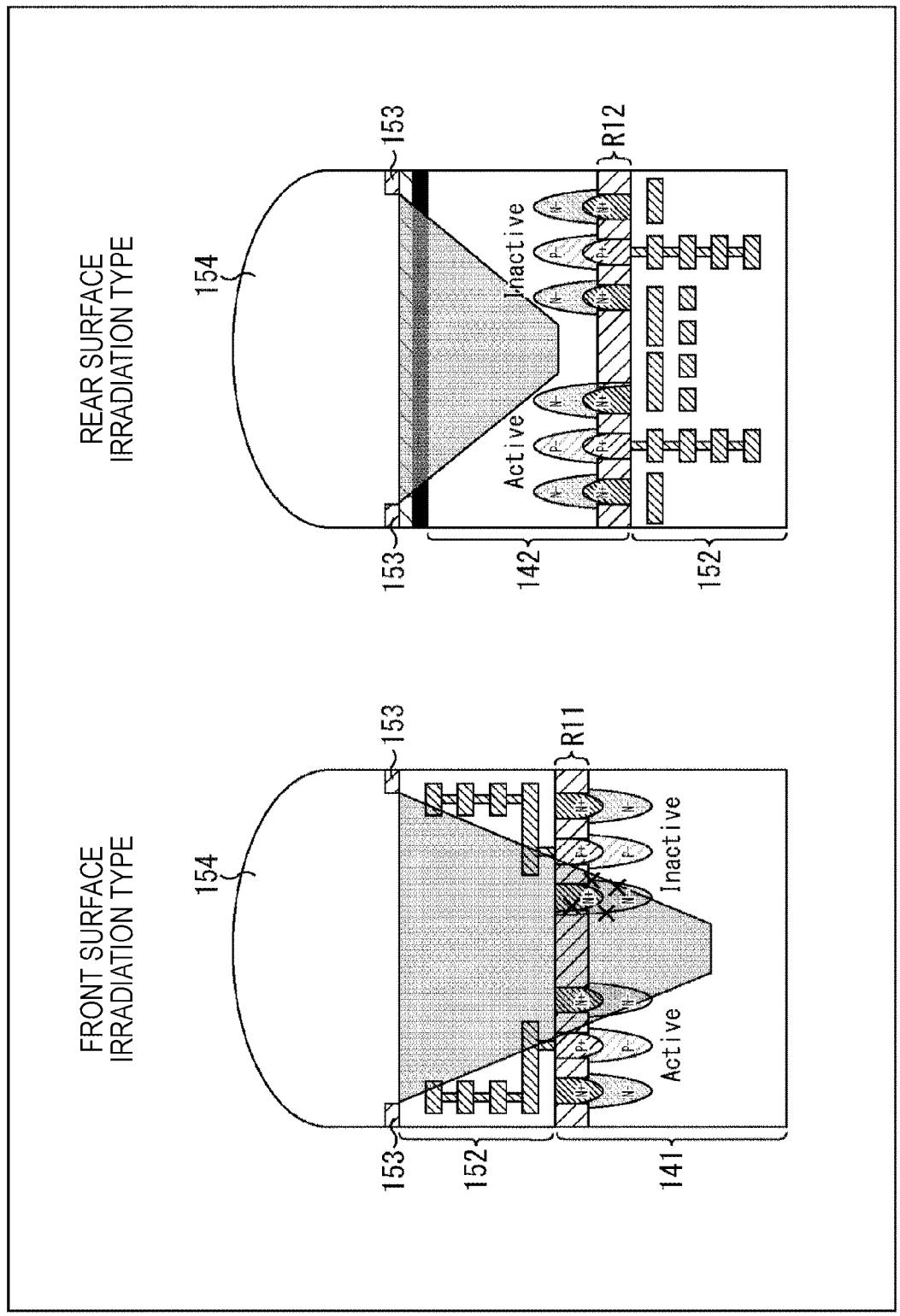
FIG. 5 is a diagram illustrating improvement of a charge separation efficiency.

FIG. 5 illustrates a pixel sectional view of the front surface irradiation type CAPD sensor and the rear surface irradiation type CAPD sensor.

In the front surface irradiation type CAPD sensor on a left side in FIG. 5, in the drawings, an upper side of the substrate 141 is a light incidence surface, and a wiring layer 152 including a plurality of layers of wirings, an inter-pixel light shielding unit 153, and an on-chip lens 154 are laminated on the incidence surface side of the substrate 141.

In the rear surface irradiation type CAPD sensor on a right side in FIG. 5, in the drawings, a wiring layer 152 including a plurality of layers of wirings is formed on a lower side of a substrate 142 on a side opposite to a light incidence surface, and an inter-pixel light shielding unit 153 and an on-chip lens 154 are laminated on an upper side of the substrate 142 on the light incidence surface side.

Furthermore, in FIG. 5, a gray trapezoid illustrates a region in which infrared light is condensed by the on-chip lens 154, and thus, a light intensity is strong.

For example, in the front surface irradiation type CAPD sensor, a region R11 in which the inactive tap and the active tap exist, is provided on the incidence surface side of the substrate 141. For this reason, in a case where there are many components to be directly incident on the inactive tap, and the photoelectric conversion is performed in the region of the inactive tap, the signal carrier obtained by the photoelectric conversion is not detected by the N+ semiconductor region of the active tap.

In the front surface irradiation type CAPD sensor, the intensity of the infrared light is strong in the region R11 in the vicinity of the incidence surface of the substrate 141, and thus, a probability that the photoelectric conversion of the infrared light is performed in the region R11, increases. That is, the amount of infrared light incident on the vicinity of the inactive tap, is large, and thus, the signal carrier that is not capable of being detected in the active tap, increases, and the charge separation efficiency decreases.

In contrast, in the rear surface irradiation type CAPD sensor, a region R12 in which the inactive tap and the active tap exist, is provided in a position far from the incidence surface of the substrate 142, that is, a position in the vicinity of the surface opposite to the incidence surface side. Here, the substrate 142 corresponds to the substrate 61 illustrated in FIG. 2.

In this example, the region R12 is provided in a portion of the surface of the substrate 142 on a side opposite to the incidence surface side, and the region R12 is in the position far from the incidence surface, and thus, the intensity of the incident infrared light becomes comparatively weak, in the vicinity of the region R12.

In a region where the intensity of the infrared light is strong, such as the vicinity of the center of the substrate 142 or the vicinity of the incidence surface, the signal carrier obtained by the photoelectric conversion is guided to the active tap by an electrical field generated in the substrate 142, and is detected by the N+ semiconductor region of the active tap.

On the other hand, in the vicinity of the region R12 including the inactive tap, the intensity of the incident infrared light is comparatively weak, and thus, a probability that the photoelectric conversion of the infrared light is performed in the region R12, decreases. That is, the amount of infrared light incident on the vicinity of the inactive tap is small, and thus, the number of signal carriers (electrons) that are generated by the photoelectric conversion in the vicinity of the inactive tap, and are moved to the N+ semiconductor region of the inactive tap, decreases, and it is possible to improve the charge separation efficiency. As a result thereof, it is possible to improve the distance measuring characteristics.

Further, in the rear surface irradiation type solid-state imaging element 11, it is possible to realize the thinning of the substrate 61, and thus, it is possible to improve an extraction efficiency of the electron (the charge) that is the signal carrier.

Figure 6:
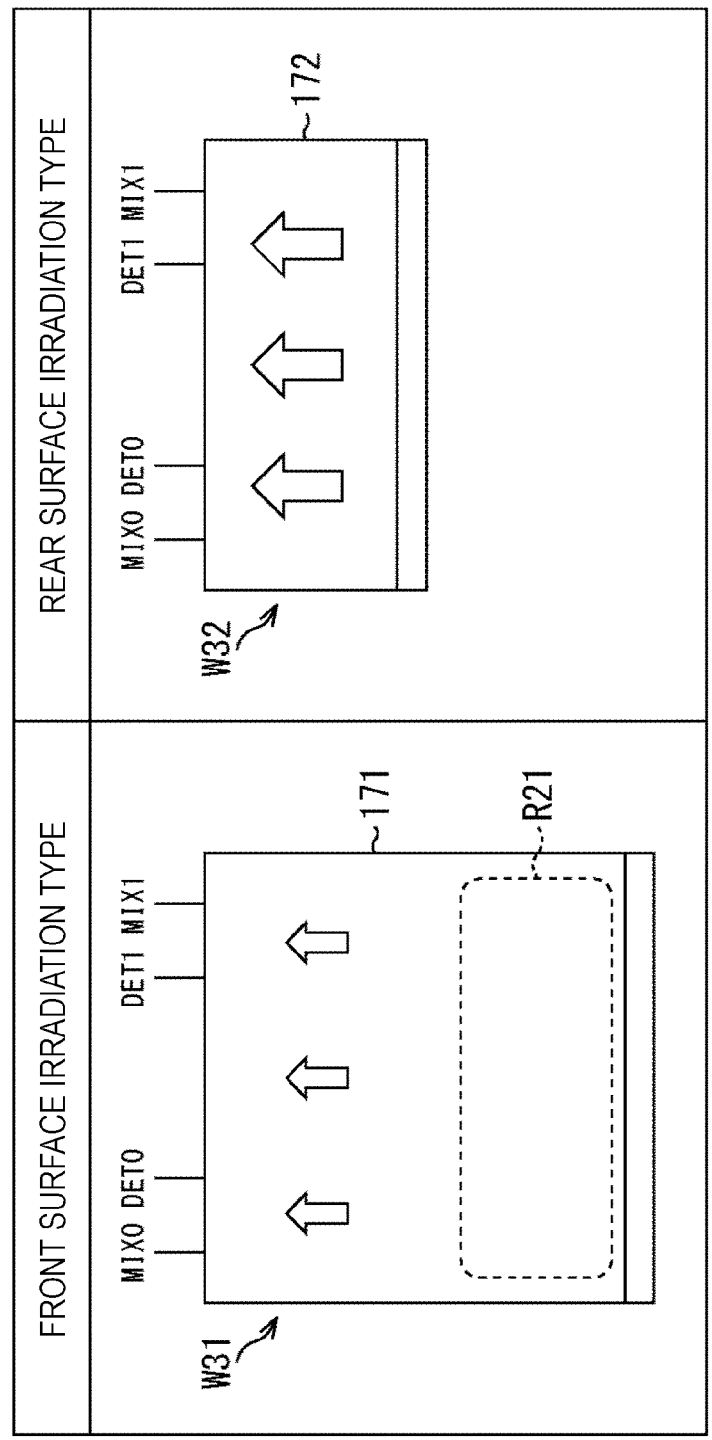
FIG. 6 is a diagram illustrating improvement of an extraction efficiency of an electron.

For example, in the front surface irradiation type CAPD sensor, it is not possible to sufficiently ensure the aperture ratio, and thus, as illustrated by an arrow W31 in FIG. 6, in order to ensure a higher quantum efficiency, and to suppress a decrease in Quantum Efficiency×Aperture Ratio, it is necessary to increase the thickness of a substrate 171 to a certain degree.

Then, in a region in the vicinity of a surface of the substrate 171 on a side opposite to an incidence surface, for example, a portion of a region R21, the inclination of a potential becomes gentle, and an electrical field in a direction substantially vertical to the substrate 171 becomes weak. In this case, a movement speed of the signal carrier becomes slow, and thus, a time required to detect the signal carrier lit the N+ semiconductor region of the active tap after the photoelectric conversion is performed, becomes long. Furthermore, in FIG. 6, an arrow in the substrate 171 indicates the electrical field in the direction vertical to the substrate 171, in the substrate 171.

In addition, in a case where the substrate 171 is thick, a movement distance of the signal carrier from a position far from the active tap in the substrate 171, to the N+ semiconductor region in the active tap, becomes long. Therefore, in the position far from the active tap, a time required to detect the signal carrier in the N+ semiconductor region of the active tap after the photoelectric conversion is performed, becomes longer.

Figure 7:
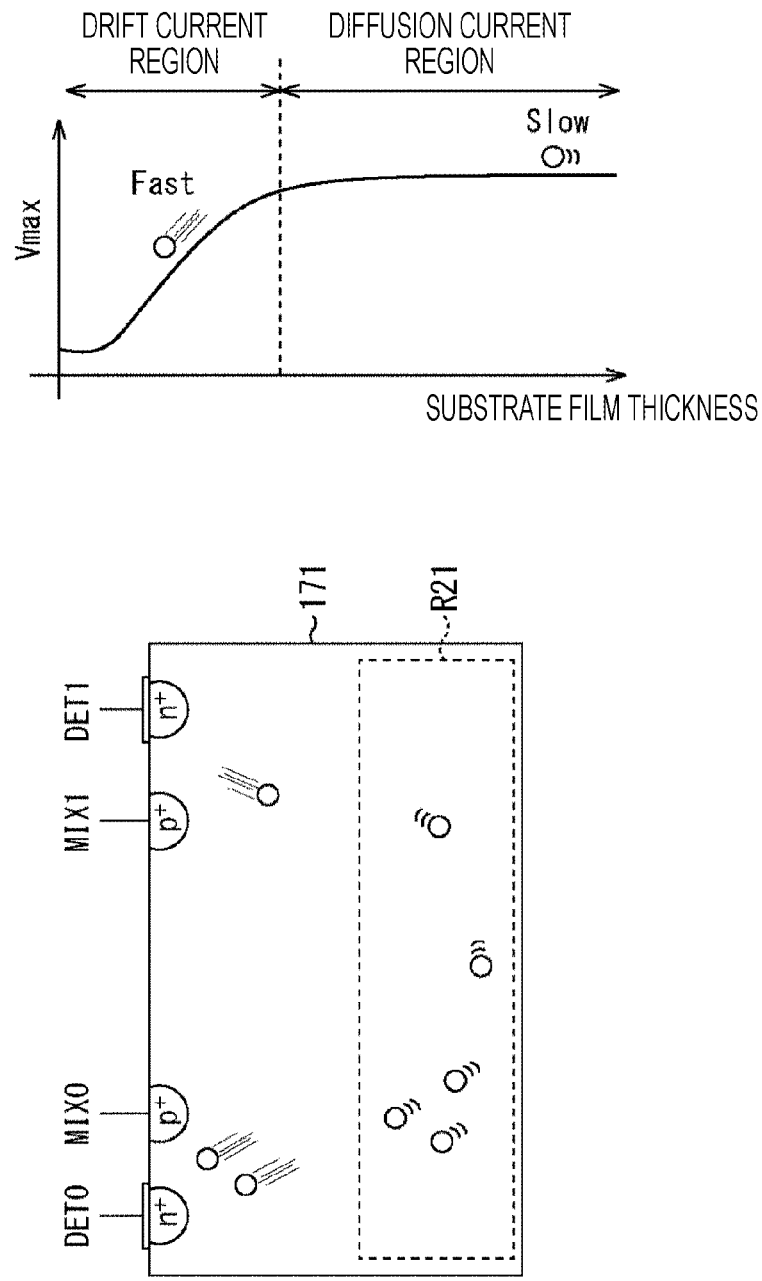
FIG. 7 is a diagram illustrating a movement speed of a signal carrier in a front surface irradiation type.

FIG. 7 illustrates a relationship between a position in a thickness direction of the substrate 171 and the movement speed of the signal carrier. The region R21 corresponds to a diffusion current region.

Thus, in a case where the substrate 171 becomes thick, for example, when a driving frequency is high, that is, when the switching between an active state and an inactive state of the tap (the signal extraction unit) is performed at a high speed, the electron generated in the position far from the active tap such as the region R21, is not capable of being completely drawn in the N+ semiconductor region of the active tap. That is, in a case where a time when the tap is in an active state, is short, the electron (the charge) generated in the region R21 or the like, is not capable of being detected in the N+ semiconductor region of the active tap, and the extraction efficiency of the electron decreases.

In contrast, in the rear surface irradiation type CAPD sensor, it is possible to ensure a sufficient aperture ratio, and thus, for example, as illustrated by an arrow W32 in FIG. 6, even in a case where a substrate 172 is thin, it is possible to ensure sufficient Quantum Efficiency×Aperture Ratio. Here, the substrate 172 corresponds to the substrate 61 in FIG. 2, and an arrow in the substrate 172 indicates an electrical field in a direction vertical to the substrate 172.

Figure 8:
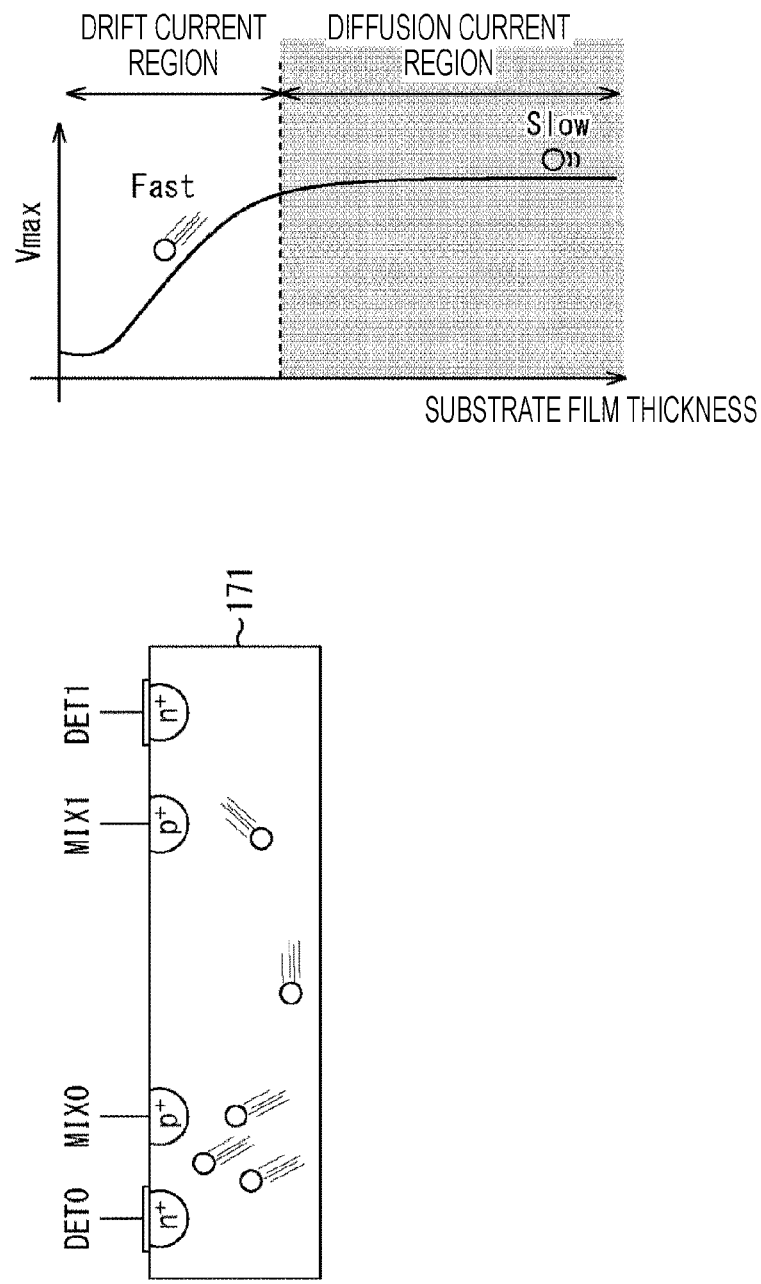
FIG. 8 is a diagram illustrating a movement speed of a signal carrier in a rear surface irradiation type.

FIG. 8 illustrates a relationship between a position in a thickness direction of the substrate 172, and the movement speed of the signal carrier.

Thus, in a case where the thickness of the substrate 172 in the direction vertical to the substrate 172, an electrical field in the direction substantially vertical to the substrate 172 becomes strong, only an electron (a charge) only in a drift current region where the movement speed of the signal carrier is fast, is used, and an electron in a diffusion current region where the movement speed of the signal carrier is slow, is not used. Only the electron (the charge) only in the drift current region, is used, and thus, a time required to detect the signal carrier in the N+ semiconductor region of the active tap after the photoelectric conversion is performed, becomes short. In addition, in a case where the substrate 172 becomes thin, the movement distance of the signal carrier to the N+ semiconductor region in the active tap, also becomes short.

Accordingly, in the rear surface irradiation type CAPD sensor, even when the driving frequency is high, it is possible to sufficiently draw the signal carrier (the electron) generated in each region in the substrate 172, in the N+ semiconductor region of the active tap, and to improve the extraction efficiency of the electron.

In addition, it is possible to ensure a sufficient extraction efficiency of the electron even at a higher driving frequency, according to the thinning of the substrate 172, and to improve high speed driving resistance.

In particular, in the rear surface irradiation type CAPD sensor, it is possible to directly apply a voltage to the substrate 172, that is, the substrate 61, and thus, a response speed of switching between the active state and the inactive state of the tap, is fast, and it is possible to perform the driving at a high driving frequency. In addition, the voltage can be directly applied to the substrate 61, and thus, a modulable region in the substrate 61, becomes wide.

Further, in the rear surface irradiation type solid-state imaging element 11 (the CAPD sensor), it is possible to obtain a sufficient aperture ratio, and thus, it is possible to miniaturize the pixel, and to improve miniaturization resistance of the pixel.

In addition, the solid-state imaging element 11 is the rear surface irradiation type sensor, and thus, it is possible to liberalize back end of line (BEOL) capacity design, and with this arrangement, it is possible to improve a design freedom of saturated signal quantity (Qs).

Modification Example 1 of First Embodiment

<Configuration Example of Pixel>
Furthermore, in the above description, as illustrated in FIG. 3, a case where the portion of the signal extraction unit 65 in the substrate 61 is a region in which the N+ semiconductor region 71 and the P+ semiconductor region 73 are in the shape of a rectangle, has been described as an example. However, the shape of the N+ semiconductor region 71 and the P+ semiconductor region 73 at the time of being seen from the direction vertical to the substrate 61 may be any shape.

Figure 9:
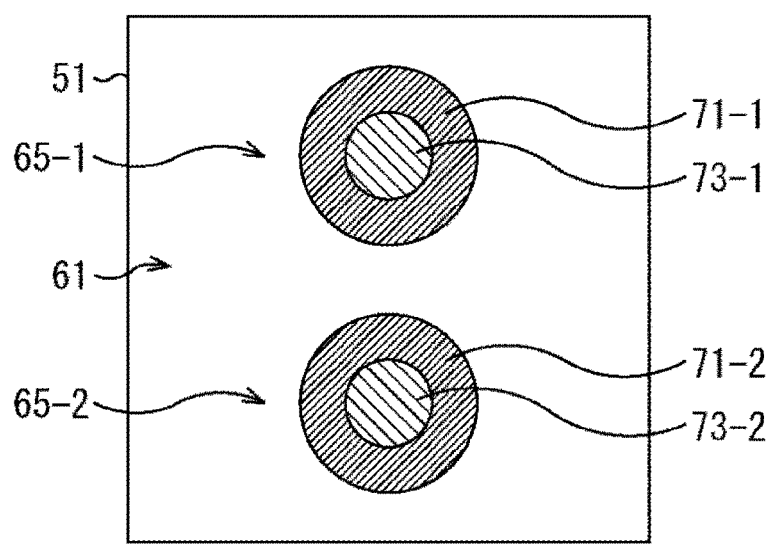
FIG. 9 is a diagram illustrating another configuration example of the portion of the signal extraction unit of the pixel.

Specifically, for example, as illustrated in FIG. 9, the N+ semiconductor region 71 and the P+ semiconductor region 73 may be in the shape of a circle. Furthermore, in FIG. 9, the same reference numerals will be applied to portions corresponding to those in FIG. 3, and the description thereof will be suitably omitted.

FIG. 9 illustrates the N+ semiconductor region 71 and the P+ semiconductor region 73 when the portion of the signal extraction unit 65 in the pixel 51 is seen from the direction vertical to the substrate 61.

In this example, the oxide film 64 (not illustrated) is formed in the central portion of the pixel 51, and the signal extraction unit 65 is formed in the portion slightly on the end side from the center of the pixel 51. In particular, here, two signal extraction units 65 are formed in the pixel 51.

Then, in each of the signal extraction units 65, a circular P+ semiconductor region 73 is formed in the center position, and the P+ semiconductor region 73, is surrounded by a circular N+ semiconductor region 71, more specifically, an annular N+ semiconductor region 73, around the P+ semiconductor region 73.

Figure 10:
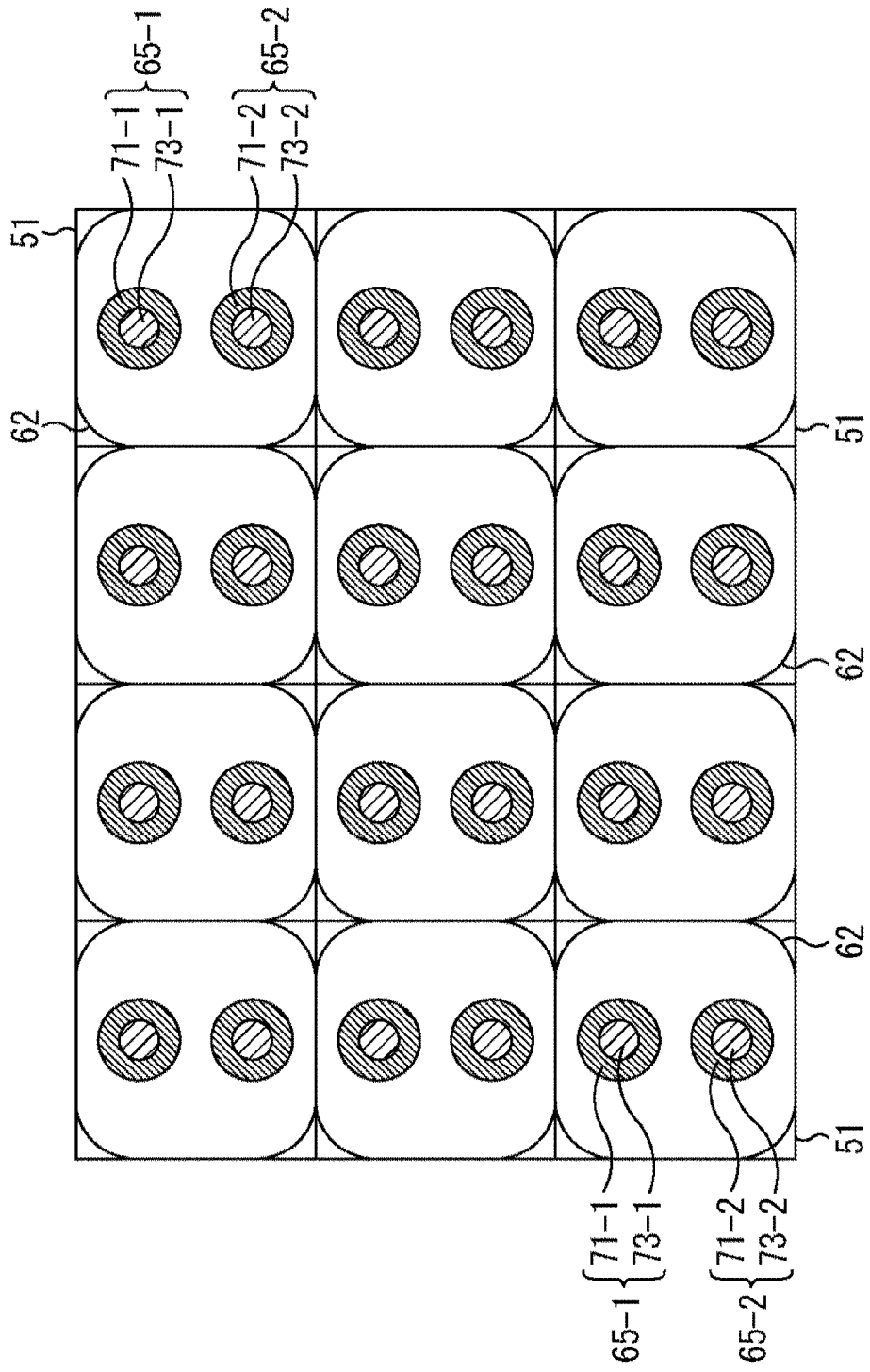
FIG. 10 is a diagram illustrating a relationship between the pixel and an on-chip lens.

FIG. 10 is a plan view in which the on-chip lens 62 overlaps with a part of the pixel array portion 21 in which the pixels 51 including the signal extraction unit 65 illustrated in FIG. 9, are two-dimensionally arranged into the shape of a matrix.

As illustrated in FIG. 10, the on-chip lens 62 is formed in pixel unit. In other words, a unit region in which one on-chip lens 62 is formed, corresponds to one pixel.

Furthermore, in FIG. 2, the separation portion 75 including the oxide film or the like, is arranged between the N+ semiconductor region 71 and the P+ semiconductor region 73, but the separation portion 75 is not limited thereto.

Modification Example 2 of First Embodiment

Figure 11:
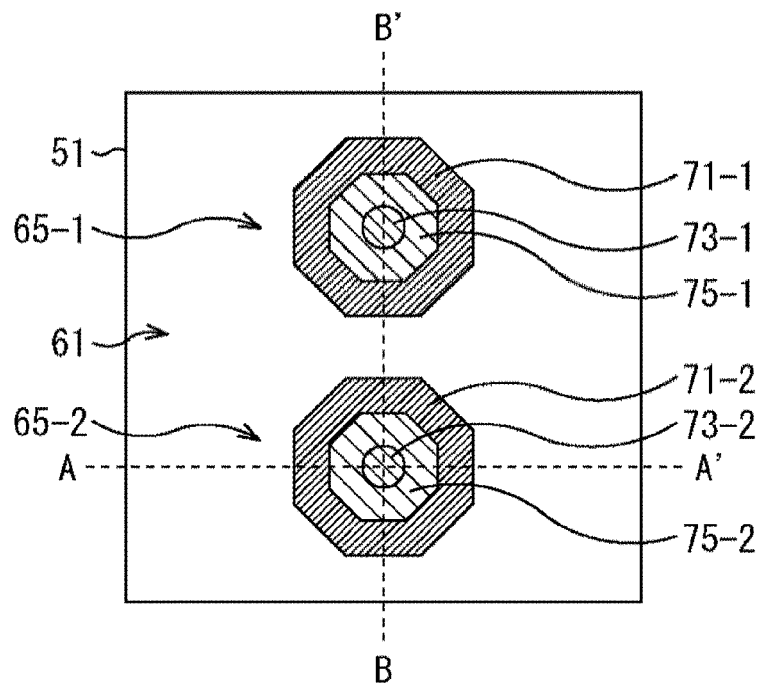
FIG. 11 is a diagram illustrating another configuration example of the portion of the signal extraction unit of the pixel.

<Configuration Example of Pixel>
FIG. 11 is a plan view illustrating a modification example of a planar shape of the signal extraction unit 65 in the pixel 51.

The planar shape of the signal extraction unit 65, for example, may be an octagonal shape illustrated in FIG. 11, in addition to the rectangular shape illustrated in FIG. 3 and the circular shape illustrated in FIG. 7.

In addition, FIG. 11 illustrates a plan view in a case where the separation portion 75 including the oxide film or the like, is formed between the N+ semiconductor region 71 and the P+ semiconductor region 73.

In FIG. 11, line A-A' indicates a sectional line in FIG. 37 as described later, and line B-B' indicates a sectional line in FIG. 36 as described later.

Second Embodiment

<Configuration Example of Pixel>
Further, in the above description, in the signal extraction unit 65, a configuration in which the P+ semiconductor region 73 is surrounded by the N+ semiconductor region 71, has been described as an example, but the N+ semiconductor region may be surrounded by the P+ semiconductor region.

Figure 12:
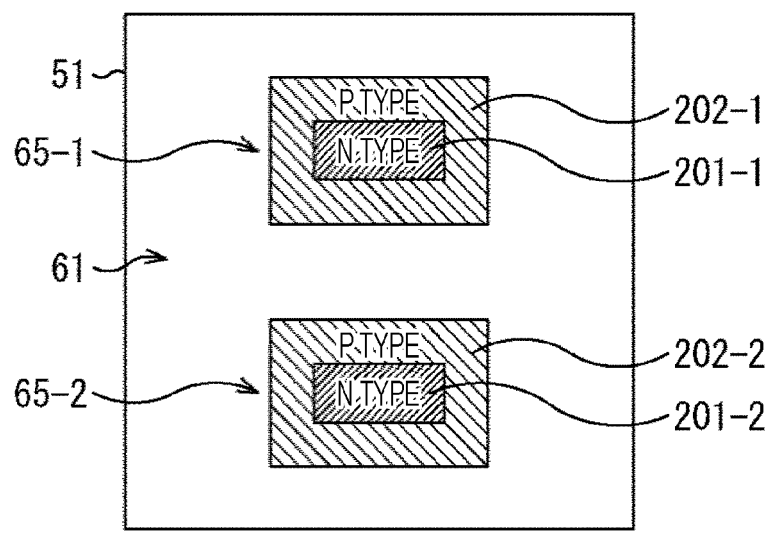
FIG. 12 is a diagram illustrating another configuration example of the portion of the signal extraction unit of the pixel.

In such a case, the pixel 51, for example, is configured as illustrated in FIG. 12. Furthermore, in FIG. 12, the same reference numerals will be applied to portions corresponding to those in FIG. 3, and the description thereof will be suitably omitted.

FIG. 12 illustrates the arrangement of the N+ semiconductor region and the P+ semiconductor region when the portion of the signal extraction unit 65 in the pixel 51 is seen from the direction vertical to the substrate 61.

In this example, the oxide film 64 (not illustrated) is formed in the central portion of the pixel 51, the signal extraction unit 65-1 is formed a portion slightly on an upper side in the drawings from the center of the pixel 51, and the signal extraction unit 65-2 is formed in a portion slightly on a lower side in the drawings from the center of the pixel 51. In particular, in this example, a formation position of the signal extraction unit 65 in the pixel 51 is the same position as that in FIG. 3.

In the signal extraction unit 65-1, a rectangular N+ semiconductor region 201-1 corresponding to the N+ semiconductor region 71-1 illustrated in FIG. 3, is formed in the center of the signal extraction unit 65-1. Then, the N+ semiconductor region 201-1 is surrounded by a rectangular P+ semiconductor region 202-1, more specifically, a rectangular frame-like P+ semiconductor region 202-1, corresponding to the Pt semiconductor region 73-1 illustrated in FIG. 3. That is, the P+ semiconductor region 202-1 is formed to surround the N+ semiconductor region 201-1.

Similarly, in the signal extraction unit 65-2, a rectangular N+ semiconductor region 201-2 corresponding to the N+ semiconductor region 71-2 illustrated in FIG. 3, is formed in the center of the signal extraction unit 65-2. Then, the N+ semiconductor region 201-2 is surrounded by a rectangular P+ semiconductor region 202-2, more specifically, a rectangular frame-like P+ semiconductor region 202-2, corresponding to the P+ semiconductor region 73-2 illustrated in FIG. 3.

Furthermore, hereinafter, in a case where it is not necessary to particularly discriminate the N+ semiconductor region 201-1 from the N+ semiconductor region 201-2, the N+ semiconductor region 201-1 and the N+ semiconductor region 201-2 will also be simply referred to as an N+ semiconductor region 201. In addition, hereinafter, in a case where it is not necessary to particularly discriminate the P+ semiconductor region 202-1 from the P+ semiconductor region 202-2, the P+ semiconductor region 202-1 and the P+ semiconductor region 202-2 tall also be simply referred to as a P+ semiconductor region 202.

Even in a case where the signal extraction unit 65 has a configuration illustrated in FIG. 12, as with the case of the configuration illustrated in FIG. 3, the N+ semiconductor region 201 functions as the charge detect ion unit for detecting the amount of signal carrier, and the P+ semiconductor region 202 functions as the voltage application unit for generating the electrical field by directly applying a voltage to the substrate 61.

Modification Example 1 of Second Embodiment

<Configuration Example of Pixel>

In addition, as with the example illustrated in FIG. 9, ever, in the case of arrangement in which the N+ semiconductor region 201 is surrounded by the P+ semiconductor region 202, the shape of the N+ semiconductor region 201 and the P+ semiconductor region 202 may be any shape.

Figure 13:
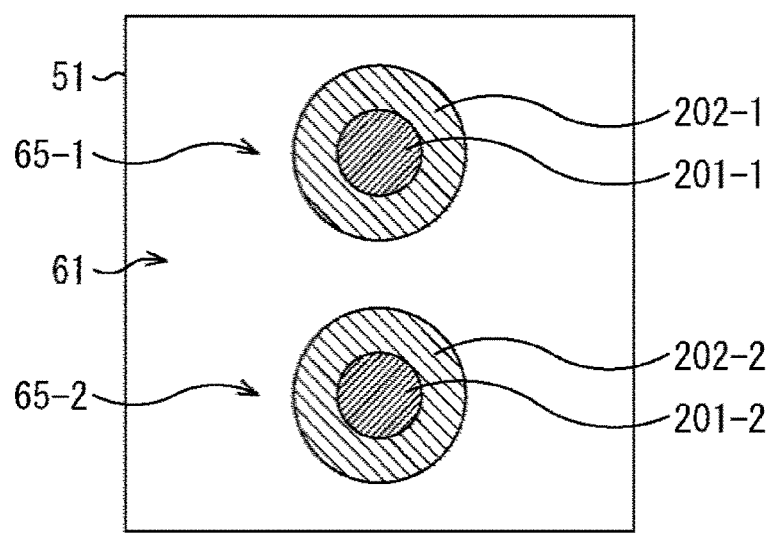
FIG. 13 is a diagram illustrating another configuration example of the portion of the signal extraction unit of the pixel.

That is, for example, as illustrated in FIG. 13, the N+ semiconductor region 201 and the P+ semiconductor region 202 may be in the shape of a circle. Furthermore, in FIG. 13, the same reference numerals will be applied to portions corresponding to those in FIG. 12, and the description thereof will be suitably omitted.

FIG. 13 illustrates the N+ semiconductor region 201 and the P+ semiconductor region 202 when the portion of the signal extraction unit 65 in the pixel 51 is seen from the direction vertical to the substrate 61.

In this example, the oxide film 64 (not illustrated) is formed in the central portion of the pixel 51, and the signal extraction unit 65 is formed in the portion slightly on the end side from the center of the pixel 51. In particular, here, two signal extraction units 65 are formed in the pixel 51.

Then, in each of the signal extraction units 65, a circular N+ semiconductor region 201 is formed in the center position, and the N+ semiconductor region 201 is surrounded by a circular P+ semiconductor region 202, more specifically, an annular P+ semiconductor region 202, around the N+ semiconductor region 201.

Third Embodiment

<Configuration Example of Pixel>

Further, the N+ semiconductor region and the P+ semiconductor region formed in the signal extraction unit 65, may be formed into the shape of a line (a rectangle).

Figure 14:
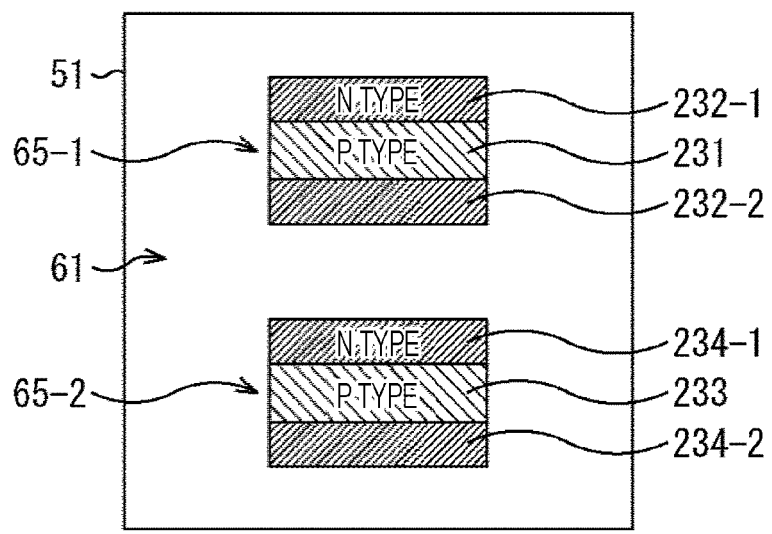
FIG. 14 is a diagram illustrating another configuration example of the portion of the signal extraction unit of the pixel.

In such a case, for example, the pixel 51 is configured as illustrated in FIG. 14. Furthermore, in FIG. 14, the same reference numerals will be applied to portions corresponding to those in FIG. 3, and the description thereof will be suitably omitted.

FIG. 14 illustrates the arrangement of the N+ semiconductor region and the P+ semiconductor region when the portion of the signal extraction unit 65 in the pixel 51 is seen from the direction vertical to the substrate 61.

In this example, the oxide film 64 (not illustrated) is formed in the central portion of the pixel 51, the signal extraction unit 65-1 is formed in the portion slightly on the upper side in the drawings from the center of the pixel 51, and the signal extraction unit 65-2 is formed in the portion slightly on the lower side in the drawings from the center of the pixel 51. In particular, in this example, the formation position of the signal extraction unit 65 in the pixel 51 is the same position as that in FIG. 3.

In the signal extraction unit 65-1, a linear P+ semiconductor region 231 corresponding to the P+ semiconductor region 73-1 illustrated in FIG. 3, is formed in the center of the signal extraction unit 65-1. Then, a linear N+ semiconductor region 232-1 and a linear N+ semiconductor region 232-2, corresponding to the N+ semiconductor region 71-1 illustrated in FIG. 3, are formed around the P+ semiconductor region 231 such that the P+ semiconductor region 231 is interposed between the N+ semiconductor region 232-1 and the N+ semiconductor region 232-2. That is, the P+ semiconductor region 231 is formed in a position interposed between the N+ semiconductor region 232-1 and the N+ semiconductor region 232-2.

Furthermore, hereinafter, in a case where it is not necessary to particularly discriminate the N+ semiconductor region 232-1 from the N+ semiconductor region 232-2, the N+ semiconductor region 232-1 and the N+ semiconductor region 232-2 will also be simply referred to as an N+ semiconductor region 232.

In the example illustrated in FIG. 3, the P+ semiconductor region 73 is surrounded by the N+ semiconductor region 71, but in an example illustrated in FIG. 14, the P+ semiconductor region 231 is interposed between two N+ semiconductor regions 232 that are provided adjacent to each other.

Similarly, in the signal extraction unit 65-2, a linear P+ semiconductor region 233 corresponding to the P+ semiconductor region 73-2 illustrated in FIG. 3, is formed in the center of the signal extraction unit 65-2. Then, a linear N+ semiconductor region 234-1 and a linear N+ semiconductor region 234-2, corresponding to the N+ semiconductor region 71-2 illustrated in FIG. 3, are formed around the P+ semiconductor region 233 such that the P+ semiconductor region 233 is interposed between the N+ semiconductor region 234-1 and the N+ semiconductor region 234-2.

Furthermore, hereinafter, in a case where it is not necessary to particularly discriminate the N+ semiconductor region 234-1 from the N+ semiconductor region 234-2, the N+ semiconductor region 234-1 and the N+ semiconductor region 234-2 will also be simply referred to as an N+ semiconductor region 234.

In the signal extraction unit 65 in FIG. 14, the P+ semiconductor region 231 and the P+ semiconductor region 233 function as the voltage application unit corresponding to the P+ semiconductor region 73 illustrated in FIG. 3, and the N+ semiconductor region 232 and the N+ semiconductor region 234 function as the charge detection unit corresponding to the N+ semiconductor region 71 illustrated in FIG. 3. In this case, for example, both of the N+ semiconductor region 232-1 and the N+ semiconductor region 232-2 are connected to the FD portion A.

In addition, in the drawings, the length of each of the linear P+ semiconductor region 231, the linear N+ semiconductor region 232, the linear P+ semiconductor region 233, and the linear N+ semiconductor region 234, in the horizontal direction, may be any length, and each of the regions may not have the same length.

Fourth Embodiment

<Configuration Example of Pixel>

Further, in the example illustrated in FIG. 14, a structure in which the P+ semiconductor region 231 or the P+ semiconductor region 233 is interposed between the N+ semiconductor regions 232 or the N+ semiconductor regions 234, has been described as an example, but on the contrary, the N+ semiconductor region may be interposed between the P+ semiconductor regions.

Figure 15:
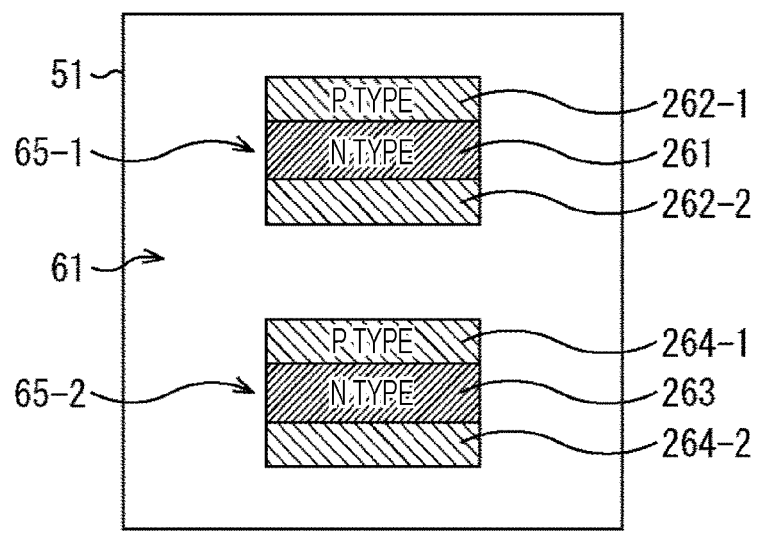
FIG. 15 is a diagram illustrating another configuration example of the portion of the signal extraction unit of the pixel.

In such a case, for example, the pixel 51 is configured as illustrated in FIG. 15. Furthermore, in FIG. 15, the same reference numerals will be applied to portions corresponding to those in FIG. 3, and the description thereof will be suitably omitted.

FIG. 15 illustrates the arrangement of the N+ semiconductor region and the P+ semiconductor region when the portion of the signal extraction unit 65 in the pixel 51 is seen from the direction vertical to the substrate 61.

In this example, the oxide film 64 (not illustrated) is formed in the central portion of the pixel 51, and the signal extraction unit 65 is formed in the portion slightly on the end side from the center of the pixel 51. Particularly in this example, the formation position of each of two signal extraction units 65 in the pixel 51 is the same position as that in FIG. 3.

In the signal extraction unit 65-1, the linear N+ semiconductor region 261 corresponding to the N+ semiconductor region 71-1 illustrated in FIG. 3, is formed in the center of the signal extraction unit 65-1. Then, a linear P+ semiconductor region 262-1 and a linear P+ semiconductor region 262-2, corresponding to the P+ semiconductor region 73-1 illustrated in FIG. 3, are formed around the N+ semiconductor region 261 such that the N+ semiconductor region 261 is interposed between the P+ semiconductor region 262-1 and the P+ semiconductor region 262-2. That is, the N+ semiconductor region 261 is formed in a position interposed by the P+ semiconductor region 262-1 and the P+ semiconductor region 262-2.

Furthermore, hereinafter, in a case where it is not necessary to particularly discriminate the P+ semiconductor region 262-1 from the P+ semiconductor region 262-2, the P+ semiconductor region 262-1 and the P+ semiconductor region 262-2 will also be simply referred to as a P+ semiconductor region 262.

Similarly, in the signal extraction unit 65-2, a linear N+ semiconductor region 263 corresponding to the N+ semiconductor region 71-2 illustrated in FIG. 3, is formed in the center of the signal extraction unit 65-2. Then, a linear P+ semiconductor region 264-1 and a linear P+ semiconductor region 264-2, corresponding to the P+ semiconductor region 73-2 illustrated in FIG. 3, are formed around the N+ semiconductor region 263 such that the N+ semiconductor region 263 is interposed between the P+ semiconductor region 264-1 and the P+ semiconductor region 264-2.

Furthermore, hereinafter, in a case where it is not necessary to particularly discriminate the P+ semiconductor region 264-1 from the P+ semiconductor region 264-2, the P+ semiconductor region 264-1 and the P+ semiconductor region 264-2 will also be simply referred to as a P+ semiconductor region 264.

In the signal extraction unit 65 in FIG. 15, the P+ semiconductor region 262 and the P+ semiconductor region 264 function as the voltage application unit corresponding to the P+ semiconductor region 73 illustrated in FIG. 3, and the N+ semiconductor region 261 and the N+ semiconductor region 263 function as the charge detection unit corresponding to the N+ semiconductor region 71 illustrated in FIG. 3. Furthermore, in the drawings, the length of each of the linear N+ semiconductor region 261, the linear P+ semiconductor region 262, the linear N+ semiconductor region 263, and the linear P+ semiconductor region 264, in the horizontal direction, may be any length, and each of the regions may not have the same length.

Fifth Embodiment

<Configuration Example of Pixel>

Further, in the above description, an example in which each of two signal extraction units 65 is provided in each of the pixels configuring the pixel array portion 21, has been described, but the number of signal extraction units to be provided in the pixel, may be one, or may be three or more.

Figure 16:
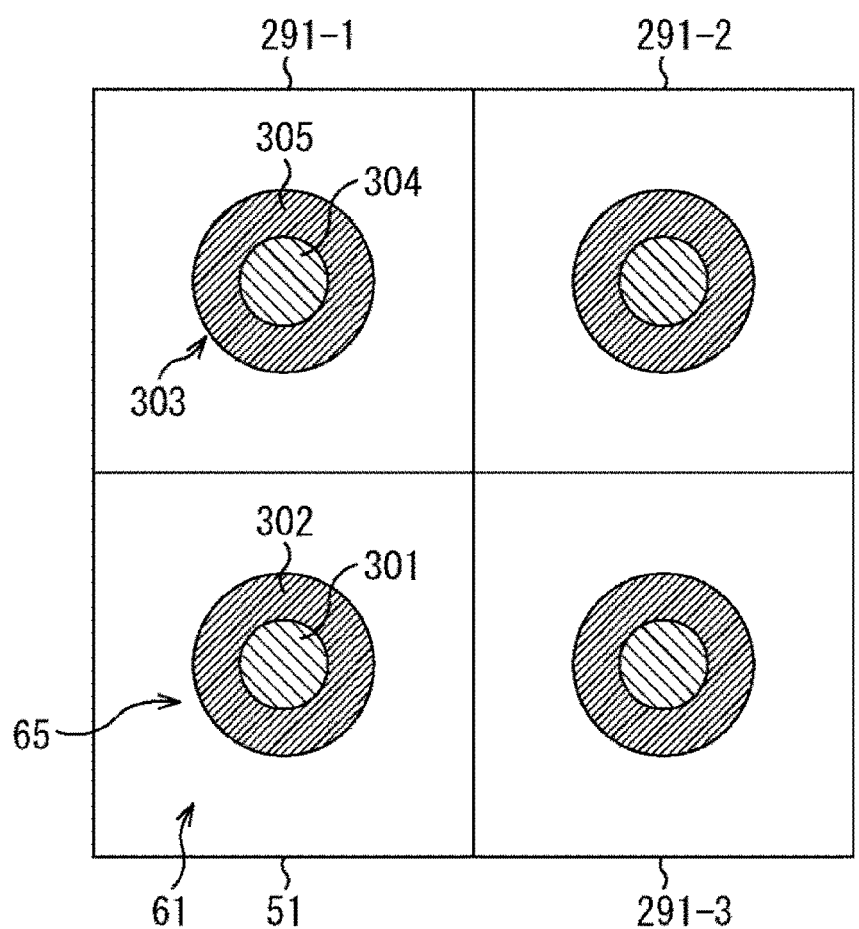
FIG. 16 is a diagram illustrating another configuration example of the pixel.

For example, in a case where one signal extraction unit is formed in the pixel, a pixel portion, for example, is configured as illustrated in FIG. 16. Furthermore, in FIG. 16, the same reference numerals will be applied to portions corresponding to those in FIG. 3, and the description thereof will be suitably omitted.

FIG. 16 illustrates the arrangement of the N+ semiconductor region and the P+ semiconductor region when the portion of the signal extraction unit in a part of the pixels provided in the pixel array portion 21, is seen from the direction vertical to the substrate.

In this example, the pixel 51 provided in the pixel array portion 21, a pixel 291-1 to a pixel 291-3 adjacent to the pixel 51, are illustrated, and one signal extraction unit is formed in each of the pixels.

That is, in the pixel 51, one signal extraction unit 65 is formed in the central portion of the pixel 51. Then, in the signal extraction unit 65, a circular P+ semiconductor region 301 is formed in the center position, and the P+ semiconductor region 301 is surrounded by a circular N+ semiconductor region 302, more specifically, an annular N+ semiconductor region 302, around the P+ semiconductor region 301.

Here, the P+ semiconductor region 301 corresponds to the P+ semiconductor region 73 illustrated in FIG. 3, and functions as the voltage application unit. In addition, the N+ semiconductor region 302 corresponds to the N+ semiconductor region 71 illustrated in FIG. 3, and functions as the charge detection unit. Furthermore, the P+ semiconductor region 301 or the N+ semiconductor region 302 may be in any shape.

In addition, the pixel 291-1 to the pixel 291-3 around the pixel 51, have a structure similar to that of the pixel 51.

That is, for example, one signal extraction unit 303 is formed in the central portion of the pixel 291-1. Then, in the signal extraction unit 303, a circular P+ semiconductor region 304 is formed in the center position, and the P+ semiconductor region 304 is surrounded by a circular N+ semiconductor region 305, more specifically, an annular N+ semiconductor region 305, around the P+ semiconductor region 304.

The P+ semiconductor region 304 and the N+ semiconductor region 305 correspond to the P+ semiconductor region 301 and the N+ semiconductor region 302, respectively.

Furthermore, hereinafter, in a case where it is not necessary to particularly discriminate the pixel 291-1 to the pixel 291-3 from each other, the pixel 251-1 to the pixel 291-3 will also be simply referred to as a pixel 291.

Thus, in a case where one signal extraction unit (tap) is formed in each of the pixels, several pixels adjacent to each other are used at the time of measuring the distance to the target by the indirect ToF method, and the distance information is calculated on the basis of pixel signal obtained with respect to the pixels.

For example, focusing on the pixel 51, in a state where the signal extraction unit 65 of the pixel 51 is the active tap, for example, each of the pixels is driven such that the signal extraction unit 303 of several pixels 291 adjacent to the pixel 51, including the pixel 291-1, becomes the inactive tap.

As an example, for example, the pixel 291-1, the pixel 291-3, or the like, is driven such that the signal extraction unit of the pixels adjacent to the pixel 51 on the left, right, top, and bottom, in the drawings, becomes the inactive tap.

After that, in a case where a voltage to be applied is switched such that the signal extraction unit 65 of the pixel 51 becomes the inactive tap, at this time, the signal extraction unit 303 of the several pixels 291 adjacent to the pixel 51, including the pixel 291-1, becomes the active tap.

Then, the distance information is calculated on the basis of the pixel signal read out from the signal extraction unit 65 in a state where the signal extraction unit 65 is the active tap, and the pixel signal read cut from the signal extraction unit 303 in a state where the signal extraction unit 303 is the active tap.

Thus, even in a case where the number of signal extraction units (taps) provided in the pixel is one, it is possible to measure the distance by using the pixels adjacent to each other according to the indirect ToF method.

Sixth Embodiment

<Configuration Example of Pixel>

In addition, as described above, three or more signal extraction units (taps) may be provided in each of the pixels.

Figure 17:
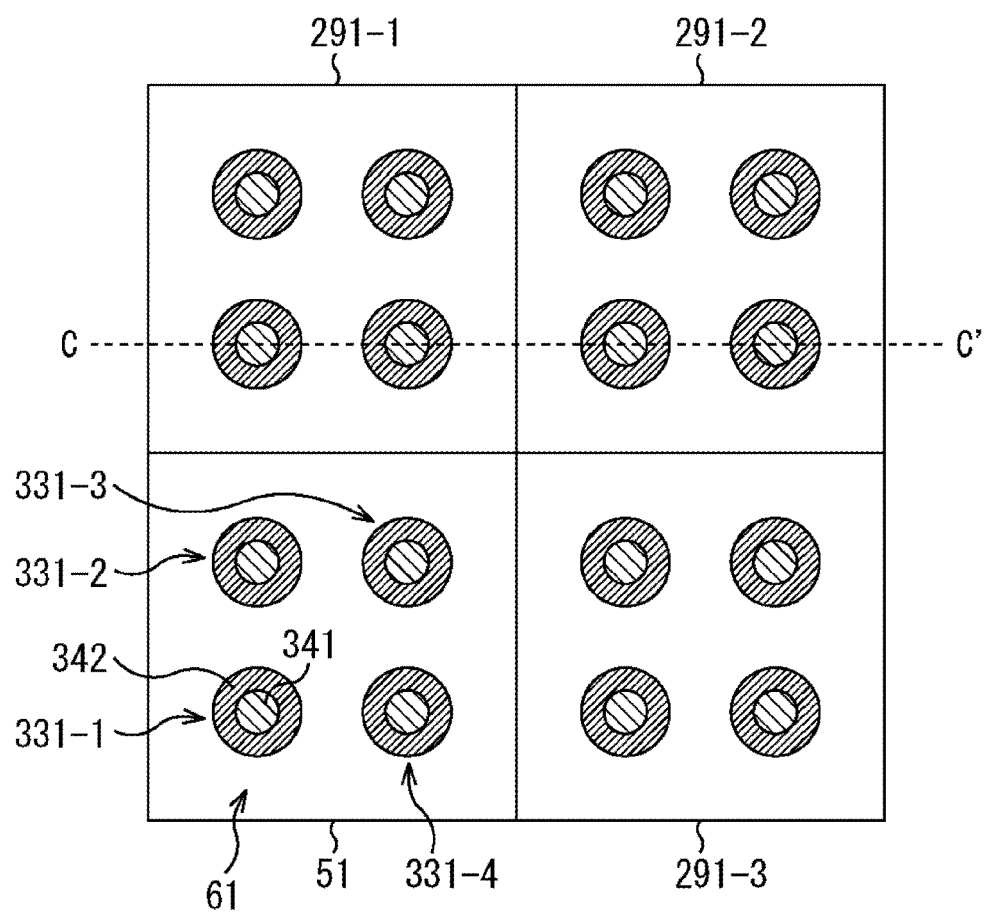
FIG. 17 is a diagram illustrating another configuration example of the pixel.

For example, in a case where four signal extraction units (taps) are provided in the pixel, each of the pixels of the pixel array portion 21 is configured as illustrated in FIG. 17. Furthermore, in FIG. 17, the same reference numerals will be applied to portions corresponding to those in FIG. 16, and the description thereof will be suitably omitted.

FIG. 17 illustrates the arrangement of the N+ semiconductor region and the P+ semiconductor region when the portion of the signal extraction unit in a part of the pixels provided in the pixel array portion 21 is seen from the direction vertical to the substrate.

A sectional view of line C-C', illustrated in FIG. 17, is FIG. 36 as described later.

In this example, the pixel 51 and the pixel 291 provided in the pixel array portion 21, are illustrated, and four signal extraction units are formed in each of the pixels.

That is, in the pixel 51, a signal extraction unit 331-1, a signal extraction unit 331-2, a signal extraction unit 331-3, and a signal extraction unit 331-4 are formed in a position between the center of the pixel 51 and the end portion of the pixel 51, that is, a position on a lower left side in the center of the pixel 51 in the drawings, a position on an upper left side, a position on an upper right side, and a position on a lower right side.

The signal extract ion unit 331-1 to the signal extraction unit 331-4 correspond to the signal extraction unit 65 illustrated in FIG. 16.

For example, in the signal extraction unit 331-1, a circular P+ semiconductor region 341 is formed in the center position, and the P+ semiconductor region 341 is surrounded by a circular N+ semiconductor region 342, more specifically, an annular N+ semiconductor region 342, around the P+ semiconductor region 341.

Here, the P+ semiconductor region 341 corresponds to the P+ semiconductor region 301 illustrated in FIG. 16, and functions as the voltage application unit. In addition, the N+ semiconductor region 342 corresponds to the N+ semiconductor region 302 illustrated in FIG. 16, and functions as the charge detection unit. Furthermore, the P+ semiconductor region 341 or the N+ semiconductor region 342 may be in any shape.

In addition, the signal extraction unit 331-2 to the signal extraction unit 331-4 also have a configuration similar to that of the signal extraction unit 331-1, and respectively include the P+ semiconductor region functioning as the voltage application unit, and the N+ semiconductor region functioning as the charge detection unit. Further, the pixel 291 formed around the pixel 51, has a structure similar to that of the pixel 51.

Furthermore, hereinafter, in a case where it is not necessary to particularly discriminate the signal extraction unit 331-1 to the signal extraction unit 331-4 from each other, the signal extraction unit 331-1 to the signal extraction unit 331-4 will be also simply referred to as a signal extraction unit 331.

Thus, in a case where tout signal extraction units are provided in each of the pixels, for example, the distance information is calculated by using four signal extraction units in the pixel, at the time of measuring the distance according to the indirect ToF method.

As an example, focusing on the pixel 51, for example, in a state where the signal extraction unit 331-1 and the signal extraction unit 331-3 are the active tap, the pixel 51 is driven such that the signal extraction unit 331-2 and the signal extraction unit 331-4 become the inactive tap.

After that, a voltage to be applied to each of the signal extraction units 331, is switched. That is, the pixel 51 is driven such that the signal extraction unit 331-1 and the signal extraction unit 331-3 become the inactive tap, and the signal extraction unit 331-2 and the signal extraction unit 331-4 become the active tap.

Then, the distance information is calculated on the basis of the pixel signal read out from the signal extraction unit 331-1 and the signal extraction unit 331-3 in a state where the signal extraction unit 331-1 and the signal extraction unit 331-3 are the active tap, the pixel signal read out from the signal extraction unit 331-2 and the signal extraction unit 331-4 in a state where the signal extraction unit 331-2 and the signal extraction unit 331-4 are the active tap.

Seventh Embodiment

<Configuration Example of Pixel>

Further, the signal extraction unit (the tap) may be shared between the pixels adjacent to each other in the pixel array portion 21.

Figure 18:
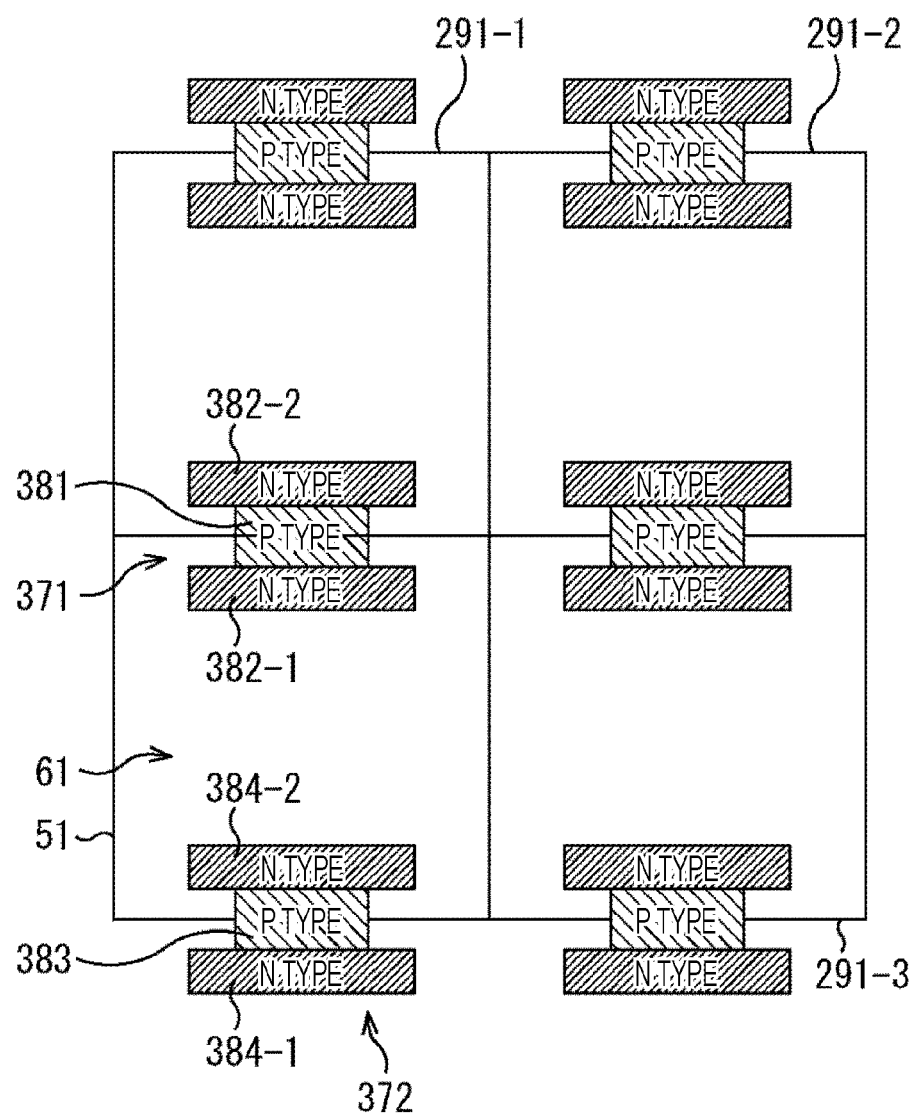
FIG. 18 is a diagram illustrating another configuration example of the pixel.

In such a case, each of the pixels of the pixel array portion 21, for example, is configured as illustrated in FIG. 18. Furthermore, in FIG. 18, the same reference numerals will be applied to portions corresponding to those in FIG. 16, and the description thereof will be suitably omitted.

FIG. 18 illustrates the arrangement of the N+ semiconductor region and the P+ semiconductor region when the portion of the signal extraction unit in a part of the pixels provided in the pixel array portion 21 is seen from the direction vertical to the substrate.

In this example, the pixel 51 and the pixel 291 provided in the pixel array portion 21, are illustrated, and two signal extraction units are formed in each of the pixels.

For example, in the pixel 51, a signal extraction unit 371 is formed in the end portion of the pixel 51 on an upper side, in the drawings, and a signal extraction unit 372 is formed in the end portion of the pixel 51 on a lower side, in the drawings.

The signal extraction unit 371 is shared between the pixel 51 and the pixel 291-1. That is, the signal extraction unit 371 is used as the tap of the pixel 51, and is also used as the tap of the pixel 291-1. In addition, the signal extraction unit 372 is shared between the pixel 51 and a pixel (not illustrated) adjacent to the pixel 51 on a lower side, in the drawings.

In the signal extraction unit 371, a linear P+ semiconductor region 331 corresponding to the P+ semiconductor region 231 illustrated in FIG. 14, is formed in the center position. Then, in the drawings, a linear N+ semiconductor region 382-1 and a linear semiconductor region 382-2, corresponding to the N+ semiconductor region 232 illustrated in FIG. 14, are formed such that the P+ semiconductor region 381 is interposed between the N+ semiconductor region 382-1 and the N+ semiconductor region 382-2, in an upper position and a lower position of the P+ semiconductor region 381.

In particular, in this example, the P+ semiconductor region 381 is formed in a boundary portion between the pixel 51 and the pixel 291-1. In addition, the N+ semiconductor region 382-1 is formed in the region in the pixel 51, and the N+ semiconductor region 382-2 is formed in the region in the pixel 291-1.

Here, the P+ semiconductor region 381 functions as the voltage application unit, and the N+ semiconductor region 382-1 and the semiconductor region 382-2 function as the charge detection unit. Furthermore, hereinafter, in a case where it is not necessary to particularly discriminate the N+ semiconductor region 382-1 from the N+ semiconductor region 382-2, the N+ semiconductor region 382-1 and the N+ semiconductor region 382-2 will be also simply referred to as an N+ semiconductor region 382.

In addition, the P+ semiconductor region 381 or the N+ semiconductor region 382 may be in any shape. Further, the N+ semiconductor region 382-1 and the N+ semiconductor region 382-2 may be connected to the same FD portion, or maybe connected to FD portions different from each other.

In the signal extraction unit 372, a linear P+ semiconductor region 383, an N+ semiconductor region 384-1, and an N+ semiconductor region 384-2 are formed.

The semiconductor region 383, the semiconductor region 384-1, and the N+ semiconductor region 384-2 respectively correspond to the P+ semiconductor region 381, the N+ semiconductor region 382-1, and the N+ semiconductor region 382-2, and have similar arrangement, a similar shape, and a similar function. Furthermore, hereinafter, in a case where it is not necessary to particularly discriminate the N+ semiconductor region 384-1 from the N+ semiconductor region 384-2, the N+ semiconductor region 384-1 and the N+ semiconductor region 384-2 will also be simply referred to as an N+ semiconductor region 384.

As described above, even in a case where the signal extraction unit (the tap) is shared between the adjacent pixels, it is possible to measure the distance by the indirect ToF method, according to an operation similar to that of the example illustrated in FIG. 3.

As illustrated in FIG. 18, in a case where the signal extraction unit is shared between the pixels, for example, a distance between a pair of P+ semiconductor regions for generating an electrical field, that is, a current, such as a distance between the P+ semiconductor region 381 and the P+ semiconductor region 383, becomes long. In other words, the signal extraction unit is shared between the pixels, and thus, it is possible to maximize the distance between the P+ semiconductor regions.

With this arrangement, it is difficult for a current to flow between the P+ semiconductor regions, and thus, it is possible to reduce the power consumption of the pixel, and it is also advantageous to the miniaturization of the pixel.

Furthermore, here, an example in which one signal extraction unit is shared between two pixels adjacent to each other, has been described, but one signal extraction unit may be shared in three or more pixels adjacent to each other. In addition, in a case where the signal extraction unit is shared in two or more pixels adjacent to each other, in the signal extraction units, only the charge detection unit for detecting the signal carrier may be shared, or only the voltage application unit for generating the electrical field may be shared.

Eighth Embodiment

<Configuration Example of Pixel>

Further, the on-chip lens or the inter-pixel light shielding unit, provided in each of the pixels such as the pixel 51 of the pixel array portion 21, may not be particularly provided.

Figure 19:
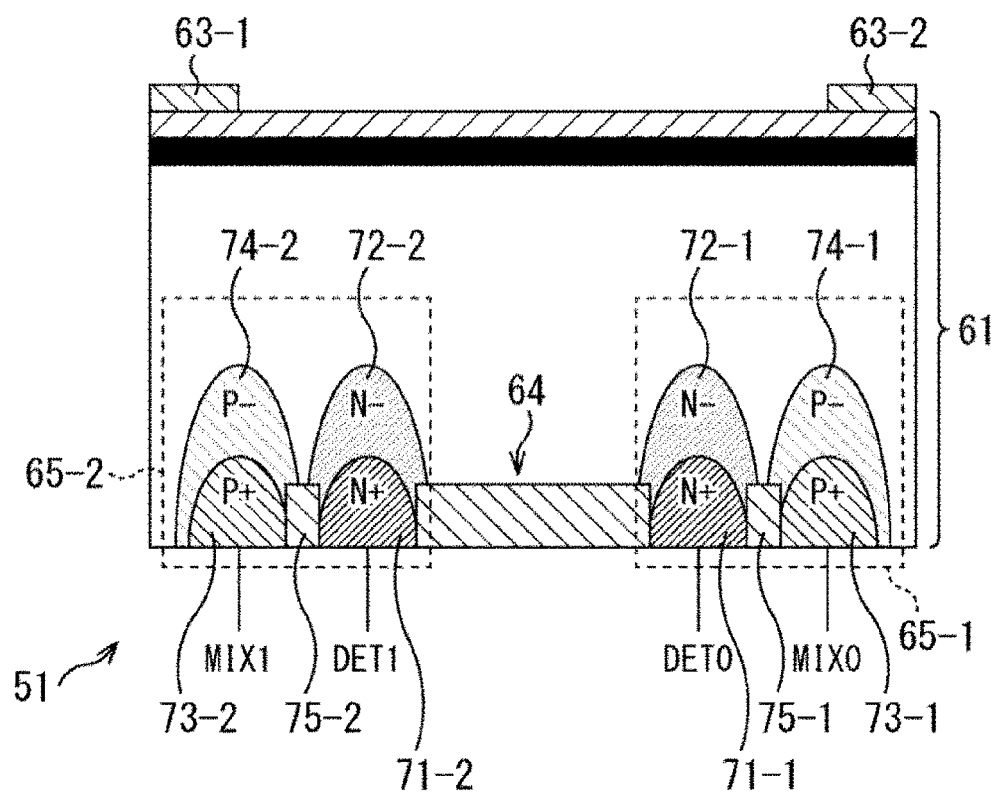
FIG. 19 is a diagram illustrating another configuration example of the pixel.

Specifically, for example, the pixel 51 can be configured as illustrated in FIG. 19. Furthermore, In FIG. 19, the same reference numerals will be applied to portions corresponding to those in FIG. 2, and the description thereof will be suitably omitted.

The configuration of the pixel 51 illustrated in FIG. 19, is the same as the configuration of the pixel 51 illustrated in FIG. 2, except that the on-chip lens 62 is not provided.

In the pixel 51 illustrated in FIG. 19, the on-chip lens 62 is not provided on the incidence surface side of the substrate 61, and thus, it is possible to further reduce the attenuation of the infrared light to be incident on the substrate 61 from the outside. With this arrangement, the amount of infrared light that can be received by the substrate 61, increases, and the sensitivity of the pixel 51 can be improved.

Modification Example 1 of Eighth Embodiment

<Configuration Example of Pixel>

Figure 20:
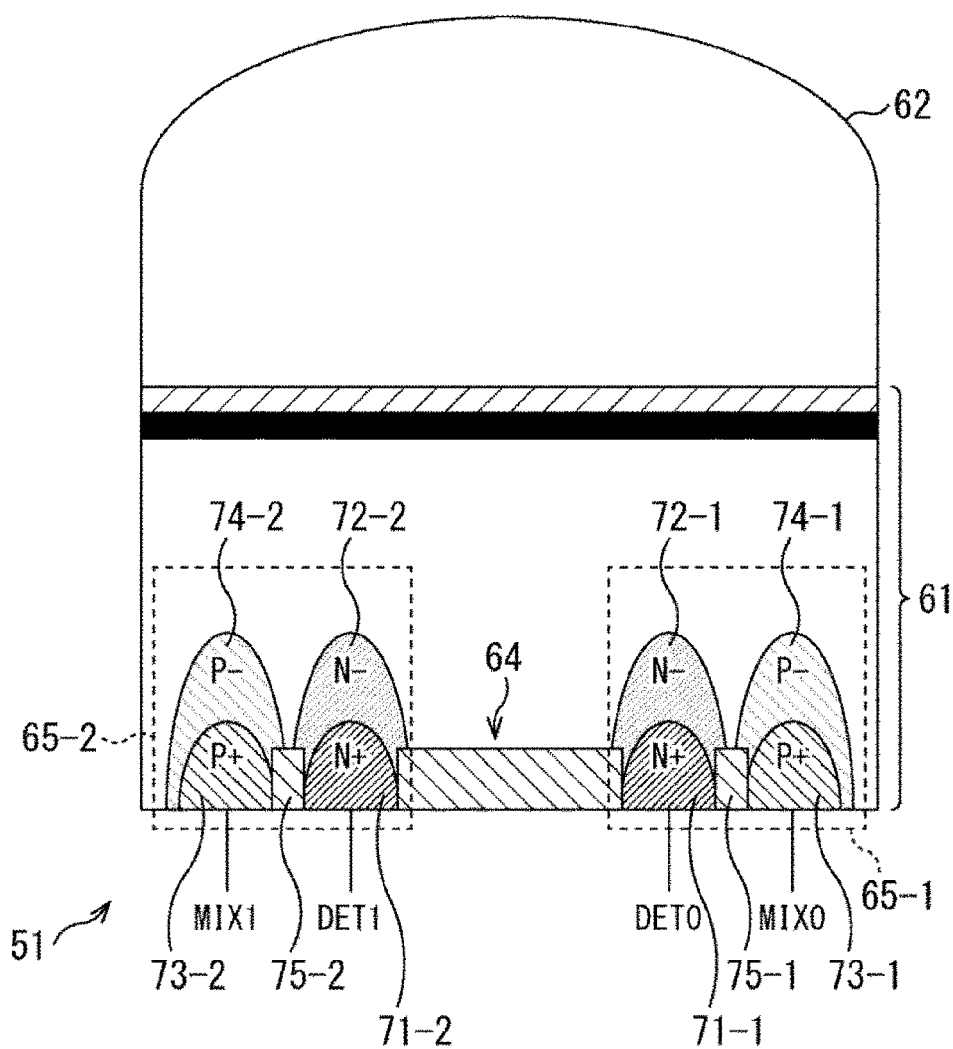
FIG. 20 is a diagram illustrating another configuration example of the pixel.

In addition, the configuration of the pixel 51, for example, may be a configuration illustrated in FIG. 20. Furthermore, in FIG. 20, the same reference numerals will be applied to portions corresponding to those in FIG. 2, and the description thereof will be suitably omitted.

The configuration of the pixel 51 illustrated in FIG. 20, is the same as the configuration of the pixel 51 illustrated in FIG. 2, except that the inter-pixel light, shielding unit 63-1 and the inter-pixel light shielding unit 63-2 are not provided.

In an example illustrated in FIG. 20, the inter-pixel light shielding unit 63 is not provided on the incidence surface side of the substrate 61, and thus, the effect of suppressing the color mixture decreases, but the infrared light that is shielded by the inter-pixel light shielding unit 63, is also incident on the substrate 61, and therefore, the sensitivity of the pixel 51 can be improved.

Furthermore, it is obvious that neither the on-chip lens 62 nor the inter-pixel light shielding unit 63 may be provided in the pixel 51.

Modification Example 2 of Eighth Embodiment

<Configuration Example of Pixel>

Figure 21:
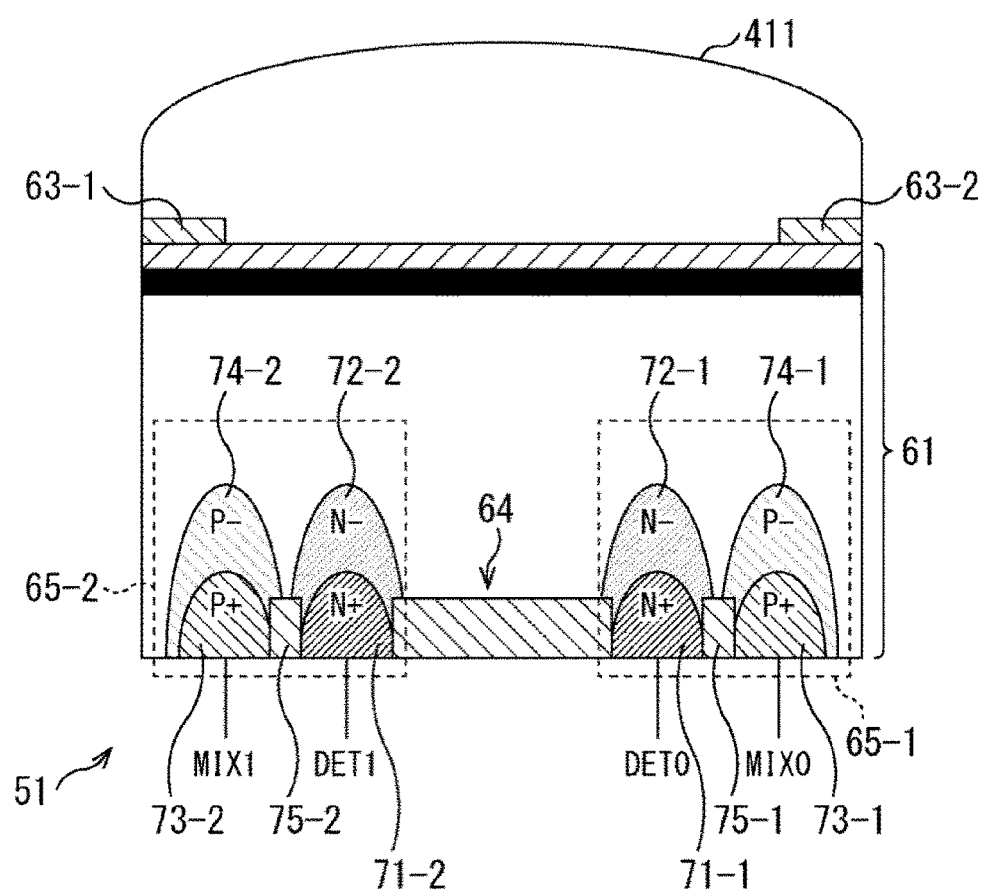
FIG. 21 is a diagram illustrating another configuration example of the pixel.

In addition, for example, as illustrated in FIG. 21, the thickness of the on-chip lens in a light axis direction may be optimized. Furthermore, in FIG. 21, the same reference numerals will be applied to portions corresponding to those in FIG. 2, and the description thereof will be suitably omitted.

The configuration of the pixel 51 illustrated in FIG. 21, is the same as the configuration of the pixel 51 illustrated in FIG. 2, except that an on-chip lens 411 is provided instead of the on-chip lens 62.

In the pixel 51 illustrated in FIG. 21, the on-chip lens 411 is formed on the incidence surface side of the substrate 61, that is, in the drawings, an upper side. The thickness of the on-chip lens 411 in the light axis direction, that is, in the drawings, the thickness of the on-chip lens 411 in the vertical direction, is thin, compared to the on-chip lens 62 illustrated in FIG. 2.

In general, it is advantageous to the condensing of light to be incident on the on-chip lens, as the on-chip lens provided on the front surface of the substrate 61, becomes thicker. However, the on-chip lens 411 becomes thin, and thus, a transmissivity becomes high, and the sensitivity of the pixel 51 can be improved, and therefore, it is sufficient to suitably set the thickness of the on-chip lens 411, according to the thickness of the substrate 61, a position on which infrared light is to be condensed, or the like.

Ninth Embodiment

<Configuration Example of Pixel>

Further, a separation region for improving separation characteristics between the adjacent pixels, and for suppressing the color mixture, may be provided between the pixel and the pixel, formed in the pixel array portion 21.

Figure 22:
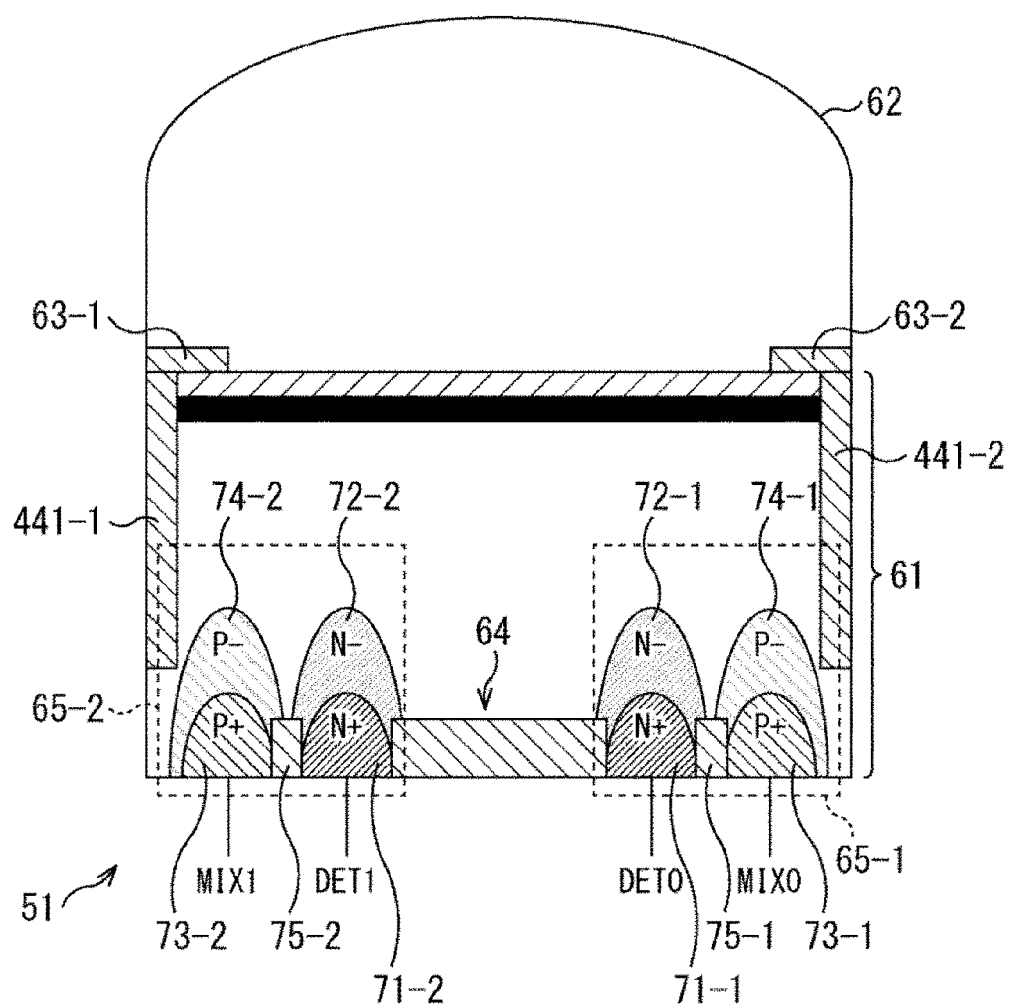
FIG. 22 is a diagram illustrating another configuration example of the pixel.

In such a case, the pixel 51, for example, is configured as illustrated in FIG. 22. Furthermore, in FIG. 22, the same reference numerals will be applied to portions corresponding to those in FIG. 2, and the description thereof will be suitably omitted.

The configuration of the pixel 51 illustrated in FIG. 22, is the same as the configuration of the pixel 51 illustrated in FIG. 2, except that a separation region 441-1 and a separation region 441-2 are provided in the substrate 61.

In the pixel 51 illustrated in FIG. 22, the separation region 441-1 and the separation region 441-2, penetrating through at least a part of the substrate 61, are formed in a boundary portion between the pixel 51 and the other pixel adjacent to the pixel 51 in the substrate 61, that is, in the drawings, right and left end portions of the pixel 51, by a light shielding film or the like. Furthermore, hereinafter, in a case where it is not necessary to particularly discriminate the separation region 441-1 from the separation region 441-2, the separation region 441-1 and the separation region 441-2 will also be simply referred to as a separation region 441.

For example, when the separation region 441 is formed, a longitudinal groove (trench) is formed in a downward direction (in a direction vertical to the surface of the substrate 61) in the drawings, from the incidence surface side of the substrate 61, that is, the surface of the substrate 61 on an upper side in the drawings, and the light shielding film is formed by being embedded in the groove portion, and thus, the separation region 441 is formed. The separation region 441 functions as a pixel separation region configured to shield infrared light that is incident on the substrate 61 from the incidence surface, and is directed towards the other pixel adjacent to the pixel 51.

The embedded separation region 441 is formed as described above, and thus, it is possible to improve the separation characteristics of the infrared light between the pixels, and to suppress the occurrence of the color mixture.

Modification Example 1 of Ninth Embodiment

<Configuration Example of Pixel>

Figure 23:
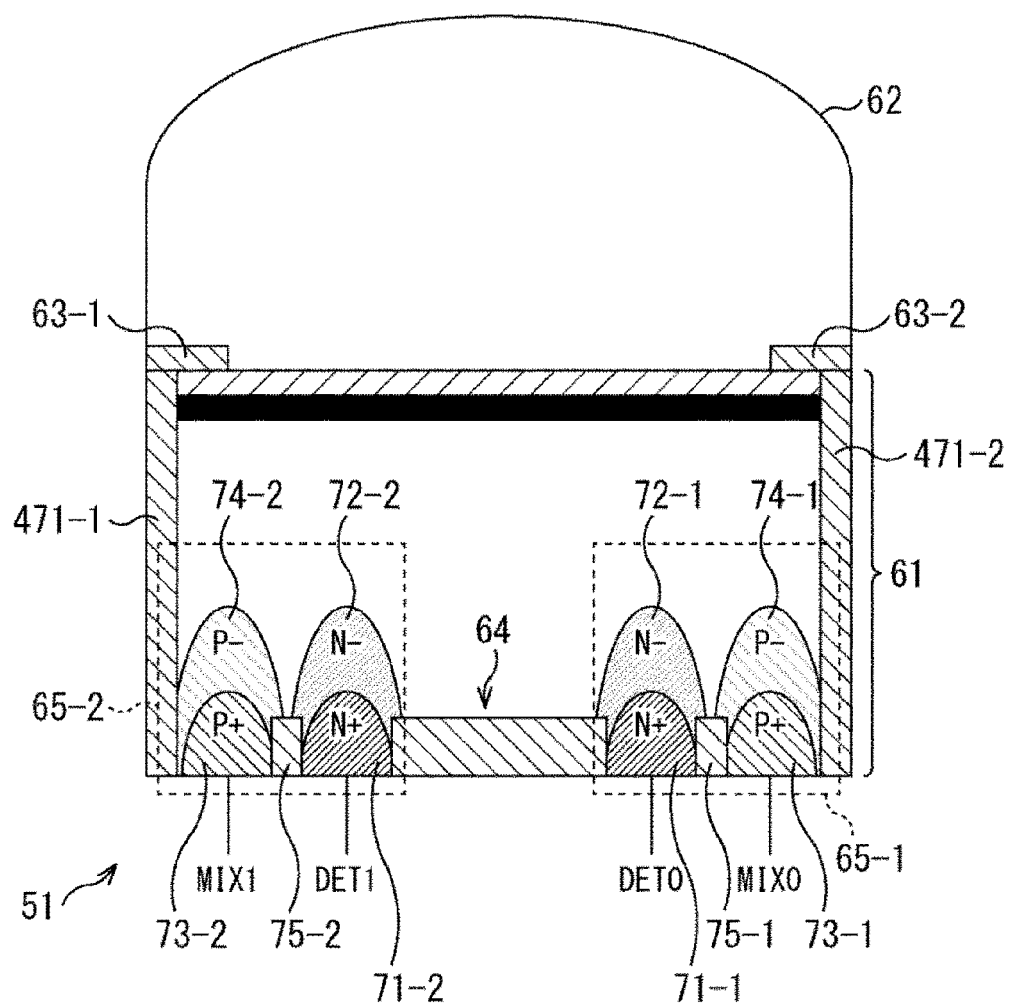
FIG. 23 is a diagram illustrating another configuration example of the pixel.

Further, in a case where the embedded separation region is formed in the pixel 51, for example, as illustrated in FIG. 23, a separation region 471-1 and a separation region 471-2, penetrating through the entire substrate 61, may be provided. Furthermore, in FIG. 23, the same reference numerals will be applied to portions corresponding to these in FIG. 2, and the description thereof will be suitably omitted.

The configuration of the pixel 51 illustrated in FIG. 23, is the same as the configuration of the pixel 51 illustrated in FIG. 2, except that the separation region 471-1 and the separation region 471-2 are provided in the substrate 61. That is, in the pixel 51 illustrated in FIG. 23, the separation region 471-1 and the separation region 471-2 are provided instead of the separation region 441 of the pixel 51 illustrated in FIG. 22.

In the pixel 51 illustrated in FIG. 23, the separation region 471-1 and the separation region 471-2, penetrating through the entire substrate 61, are formed in the boundary portion between the pixel 51 and the other pixel adjacent to the pixel 51 in the substrate 61, that is, in the drawings, the right and left end portions of the pixel 51, by the light shielding film or the like. Furthermore, hereinafter, in a case where it is not necessary to particularly discriminate the separation region 471-1 from the separation region 471-2, the separation region 471-1 and the separation region 471-2 will also be simply referred to as a separation region 471.

For example, when the separation region 471 is formed, a longitudinal groove (trench) is formed in an upward direction in the drawings, from the surface of the substrate 61 on a side opposite to the incidence surface side, that is, the surface of the substrate 61 on a lower side in the drawings. At this time, such a groove is formed to reach the incidence surface of the substrate 61, that is, to penetrate through the substrate 61. Then, the light shielding film is formed by being embedded in the groove portion formed as described above, and thus, the separation region 471 is formed.

According to the embedded separation region 471, it is possible to improve the separation characteristics of the infrared light between the pixels, and to suppress the occurrence of the color mixture.

Tenth Embodiment

<Configuration Example of Pixel>

Further, the thickness of the substrate on which the signal extraction unit 65 is formed, can be set according to various characteristics of the pixel, or the like.

Figure 24:
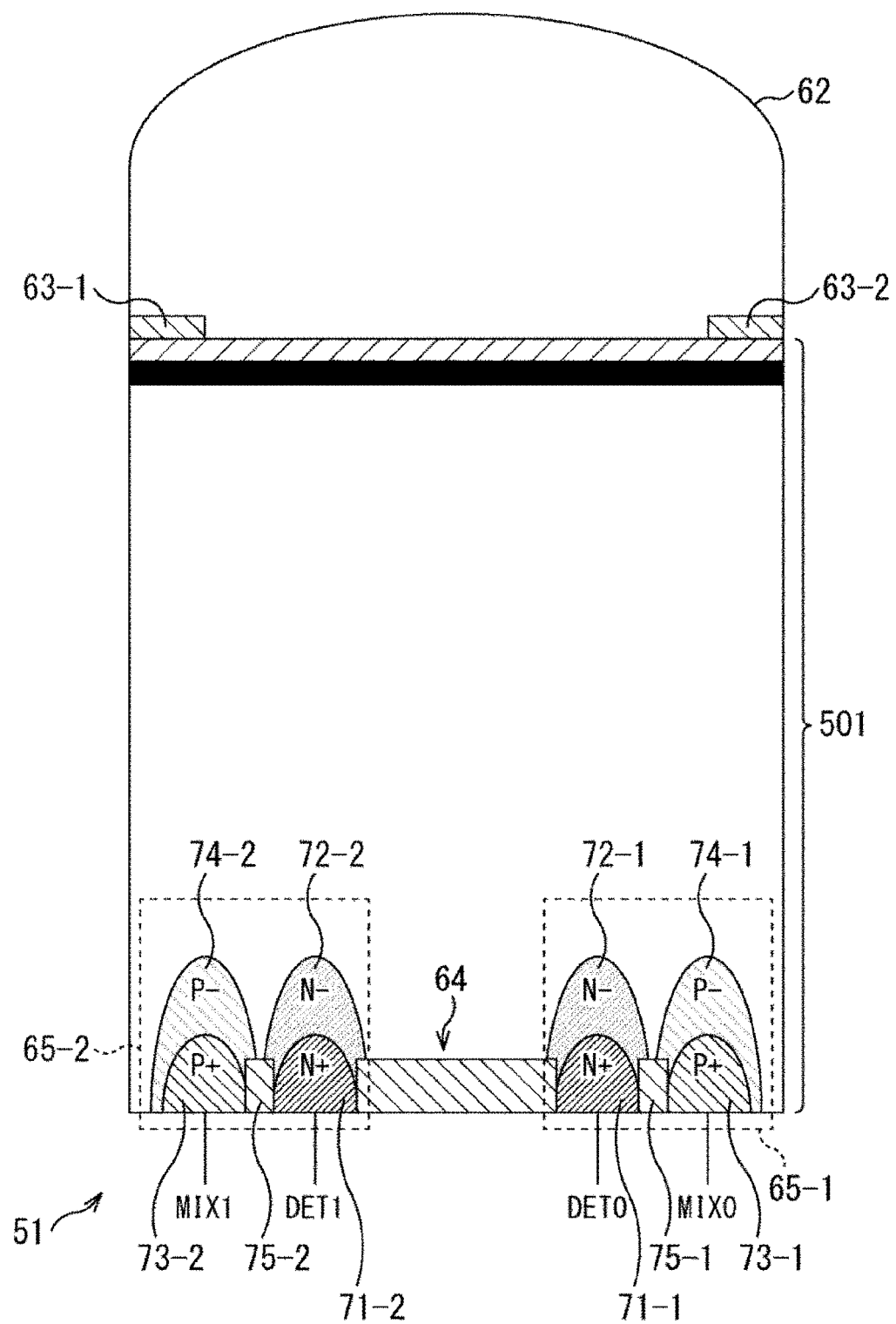
FIG. 24 is a diagram illustrating another configuration example of the pixel.

Therefore, for example, as illustrated in FIG. 24, a substrate 501 configuring the pixel 51, can be thicker than the substrate 61 illustrated in FIG. 2. Furthermore, in FIG. 24, the same reference numerals will be applied to portions corresponding to those in FIG. 2, and the description thereof will be suitably omitted.

The configuration of the pixel 51 illustrated in FIG. 24, is the same as the configuration of the pixel 51 illustrated in FIG. 2, except that the substrate 501 is provided instead of the substrate 61.

That is, in the pixel 51 illustrated in FIG. 24, the on-chip lens 62 and the inter-pixel light shielding unit 63 are formed on an incidence surface side of the substrate 501. In addition, the oxide film 64, the signal extraction unit 65, and the separation portion 75 are formed in the vicinity of a front surface of the substrate 501 on a side opposite to the incidence surface side.

The substrate 501, for example, includes a P type semiconductor substrate having a thickness of greater than or equal to 20 μm, the substrate 501 and the substrate 61 are different from each other only in the thickness of the substrate, and a position in which the oxide film 64, the signal extraction unit 65, and the separation portion 75 are formed, is the same position between the substrate 501 and the substrate 61.

Furthermore, film thicknesses or the like of various layers (films) to be suitably formed on the incidence surface side or the like of the substrate 501 or the substrate 61 may be optimized according to the characteristics of the pixel 51, or the like.

Eleventh Embodiment

<Configuration Example of Pixel>

Figure 25:
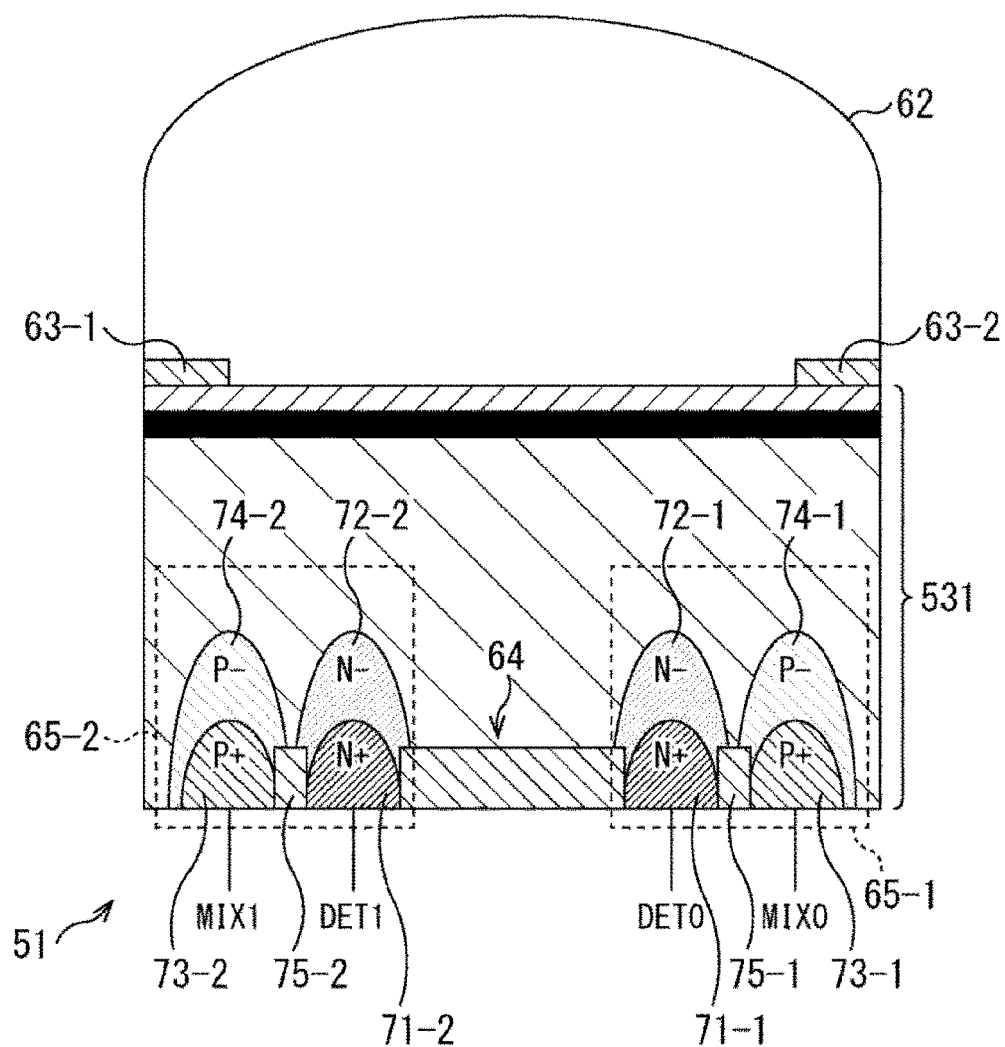
FIG. 25 is a diagram illustrating another configuration example of the pixel.

Further, in the above description, an example in which the substrate configuring the pixel 51 includes the P type semiconductor substrate, has been described, but for example, as illustrated in FIG. 25, the substrate may include an N type semiconductor substrate. Furthermore, in FIG. 25, the same reference numerals will be applied to portions corresponding to those in FIG. 2, and the description thereof will be suitably omitted.

The configuration of the pixel SI illustrated in FIG. 25, is the same as the configuration of the pixel 51 illustrated in FIG. 2, except that a substrate 531 is provided instead of the substrate 61.

In the pixel 51 illustrated in FIG. 25, for example, the on-chip lens 62 and the inter-pixel light shielding unit 63 are formed on an incidence surface side of the substrate 531 that is a silicon substrate, that is, an N type semiconductor substrate including an N type semiconductor region.

In addition, the oxide film 64, the signal extraction unit 65, and the separation port ion 75 are formed in the vicinity of a front surface of the substrate 531 on a side opposite to the incidence surface side. A position in which the oxide film 64, the signal extraction unit 65, and the separation portion 75 are formed, is the same position between the substrate 531 and the substrate 61, and the configuration of the signal extraction unit 65 is the same as that of the substrate 531 and the substrate 61.

The thickness of the substrate 531, for example, in the vertical direction in the drawings, that is, thickness of the substrate 531 in a direction vertical to the surface of the substrate 531, is less than or equal to 20 μm.

In addition, the substrate 531, for example, includes an N-Epi substrate having high resistance, of which a substrate concentration is less than or equal to 1E+13 order, or the like, and the resistance (a resistivity) of the substrate 531, for example, is greater than or equal to 500 [Ωcm]. With this arrangement, it is possible to reduce the power consumption of the pixel 51.

Here, in a relationship between the substrate concentration and the resistance of the substrate 531, for example, the resistance is 2000 [Ωcm] when the substrate concentration is 2.15E+12 [cm$^3$], the resistance is 1000 [Ωcm] when the substrate concentration is 4.30E+12 [cm$^3$], the resistance is 500 [Ωcm] when the substrate concentration is 8.61E+12 [cm$^3$], the resistance is 100 [Ωcm] when the substrate concentration is 4.32E+13 [cm$^3$], and the like.

Thus, even in a case where the substrate 531 of the pixel 51 is configured as the N type semiconductor substrate, a similar effect can be obtained according to an operation similar to that of the example illustrated in FIG. 2.

Twelfth Embodiment

<Configuration Example of Pixel>

Further, as with an example described with reference to FIG. 24, the thickness of the N type semiconductor substrate can also be set according to various characteristics of the pixel, or the like.

Figure 26:
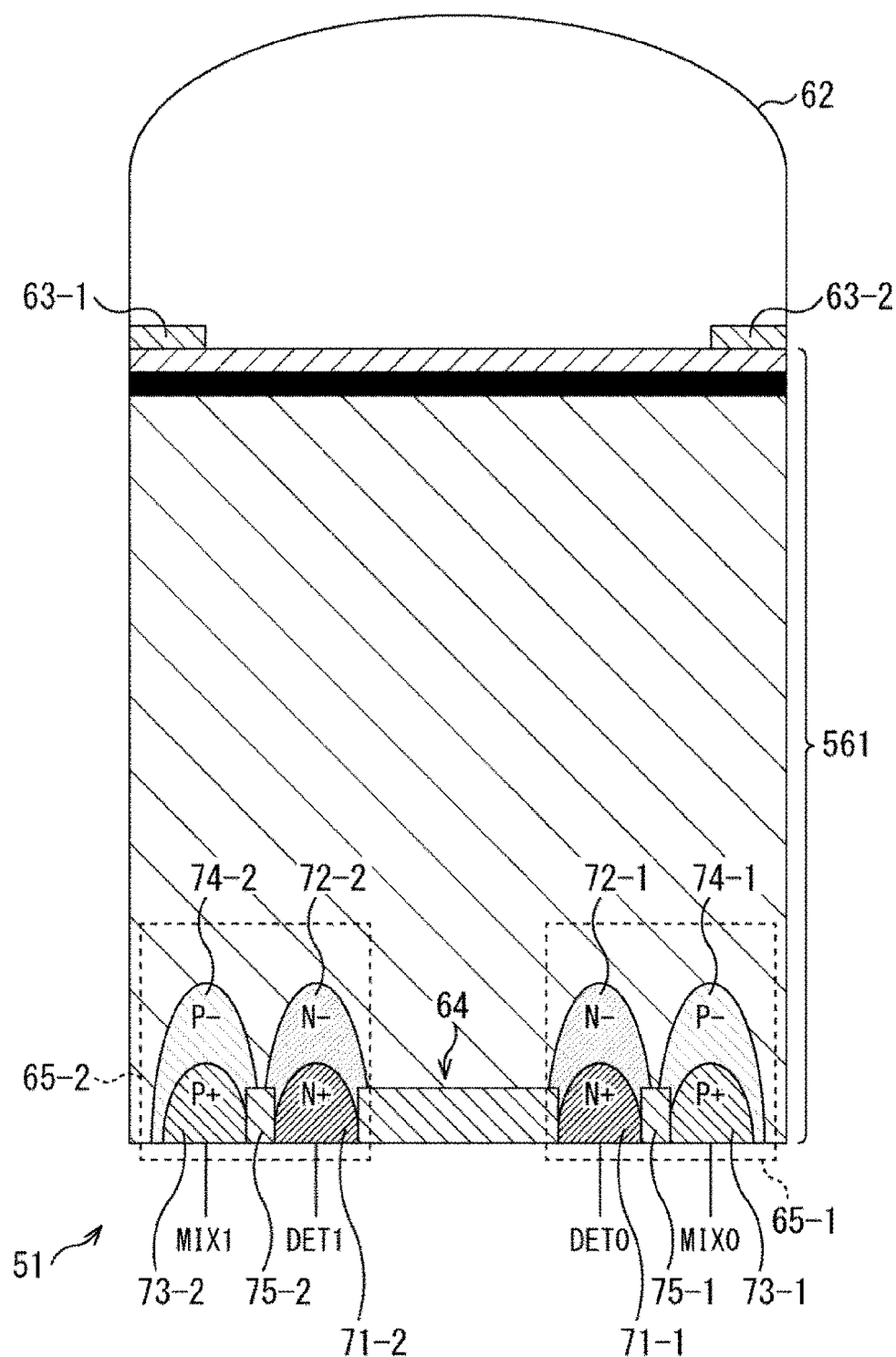
FIG. 26 is a diagram illustrating another configuration example of the pixel.

Therefore, for example, as illustrated in FIG. 26, a substrate 561 configuring the pixel 51, can be thicker than the substrate 531 illustrated in FIG. 25. Furthermore, in FIG. 26, the same reference numerals will be applied to portions corresponding to those in FIG. 25, and the description thereof will be suitably omitted.

The configuration of the pixel 51 illustrated in FIG. 26, is the same as the configuration of the pixel 51 illustrated in FIG. 25, except that the substrate 561 is provided instead of the substrate 531.

That is, in the pixel 51 illustrated in FIG. 26, the on-chip lens 62 and the inter-pixel light shielding unit 63 are formed on an incidence surface side of the substrate 561. In addition, the oxide film 64, the signal extraction unit 65, and the separation portion 75 are formed in the vicinity of a front surface of the substrate 561 on a side opposite to the incidence surface side.

The substrate 561, for example, includes an N type semiconductor substrate having a thickness of greater than or equal to 20 μm, the substrate 561 and the substrate 531 are different from each other only in the thickness of the substrate, and a position in which the oxide film 64, the signal extraction unit 65, and the separation portion 75 are formed, is the same position between the substrate 561 and the substrate 531.

Thirteenth Embodiment

<Configuration Example of Pixel>

In addition, for example, a bias is applied to the incidence surface side of the substrate 61, and thus, in the substrate 61, the electrical field in the direction vertical to the surface of the substrate 61 (hereinafter, also referred to as a Z direction) may be enhanced.

Figure 27:
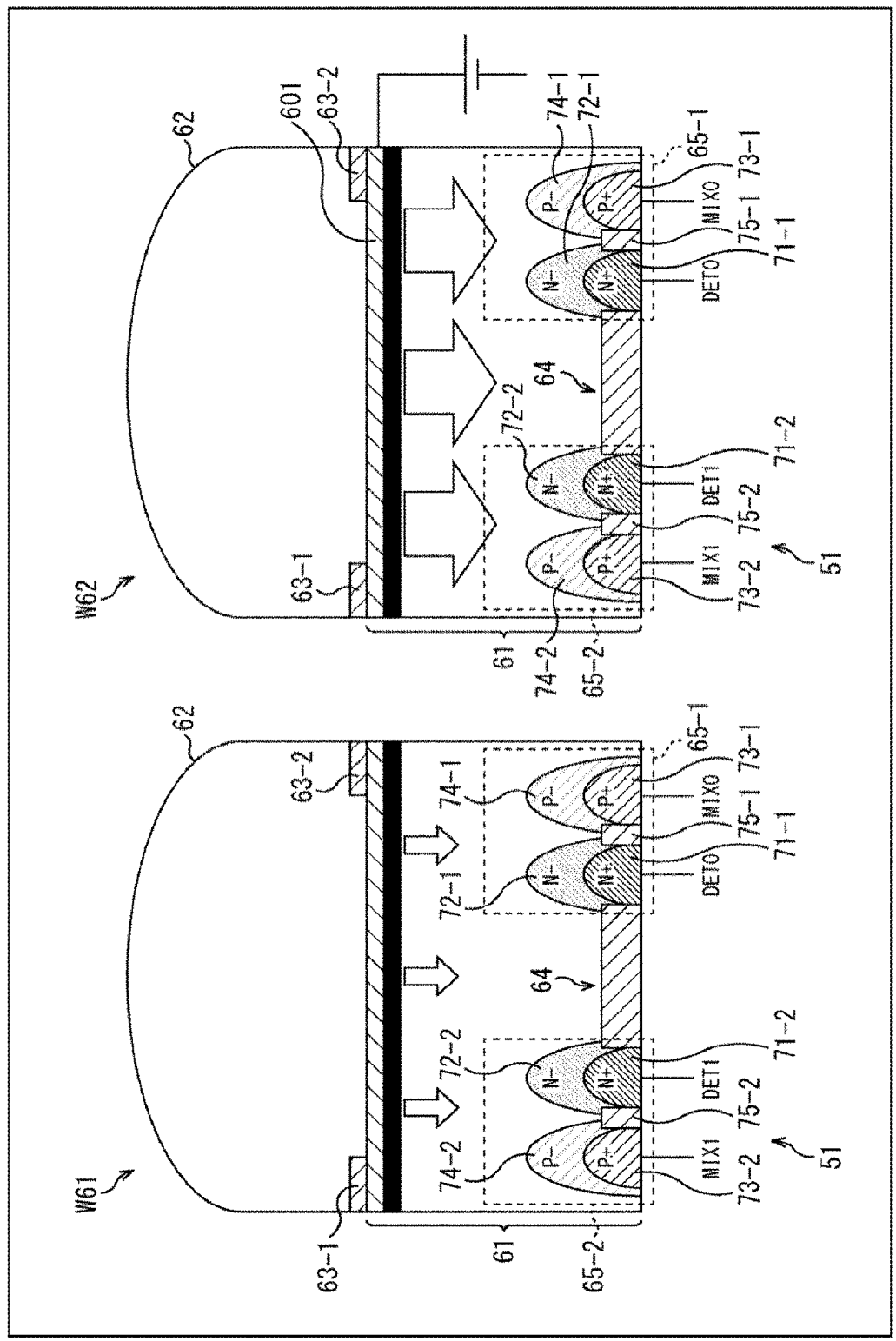
FIG. 27 is a diagram illustrating another configuration example of the pixel.

In such a case, for example, the pixel 51 is configured as illustrated in FIG. 27. Furthermore, in FIG. 27, the same reference numerals will be applied to portions corresponding to those in FIG. 2, and the description thereof will be suitably omitted.

In FIG. 27, the pixel 51 illustrated in FIG. 2, is illustrated in a portion illustrated by an arrow W61, and an arrow in the substrate 61 of the pixel 51 indicates the strength of the electrical field in the Z direction, in the substrate 61.

In contrast, the configuration of the pixel 51 in the case of applying a bias (a voltage) to the incidence surface, is illustrated in a portion illustrated by an arrow W62. The configuration of the pixel 51 illustrated by the arrow W62 is basically the same as the configuration of the pixel 51 illustrated in FIG. 2, but includes a configuration of applying a voltage to the incidence surface side of the substrate 61. In addition, an arrow in the substrate 61 of the pixel 51 indicates the strength of the electrical field in the Z direction, that is, the strength of a bias to be applied, in the substrate 61.

In the example illustrated by the arrow W62, a P+ semiconductor region 601 is formed immediately below the incidence surface of the substrate 61, that is, in the drawings, the surface of the substrate 61 on an upper side.

For example, a film having a positive fixed charge, is laminated, and is set to the P+ semiconductor region 601 cover the entire incidence surface, and the incidence surface side of the substrate 61 is set in a hole accumulation state, and thus, the occurrence of a dark current is suppressed. Furthermore, it is obvious that the P+ semiconductor region 601 is also formed in the substrate 61 illustrated in FIG. 2.

Here, a bias is applied by applying a voltage of less than or equal to 0 V to the P+ semiconductor region 601 in the pixel array or from the outside, and thus, the electrical field in the Z direction is enhanced. That is, it is known that the thickness of the arrow illustrated in the substrate 61 is also greater than that of the example of the arrow W61, and the electrical field in the Z direction becomes stronger. Thus, a voltage is applied to the incidence surface side of the substrate 61, that is, the P+ semiconductor region 601, and thus, the electrical field in the Z direction is enhanced, and the extraction efficiency of the electron in the signal extraction unit 65 can be improved.

Furthermore, a configuration for applying a voltage to the incidence surface side of the substrate 61, is not limited to a configuration in which the P+ semiconductor region 601 is provided, and may be any other configurations. For example, a transparent electrode film is formed between the incidence surface of the substrate 61 and the on-chip lens 62 by being laminated, and a voltage is applied to the transparent electrode film, and thus, a bias may be applied.

Fourteenth Embodiment

<Configuration Example of Pixel>

Further, in order to improve the sensitivity of the pixel 51 with respect to an infrared ray, a reflection member having a large area, may be provided on the surface of the substrate 61 on a side opposite to the incidence surface.

Figure 28:
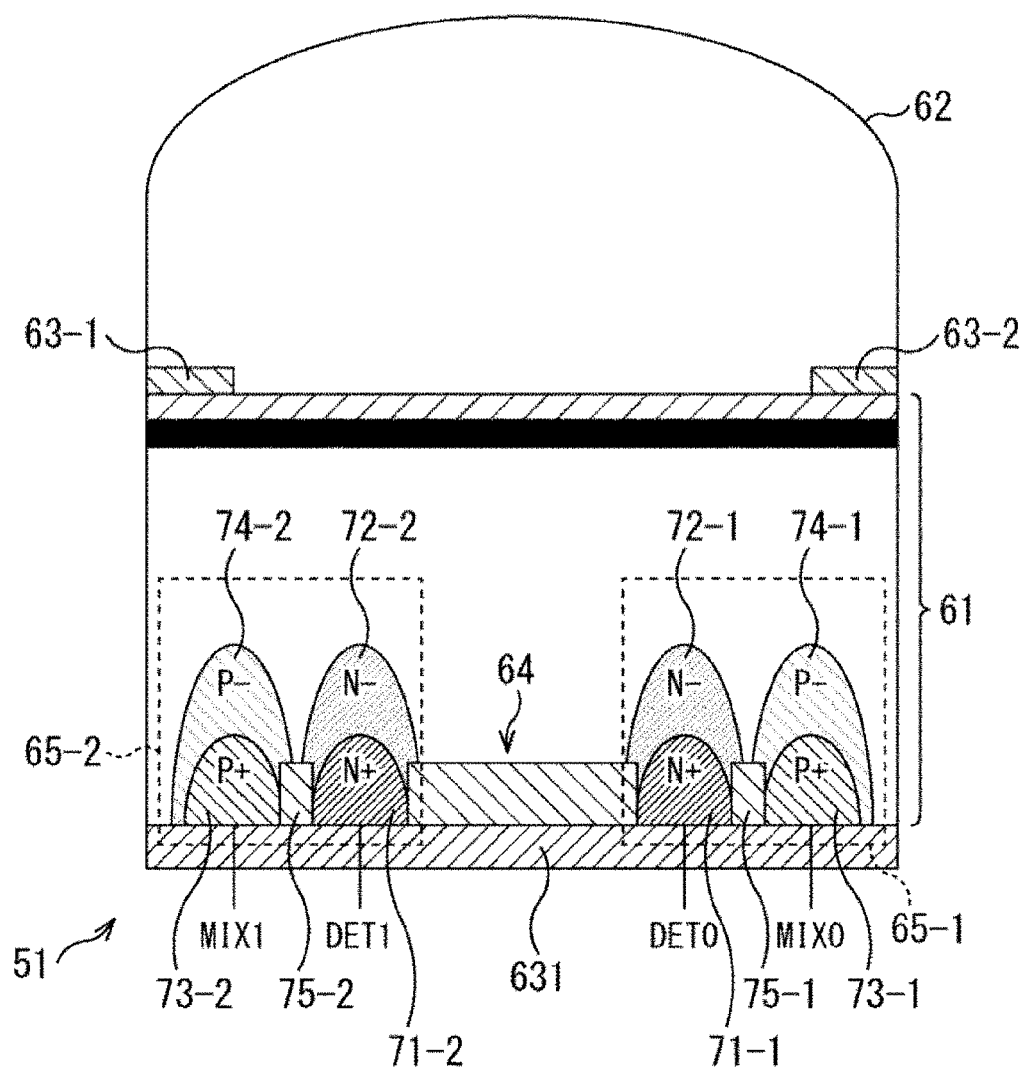
FIG. 28 is a diagram illustrating another configuration example of the pixel.

In such a case, the pixel 51, for example, is configured as illustrated in FIG. 28. Furthermore, in FIG. 28, the same reference numerals will be applied to portions corresponding to those in FIG. 2, and the description thereof will be suitably omitted.

The configuration off the pixel 51 illustrated in FIG. 28, is the same as the configuration of the pixel 51 illustrated in FIG. 2, except that a reflection member 631 is provided on the surface of the substrate 61 on a side opposite to the incidence surface.

In an example illustrated in FIG. 28, the reflection member 631 on which infrared light is reflected, is provided to cover the entire surface off the substrate 61 on a side opposite to the incidence surface.

The reflection member 631 may be any reflection member insofar as having a high reflection rate of infrared light. For example, a metal such as copper or aluminum, provided in a multi-layer wiring layer laminated on the surface of the substrate 61 on a side opposite to the incidence surface, may be used as the reflection member 631, or a reflection structure such as polysilicon or an oxide film, may be formed on the surface of the substrate 61 on a side opposite to the incidence surface, and may be used as the reflection member 631.

Thus, the reflection member 631 is provided in the pixel 51, and thus, infrared light that is incident on the substrate 61 from the incidence surface through the on-chip lens 62, and is transmitted through the substrate 61 without being subjected to the photoelectric conversion in the substrate 61, can be incident again on the substrate 61 by being reflected on the reflection member 631. With this arrangement, the amount of infrared light to be subjected to the photoelectric conversion in the substrate 61, increases, and thus, a quantum efficiency (QE), that is, the sensitivity of the pixel 51 with respect to the infrared light can be improved.

Fifteenth Embodiment

<Configuration Example of Pixel>

Further, a P well region including a P type semiconductor region, may be provided instead of the oxide film 64 in the substrate 61 of the pixel 51.

Figure 29:
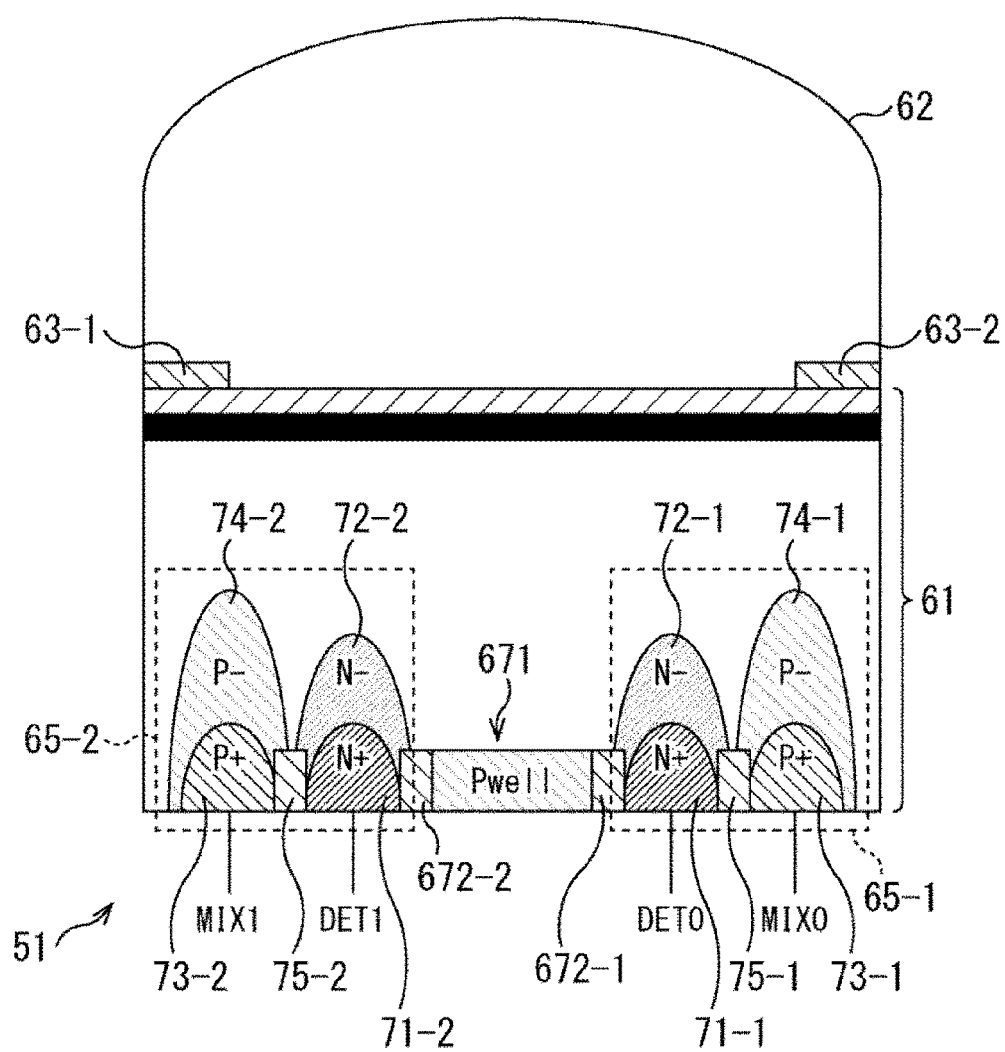
FIG. 29 is a diagram illustrating another configuration example of the pixel.

In such a case, the pixel 51, for example, is configured as illustrated in FIG. 29. Furthermore, in FIG. 29, the same reference numerals will be applied to portions corresponding to those in FIG. 2, and the description thereof will be suitably omitted.

The configuration of the pixel 51 illustrated in FIG. 29, is the same as the configuration of the pixel 51 illustrated in FIG. 2, except that a P well region 671, a separation portion 672-1, and a separation portion 672-2 are provided instead of the oxide film 64.

In an example illustrated in FIG. 29, the P well region 671 including a P type semiconductor region, is formed in the central portion on a surface side opposite to the incidence surface in the substrate 61, that is, in the drawings, on an inner side of a surface on a lower side. In addition, the separation portion 672-1 for separating the P well region 671 from the N+ semiconductor region 71-1, is formed between the P well region 671 and the N+ semiconductor region 71-1, by an oxide film or the like. Similarly, the separation portion 672-2 for separating the P well region 671 from the N+ semiconductor region 71-2, is formed between the P well region 671 and the N+ semiconductor region 71-2, by an oxide film or the like. In the pixel 51 illustrated in FIG. 29, in the drawings, the P− semiconductor region 74 is a region wider than the N− semiconductor region 72, in the upward direction.

Sixteenth Embodiment

<Configuration Example of Pixel>

In addition, a P well region including a P type semiconductor region, may be further provided in addition to the oxide film 64 in the substrate 61 of the pixel 51.

Figure 30:
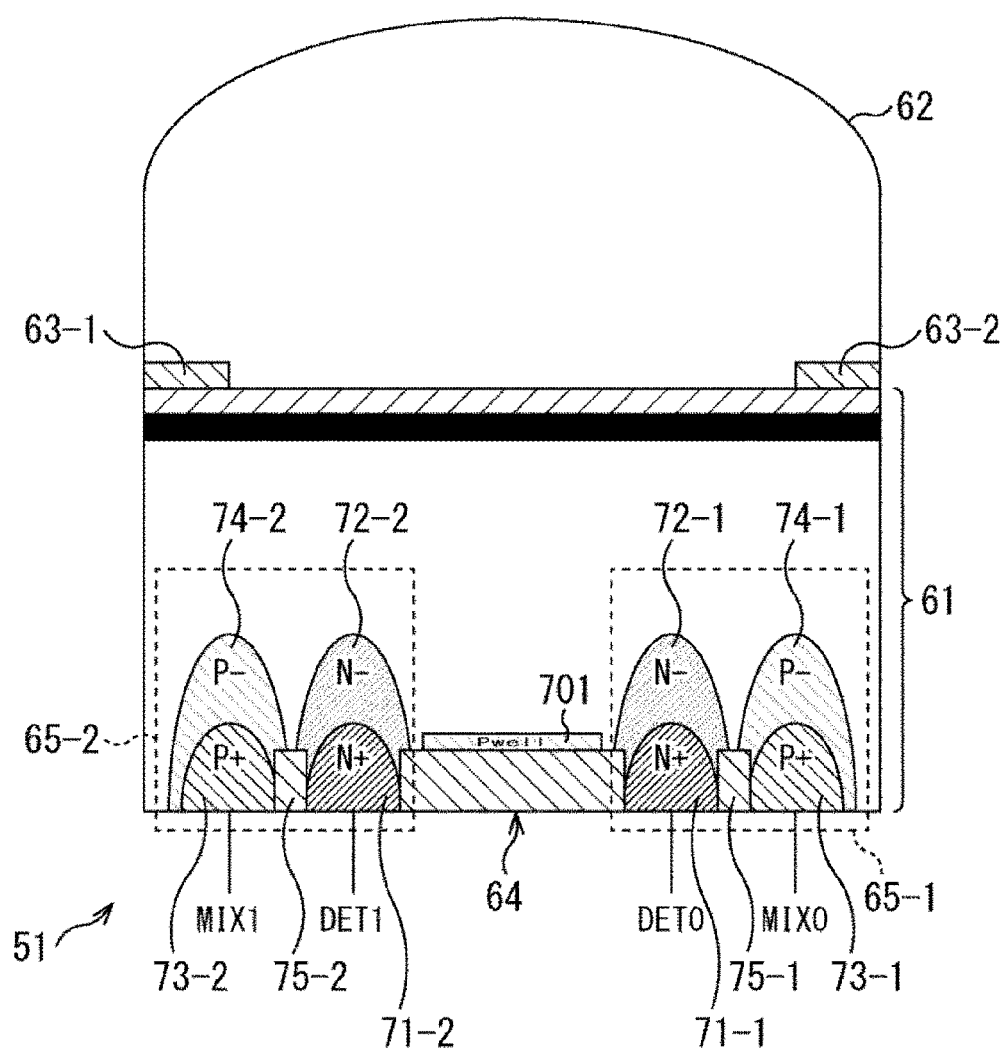
FIG. 30 is a diagram illustrating another configuration example of the pixel.

In such a case, the pixel 51, for example, is configured as illustrated in FIG. 30. Furthermore, in FIG. 30, the same reference numerals will be applied to portions corresponding to those in FIG. 2, and the description thereof will be suitably omitted.

The configuration of the pixel 51 illustrated in FIG. 30, is the same as the configuration of the pixel 51 illustrated in FIG. 2, except that a P well region 701 is newly provided. That is, in an example illustrated in FIG. 30, the P well region 701 including a P type semiconductor region, is formed on an upper side of the oxide film 64 in the substrate 61, in the drawings.

As described above, according to the present technology, the CAPD sensor is configured as the rear surface irradiation type sensor, and thus, it is possible to improve the characteristics such as the pixel sensitivity.

<Equivalent Circuit Configuration Example of Pixel>

Figure 31:
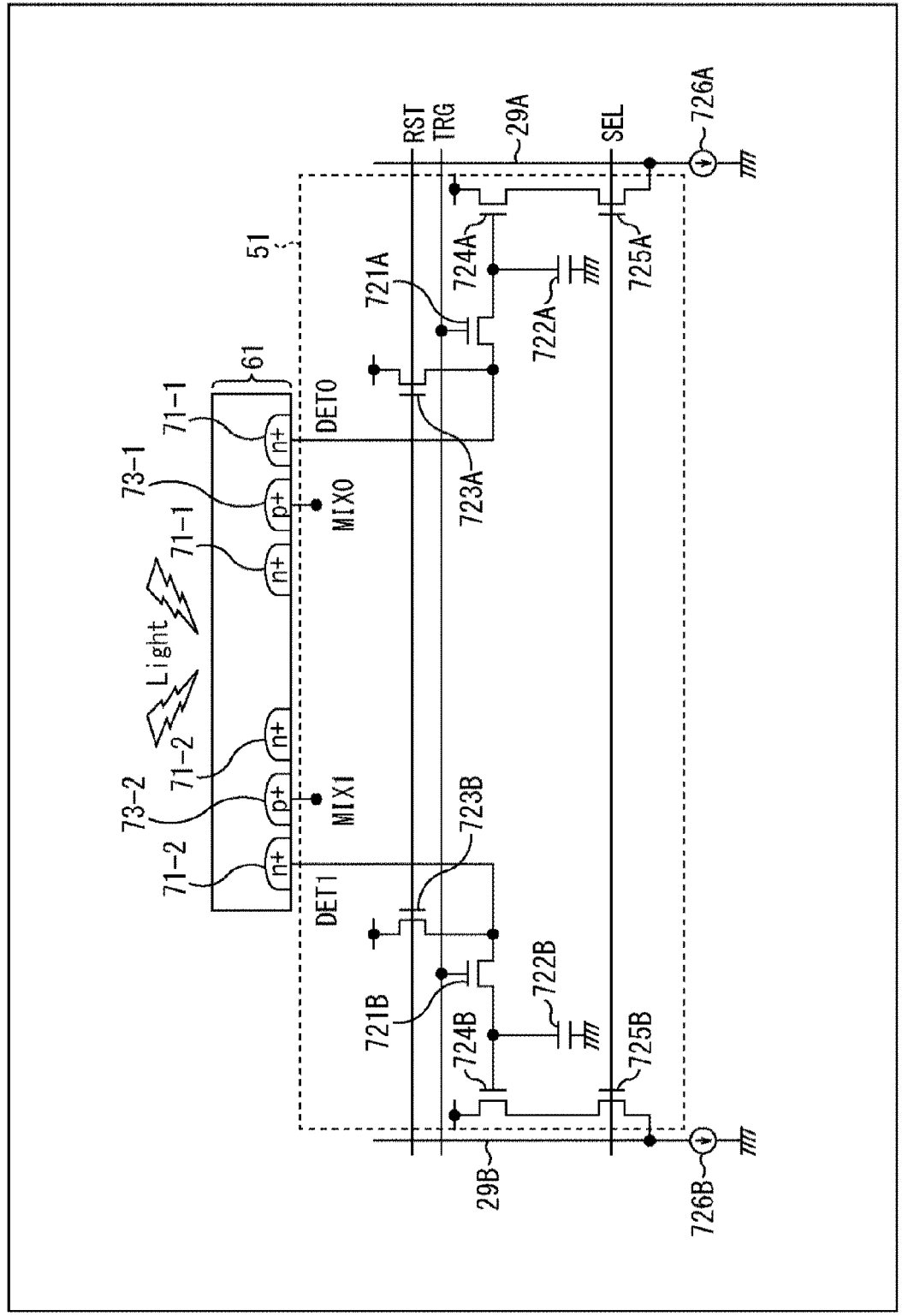
FIG. 31 is a diagram illustrating an equivalent circuit of the pixel.

FIG. 31 illustrates an equivalent circuit of the pixel 51.

The pixel 51 includes a transfer transistor 721A, an FD 722A, a reset transistor 723A, an amplification transistor 724A, and a selection transistor 725A, with respect to the signal extraction unit 65-1 including the N+ semiconductor region 71-1, the P+ semiconductor region 73-1, and the like.

In addition, the pixel 51 includes a transfer transistor 721B, an FD 722B, a reset transistor 723B, an amplification transistor 724B, and a selection transistor 725B, respect to the signal extraction unit 65-2 including the N+ semiconductor region 71-2, the P+ semiconductor region 73-2, and the like.

The vertical driving unit 22 applies a predetermined voltage MIX0 (a first voltage) to the P+ semiconductor region 73-1, and applies a predetermined voltage MIX1 (a second voltage) to the P+ semiconductor region 73-2. In the example described above, one of the voltages MIX0 and MIX1 is 1.5 V, and the other is 0 V. The P+ semiconductor regions 73-1 and 73-2 are a voltage application unit to which the first voltage or the second voltage is applied.

The N+ semiconductor regions 71-1 and 71-2 are a charge detection unit that detects a charge generated by performing the photoelectric conversion with respect to light incident on the substrate 61, and accumulates the charge.

In a case where a driving signal TRG to be supplied to a gate electrode, is in an active state, the transfer transistor 721A is in a conduction state, and thus, transfers the charge accumulated in the N+ semiconductor region 71-1, to the FD 722A. In a case where the driving signal TRG to be supplied to the gate electrode, is in the active state, the transfer transistor 721B is in the conduction state, and thus, transfers the charge accumulated in the N+ semiconductor region 71-2, to the FD 722B.

The FD 722A temporarily retains the charge supplied from the N+ semiconductor region 71-1. The FD 722B temporarily retains the charge supplied from the N+ semiconductor region 71-2. The FD 722A corresponds to the FD portion A described with reference to FIG. 2, and the FD 722B corresponds to the FD portion B.

In a case where the driving signal RST to be supplied to the gate electrode, is in the active state, the reset transistor 723A is in the conduction state, and thus, resets the potential of the FD 722A to a predetermined level (a reset voltage VDD). In a case where the driving signal RST to be supplied to the gate electrode, is in the active state, the reset transistor 723B is in the conduction state, and thus, resets the potential of the FD 722B to the predetermined level (the reset voltage VDD). Furthermore, when the reset transistors 723A and 723B ace in the active state, the transfer transistors 721A and 721B are also in the active state, simultaneously.

In the amplification transistor 724A, a source electrode is connected to a vertical signal line 29A through the selection transistor 725A, and thus, the amplification transistor 724A configures a source follower circuit along with a load MOS of a constant current source circuit portion 726A connected to one end of the vertical signal line 29A. In the amplification transistor 724B, a source electrode is connected to a vertical signal line 29B through the selection transistor 725B, and thus, the amplification transistor 724B configures a source follower circuit along with a load MOS of a constant current source circuit portion 726B connected to one end of the vertical signal line 29B.

The selection transistor 725A is connected between the source electrode of the amplification transistor 724A and the vertical signal line 29A. In a case where the selection signal SEL to be supplied to the gate electrode, is in the active state, the selection transistor 725A is in the conduction state, and outputs a pixel signal output from the amplification transistor 724A, to the vertical signal line 29A.

The selection transistor 725B is connected between the source electrode of the amplification transistor 724B and the vertical signal line 29B. In a case where the selection signal SEL to be supplied to the gate electrode, is in the active state, the selection transistor 725B is in the conduction state, and outputs a pixel signal output from the amplification transistor 724B, to the vertical signal line 29B.

The transfer transistors 721A and 721B, the reset transistors 723A and 723B, the amplification transistors 724A and 724B, and the selection transistors 725A and 725B of the pixel 51, for example, are controlled by the vertical driving unit 22.

<Other Equivalent Circuit Configuration Examples of Pixel>

Figure 32:
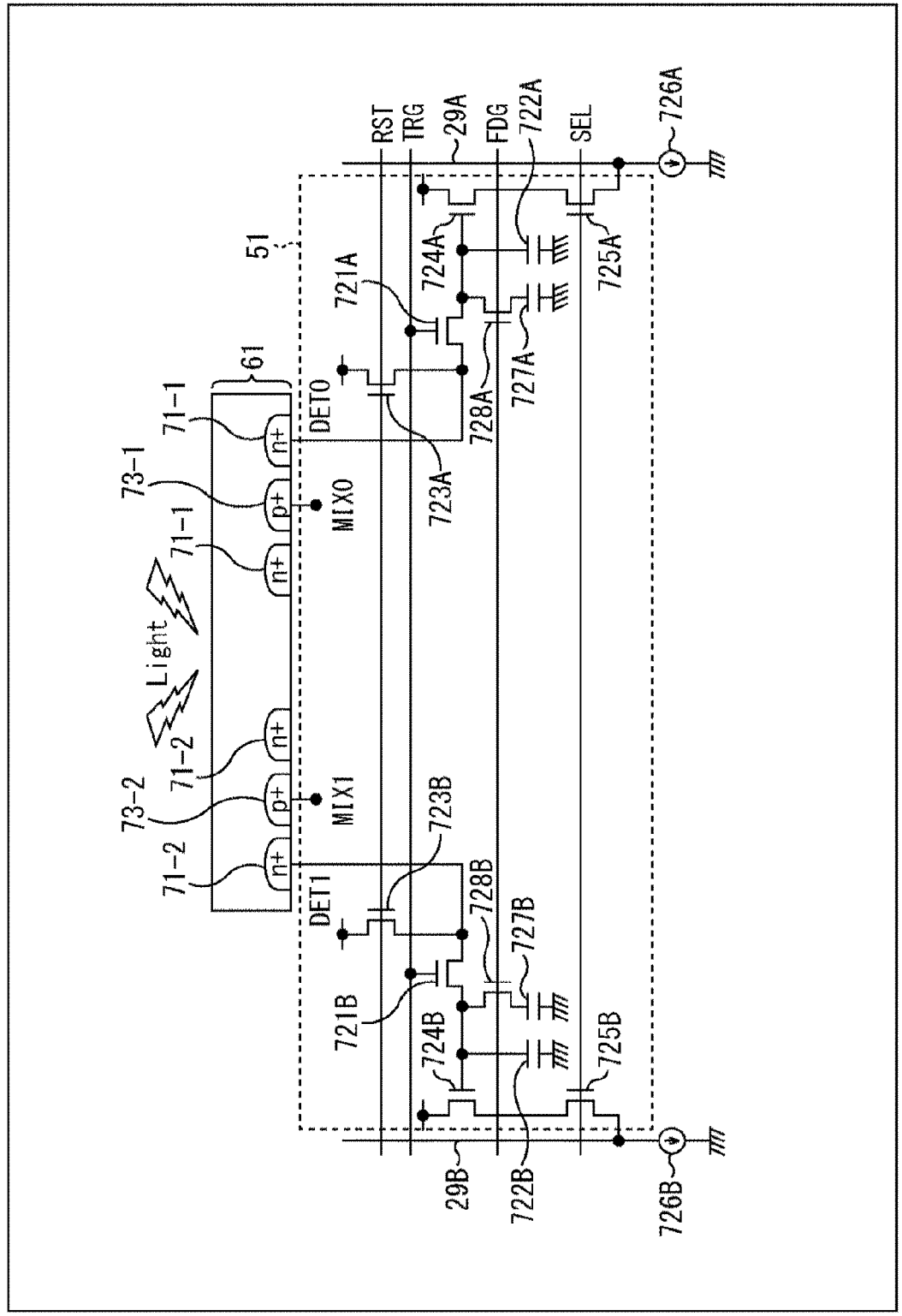
FIG. 32 is a diagram illustrating another equivalent circuit of the pixel.

FIG. 32 illustrates another equivalent circuit of the pixel 51.

In FIG. 32, the same reference numerals will be applied to portions corresponding to those in FIG. 31, and the description thereof will be suitably omitted.

The equivalent circuit in FIG. 32 corresponds to the equivalent circuit in FIG. 31, and an additional capacity 727, and a switching transistor 728 controlling the connection thereof, are added to both of the signal extraction units 65-1 and 65-2.

Specifically, the additional capacity 727A is connected between the transfer transistor 721A and the FD 722A, through a switching transistor 728A, and the additional capacity 727B is connected between the transfer transistor 721B and the FD 722B, through a switching transistor 728B.

In a case where a driving signal FDG to be supplied to the gate electrode, is in the active state, the switching transistor 728A is in the conduction state, and thus, connects the additional capacity 727A to the FD 722A. In a case where the driving signal FDG to be supplied to the gate electrode, is in the active state, the switching transistor 728B is in the conduction state, and thus, connects the additional capacity 727B to the FD 722B.

For example, at a high illuminance with a large amount of incident light, the vertical driving unit 22 sets the switching transistors 728A and 726B in the active state, and connects the FD 722A and the additional capacity 727A together, and connects the FD 722B and the additional capacity 727B together. With this arrangement, more charges can be accumulated at a high illuminance.

On the other hand, at a low illuminance with a small amount of incident light, the vertical driving unit 22 sets the switching transistors 723A and 726B in an inactive state, and disconnects the additional capacities 727A and 727B from the FDs 722A and 722B, respectively.

The additional capacity 727 may be omitted as with the equivalent circuit in FIG. 31, but the additional capacity 727 is provided, and is differently used according to the amount of incident light, and thus, it is possible to ensure a high dynamic range.

<Arrangement Example of Voltage Supply Line>

Next, the arrangement of the voltage supply line for applying the predetermined voltage MIX0 or MIX1 to the P+ semiconductor regions 73-1 and 73-2 that are the voltage application unit of the signal extraction unit 65 of each of the pixels 51, will be described with reference to FIG. 33 to FIG. 35.

Figure 34:
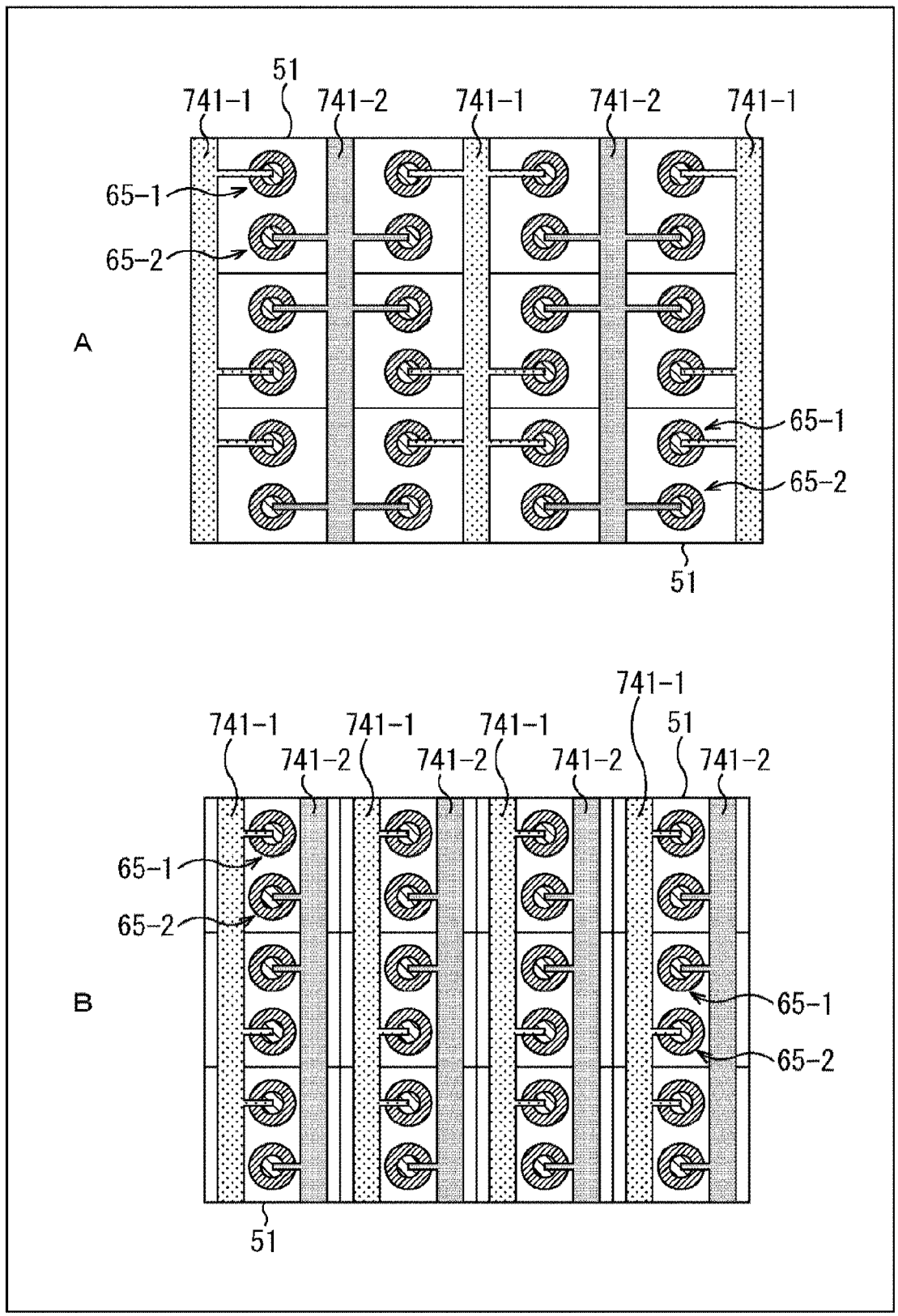
FIG. 34 is a diagram illustrating arrangement example of a voltage supply line to which Mirror arrangement is adopted.

Furthermore, in FIG. 33 and FIG. 34, a circular configuration illustrated in FIG. 9 will be adopted and described as the configuration of the signal extraction unit 65 of each of the pixels 51, but it is obvious that other configurations may be adopted.

A of FIG. 33 is a plan view illustrating a first arrangement example of the voltage supply line.

In the first arrangement example, a voltage supply line 741-1 or 741-2 is wired along the vertical direction, (on the boundary) between two pixels adjacent in the horizontal direction, with respect to a plurality of pixels 51 two-dimensionally arranged into the shape of a matrix.

The voltage supply line 741-1 is connected to the P+ semiconductor region 73-1 of the signal extraction unit 65-1 that is one of two signal extraction units 65 in the pixel 51. The voltage supply line 741-2 is connected to the P+ semiconductor region 73-2 of the signal extraction unit 65-2 that is the other of two signal extraction units 65 in the pixel 51.

In the first arrangement example, two voltage supply lines 741-1 and 741-2 are arranged with respect to two columns of pixels, and thus, in the pixel array portion 21, the number of voltage supply lines 741 to be arrayed, is approximately identical to the number of columns of the pixels 51.

B of FIG. 33 is a plan view illustrating a second arrangement example of the voltage supply line.

In the second arrangement example, two voltage supply lines 741-1 and 741-2 are wired along the vertical direction, with respect to one pixel column of a plurality of pixels 51 two-dimensionally arranged into the shape of a matrix.

The voltage supply line 741-1 is connected to the P+ semiconductor region 73-1 of the signal extraction unit 65-1 that is one of two signal extraction units 65 in the pixel 51. The voltage supply line 741-2 is connected to the P+ semiconductor region 73-2 of the signal extraction unit 65-2 that is the other of two signal extraction units 65 in the pixel 51.

In the second arrangement example, two voltage supply lines 741-1 and 741-2 are wired with respect to one pixel column, and thus, four voltage supply lines 741 are arranged with respect to two columns of pixels. In the pixel array portion 21, the number of voltage supply lines 741 to be arrayed, is approximately twice the number of columns of the pixels 51.

Both of the arrangement examples of A and B of FIG. 33, are the Periodic arrangement in which a configuration of connecting the voltage supply line 741-1 to the P+ semiconductor region 73-1 of the signal extraction unit 65-1, and of connecting the voltage supply line 741-2 to the P+ semiconductor region 73-2 of the signal extraction unit 65-2, is periodically repeated with respect to the pixels arranged in vertical direction.

In the first arrangement example of A of FIG. 33, it is possible to decrease the number of voltage supply lines 741-1 and 741-2 to be wired with respect to the pixel array portion 21.

In the second arrangement example of B of FIG. 33, the number of voltage supply lines 741-1 and 741-2 to be wired, increases, compared to the first arrangement example, but the number of signal extraction units 65 to be connected to one voltage supply line 741, becomes ½, and thus, it is possible to reduce the load of the wiring, and the second arrangement example is effective at high speed driving or when the total number of pixels of the pixel array portion 21 is large.

A of FIG. 34 is a plan view illustrating a third arrangement example of the voltage supply line.

The third arrangement example is an example in which two voltage supply lines 741-1 and 741-2 are arranged with respect to two columns of pixels, as with the first arrangement example of A of FIG. 33.

The third arrangement example is different from the first arrangement example of A of FIG. 33, in that connection destinations of the signal extraction units 65-1 and 65-2 are different in two pixels arranged in the vertical direction.

Specifically, for example, in a certain pixel 51, the voltage supply line 741-1 is connected to the P+ semiconductor region 73-1 of the signal extraction unit 65-1, and the voltage supply line 741-2 is connected to the P+ semiconductor region 73-2 of the signal extraction unit 65-2, and in the pixels 51 above and below the certain pixel 51, the voltage supply line 741-1 is connected to the P+ semiconductor region 73-2 of the signal extraction unit 65-2, and the voltage supply line 741-2 is connected to the P+ semiconductor region 73-1 of the signal extraction unit 65-1.

B of FIG. 34 is a plan view illustrating a fourth arrangement example of the voltage supply line.

The fourth arrangement example is an example in which two voltage supply lines 741-1 and 741-2 are arranged with respect to two columns of pixels, as with the second arrangement example of B of FIG. 33.

The fourth arrangement example is different from the second arrangement example of B of FIG. 33, in that the connection destinations of the signal extraction units 65-1 and 65-2 are different in two pixels arranged in the vertical direction.

Specifically, for example, in a certain pixel 51, the voltage supply line 741-1 is connected to the P+ semiconductor region 73-1 of the signal extraction unit 65-1, and the voltage supply line 741-2 is connected to the P+ semiconductor region 73-2 of the signal extraction unit 65-2, and in the pixels 51 above and below the certain pixel 51, the voltage supply line 741-1 is connected to the P+ semiconductor region 73-2 of the signal extraction unit 65-2, and the voltage supply line 741-2 is connected to the P+ semiconductor region 73-1 of the signal extraction unit 65-1.

In the third arrangement example of A of FIG. 34, it is possible to decrease the number of voltage supply lines 741-1 and 741-2 to be wired with respect to the pixel array portion 21.

In the fourth arrangement example of B of FIG. 34, the number of voltage supply lines 741-1 and 741-2 to be wired, increases, compared to the third arrangement example, but the number of signal extraction units 65 to be connected to one voltage supply line 741, becomes ½, and thus, it is possible to reduce the load of the wiring, and the fourth arrangement example is effective at high speed driving or when the total number of pixels of the pixel array portion 21 is large.

Both of the arrangement examples of A and B of FIG. 34, are the Mirror arrangement in which the connection destinations of two pixels adjacent up and down (in the vertical direction) are mirror-inverted.

Figure 35:
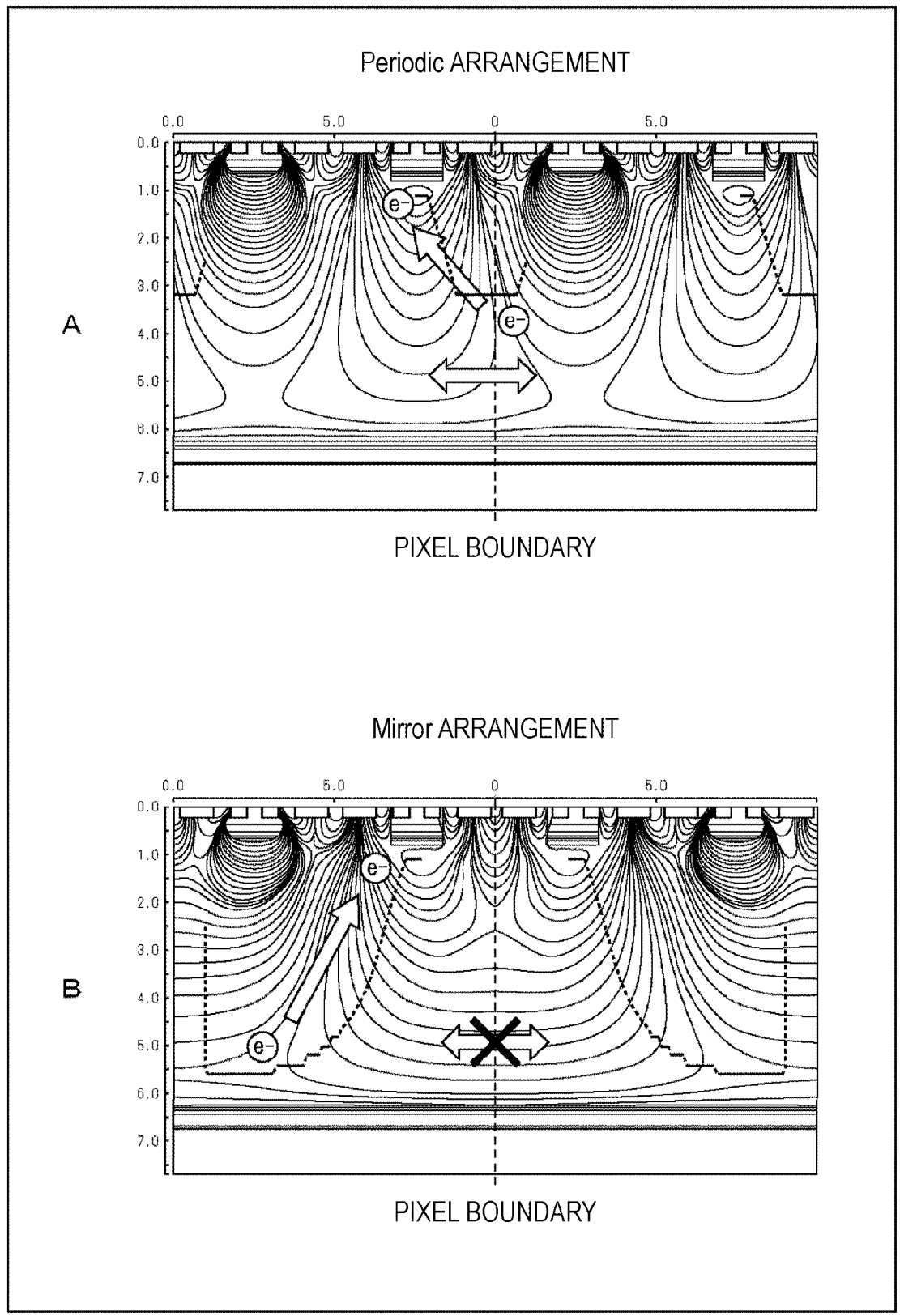
FIG. 35 is a diagram illustrating characteristics of the Periodic arrangement and the Mirror arrangement.

As illustrated in A of FIG. 35, in the Periodic arrangement, voltages to be applied to two adjacent signal extraction units 65 interposing a pixel boundary, are different voltages, and thus, a charge exchange between the adjacent pixels occurs. For this reason, a transfer efficiency of the charge is more excellent in the Periodic arrangement than in the Mirror arrangement, but color mixture characteristics of the adjacent pixels are worse in the Periodic arrangement than in the Mirror arrangement.

On the other hand, as illustrated in B of FIG. 35, in the Mirror arrangement, the voltages to be applied to two adjacent signal extraction units 65 interposing the pixel boundary, are the same voltage, and thus, the charge exchange between the adjacent pixels is suppressed. For this reason, the transfer efficiency of the charge is worse in the Mirror arrangement than in the Periodic arrangement, the color mixture characteristics of the adjacent pixels are more excellent in the Mirror arrangement than in the Periodic arrangement.

Sectional Configuration of Plurality of Pixels of Fourteenth Embodiment

In a sectional configuration of the pixel illustrated in FIG. 2 or the like, one of the N+ semiconductor region 71-1 and the N− semiconductor region 72-1 surrounding the P+ semiconductor region 73-1 and the P− semiconductor region 74-1, around the semiconductor region 73-1 and the P− semiconductor region 74-1, is not illustrated. In addition, the multi-layer wiring layer formed on the surface of the substrate 61 on a side opposite to the incidence surface, is not also illustrated.

Therefore, hereinafter, in several embodiments described above, sectional views of a plurality of adjacent pixels, in which the N+ semiconductor region 71-1 and the N− semiconductor region 72-1 around the P+ semiconductor region 73-1 and the P− semiconductor region 74-1, or the multi-layer wiring layer are not omitted, are illustrated.

Figure 36:
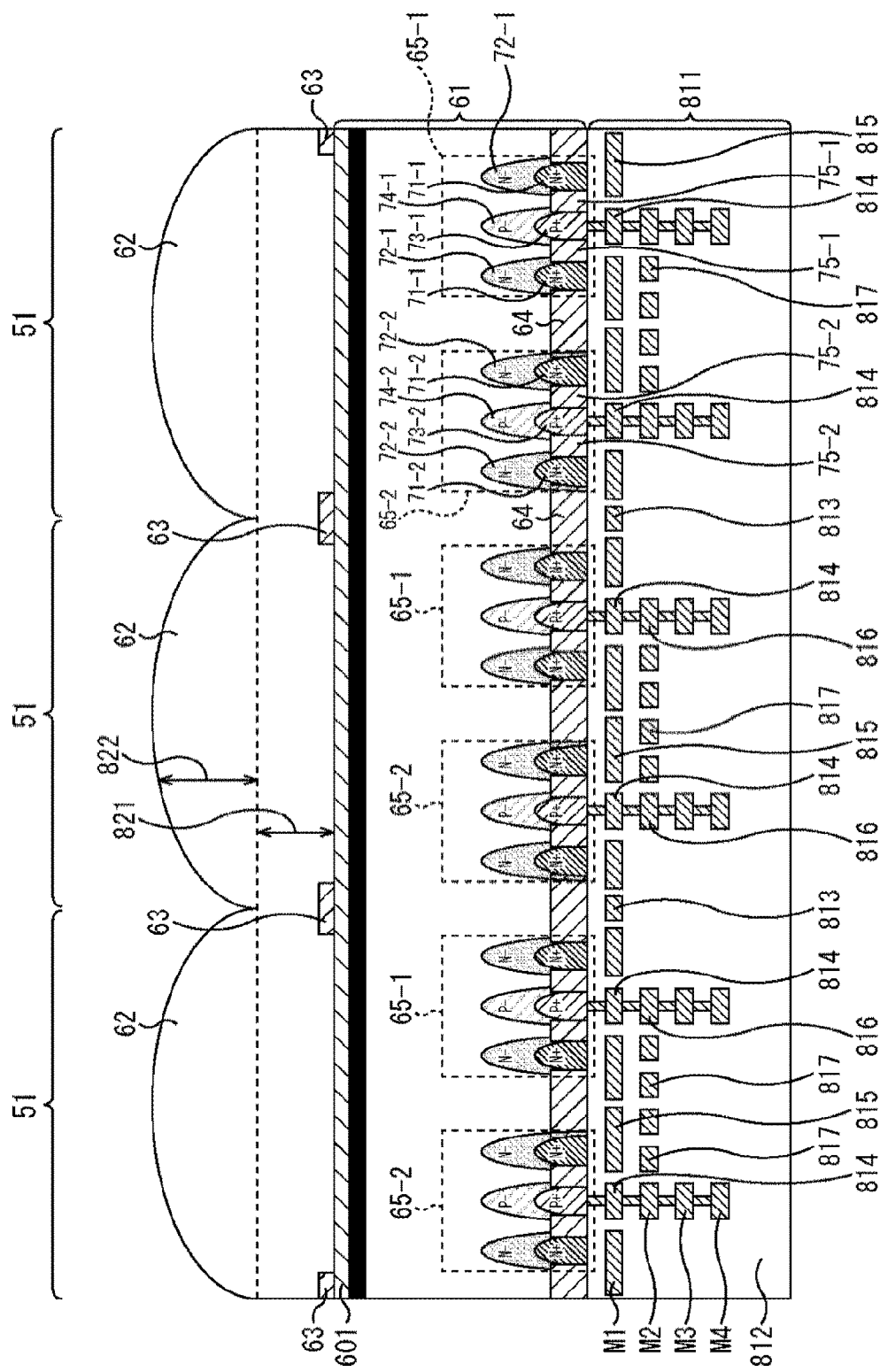
FIG. 36 is a sectional view of a plurality of pixels in a fourteenth embodiment.
Figure 37:
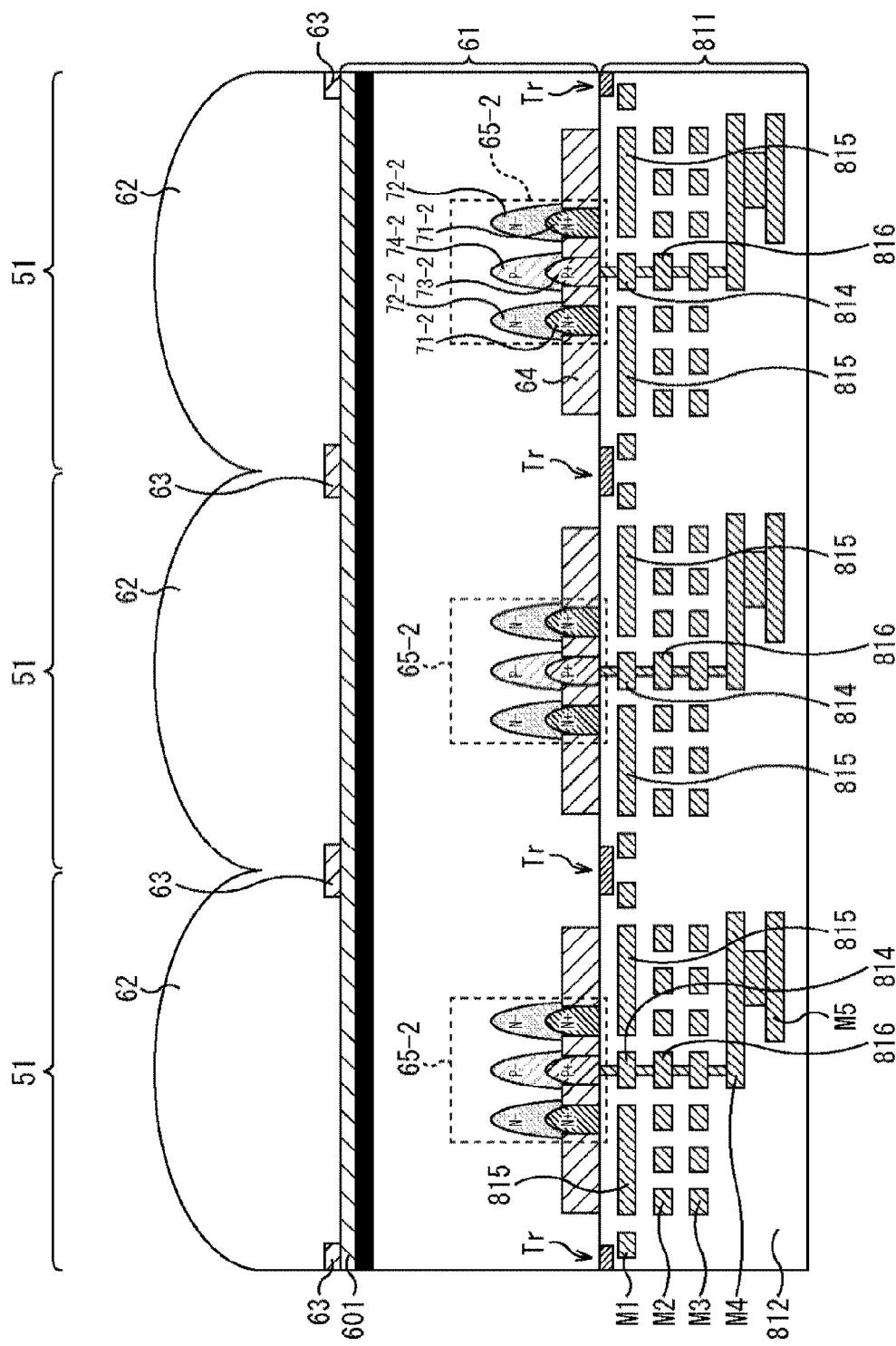
FIG. 37 is a sectional view of the plurality of pixels in the fourteenth embodiment.

First, FIG. 36 and FIG. 37 illustrate sectional views of a plurality of pixels of the fourteenth embodiment illustrated in FIG. 28.

The fourteenth embodiment illustrated in FIG. 28, is the configuration of the pixel including the reflection member 631 having a large area, on a side opposite to the incidence surface of the substrate 61.

FIG. 36 corresponds to the sectional view of line B-B' in FIG. 11, and FIG. 37 corresponds to the sectional view of line A-A' in FIG. 11. In addition, the sectional view of line C-C' in FIG. 17, can also be illustrated as in FIG. 36.

As illustrated in FIG. 36, in each of the pixels 51, the oxide film 64 is formed in the center portion, and the signal extraction unit 65-1 and the signal extraction unit 65-2 are formed on both sides of the oxide film 64, respectively.

In the signal extraction unit 65-1, the N+ semiconductor region 71-1 and the N− semiconductor region 72-1 are formed to surround the P+ semiconductor region 73-1 and the P− semiconductor region 74-1, around the P+ semiconductor region 73-1 and the P− semiconductor region 74-1. The P+ semiconductor region 73-1 and the N+ semiconductor region 71-1 are in contact with a multi-layer wiring layer 811. The P− semiconductor region 74-1 is arranged on an upper side of the P+ semiconductor region 73-1 (on the on-chip lens 62 side) to cover the P+ semiconductor region 73-1, and the N− semiconductor region 72-1 is arranged on an upper side of the N+ semiconductor region 71-1 (on the on-chip lens 62 side) to cover the N+ semiconductor region 71-1. In other words, the P+ semiconductor region 73-1 and the N+ semiconductor region 71-1 are arranged on the multi-layer wiring layer 811 side in the substrate 61, and the N− semiconductor region 72-1 and the P− semiconductor region 74-1 are arranged on the on-chip lens 62 side in the substrate 61. In addition, a separation portion 75-1 for separating the N+ semiconductor region 71-1 from the P+ semiconductor region 73-1, is formed between the N+ semiconductor region 71-1 and the P+ semiconductor region 73-1, by an oxide film or the like.

In the signal extraction unit 65-2, the N+ semiconductor region 71-2 and the N− semiconductor region 72-2 are formed to surround the P+ semiconductor region 73-2 and the P− semiconductor region 74-2, around the P+ semiconductor region 73-2 and the P− semiconductor region 74-2. The P+ semiconductor region 73-2 and the N+ semiconductor region 71-2 are in contact with the multi-layer wiring layer 811. The P− semiconductor region 74-2 is arranged on an upper side of the P+ semiconductor region 73-2 (on the on-chip lens 62 side) to cover the P+ semiconductor region 73-2, and the N− semiconductor region 72-2 is arranged on an upper side of the N+ semiconductor region 71-2 (on the on-chip lens 62 side) to cover the N+ semiconductor region 71-2. In other words, the P+ semiconductor region 73-2 and the N+ semiconductor region 71-2 are arranged on the multi-layer wiring layer 811 side in the substrate 61, and the N− semiconductor region 72-2 and the P− semiconductor region 74-2 are arranged on the on-chip lens 62 side in the substrate 61. In addition, the separation portion 75-2 for separating the N+ semiconductor region 71-2 from the P+ semiconductor region 73-2, is formed between the N+ semiconductor region 71-2 and the P+ semiconductor region 73-2, by an oxide film or the like.

The oxide film 64 is also formed between the N+ semiconductor region 71-1 of the signal extraction unit 65-1 of a predetermined pixel 51 and the semiconductor region 71-2 of the signal extraction unit 65-2 of the pixel 51 adjacent to the predetermined pixel 51, that is a boundary region between the adjacent pixels 51.

A film having a positive fixed charge is laminated, and thus, the P+ semiconductor region 601 covering the entire light incidence surface is formed on a boundary surface on the light incidence surface side of the substrate 61 (on an upper surface in FIG. 36 and FIG. 37).

As illustrated in FIG. 36, in a case where the on-chip lens 62 formed on the light incidence surface side of the substrate 61 in each of the pixels, is divided into a leveling portion 821 of which the thickness is evenly leveled in the entire region in the pixel, and a curve portion 222 of which the thickness is different according to a posit ion in the pixel, in a height direction, the thickness of the leveling portion 821 is formed to be less than the thickness of the curve portion 822. As the thickness of the leveling portion 821 becomes thinner, oblique incident light is easily reflected on the inter-pixel light shielding unit 63, and thus, the thickness of the leveling portion 821 formed to be thin, and therefore, it is also possible to incorporate the oblique incident light in the substrate 61. In addition, as the thickness of the curve portion 822 becomes thicker, it is possible to condense the incident light into the pixel center.

The multi-layer wiring layer 811 is formed on the surface of the substrate 61 on a side opposite to the light incidence surface side on which the on-chip lens 62 is formed in each of the pixels. In other words, the substrate 61 that is a semiconductor layer, is arranged between the on-chip lens 62 and the multi-layer wiring layer 811. The multi-layer wiring layer 811 includes five layers of metal films M1 to M5, and an interlayer insulating film 812 therebetween. Furthermore, in FIG. 36, in five layers of metal films M1 to M5 of the multi-layer wiring layer 811, the metal film M5 on the outermost side, is in a position that is not seen, and thus, is not illustrated, but is illustrated in FIG. 37 that is a sectional view in a direction different from that of the sectional view of FIG. 36.

As illustrated in FIG. 37, a pixel transistor Tr is formed in a pixel boundary region of a boundary surface portion of the multi-layer wiring layer 811 with respect to the substrate 61. The pixel transistor Tr is any one of the transfer transistor 721, the reset transistor 723, the amplification transistor 724, and the selection transistor 725, illustrated in FIG. 31 and FIG. 32.

In five layers of the metal films M1 to M5 of the multi-layer wiring layer 811, the metal film M1 closest to the substrate 61 includes a power line 813 for supplying a power-supply voltage, voltage application wiring 814 for supplying a predetermined voltage to the P+ semiconductor region 73-1 or 73-2, and a reflection member 815 that is a member reflecting the incident light. In the metal film M1 in FIG. 36, wirings other than the power line 813 and the voltage application wiring 814, are illustrated as the reflection member 815, but in order to prevent the drawings from being complicated, some reference numerals are omitted. The reflection member 815 is dummy wiring provided in order to reflect the incident light, and corresponds to the reflection member 631 illustrated in FIG. 28. In plan view, the reflection member 815 is arranged on a lower side of the N+ semiconductor regions 71-1 and 71-2 to overlap with the N+ semiconductor regions 71-1 and 71-2 that are the charge detection unit. In addition, in the metal film M1, the charge accumulated in the N+ semiconductor region 71, is transferred to the FD 722, and thus, charge extraction wiring (not illustrated in FIG. 36) connecting the N+ semiconductor region 71 and the transfer transistor 721 together, is also formed.

Furthermore, in this example, the reflection member 815 (the reflection member 631) and the charge extraction wiring are arranged on the same layer of the metal film M1, but are not necessarily limited to be arranged on the same layer.

In the metal film M2 of the second layer from the substrate 61 side, for example, voltage application wiring 816 that is connected to the voltage application wiring 814 of the metal film M1, a control line 817 that transmits a driving signal TRG, a driving signal RST, a selection signal SEL, a driving signal FDG, and the like, a ground line, and the like are formed. In addition, in the metal film M2, the FD 722B or the additional capacity 727A is formed.

In the metal film M3 of the third layer from the substrate 61 side, for example, the vertical signal line 29, shielding wiring, or the like is formed.

In the metal films M4 and M5 of the fourth layer and the fifth layer from the substrate 61 side, for example, voltage supply lines 741-1 and 741-2 (FIG. 33 and FIG. 34) for applying the predetermined voltage MIX0 or MIX1 to the P+ semiconductor regions 73-1 and 73-2 that are the voltage application unit of the signal extraction unit 65, are formed.

Furthermore, plane arrangement of five layers of the metal films M1 to M5 of the multi-layer wiring layer 811, will be described later, with reference to FIG. 42 and FIG. 43.

Sectional Configuration of Plurality of Pixels of Ninth Embodiment

Figure 38:
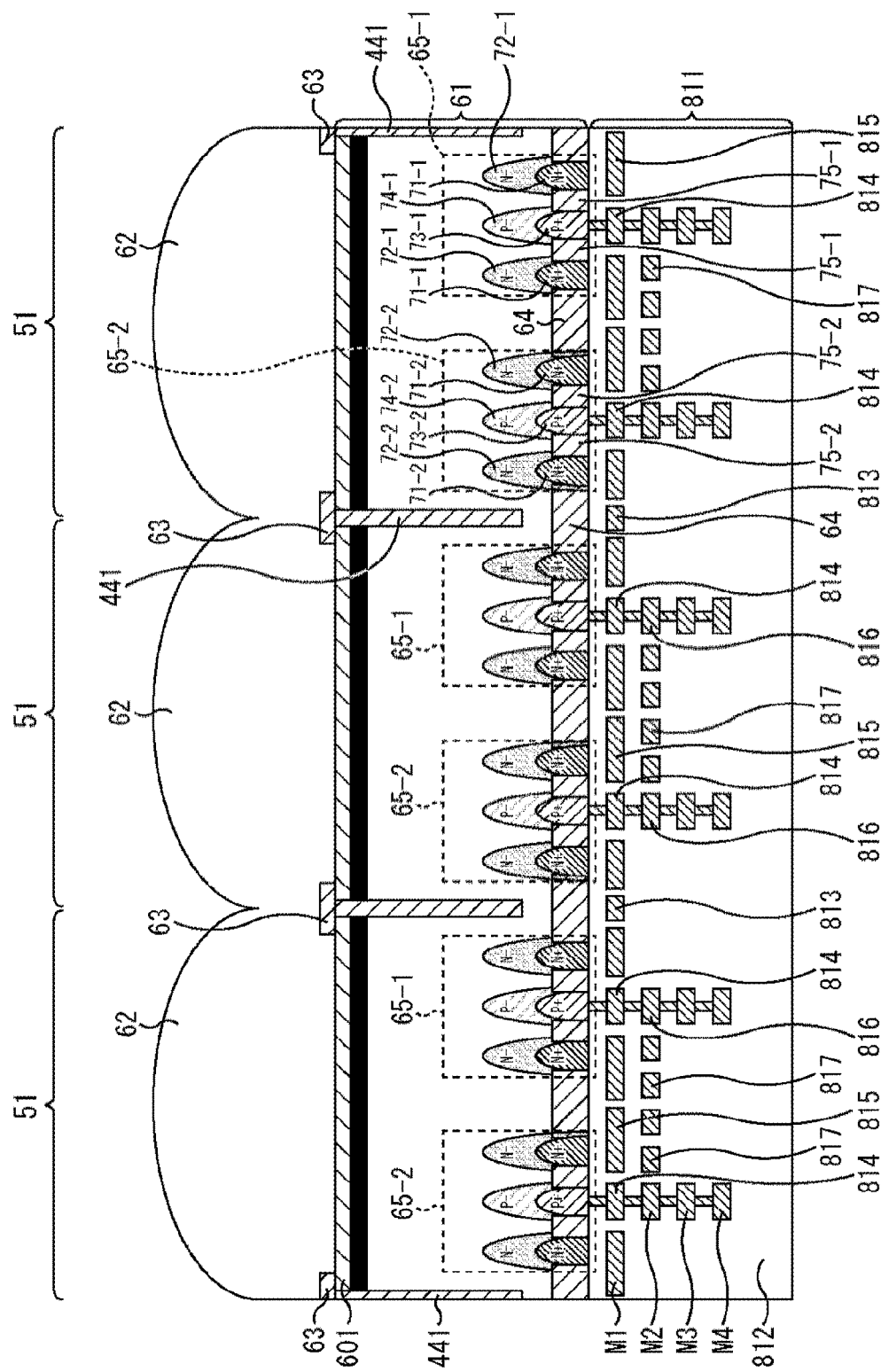
FIG. 38 is a sectional view of a plurality of pixels in a ninth embodiment.

FIG. 38 is a sectional view illustrating the pixel structure of the ninth embodiment illustrated in FIG. 22 with respect to a plurality of pixels, in which the N+ semiconductor region 71-1 and the N− semiconductor region 72-1, or the multi-layer wiring layer are not omitted.

The ninth embodiment illustrated in FIG. 22, is the configuration of the pixel including the separation region 441 on the pixel boundary in the substrate 61, in which the elongated groove (trench) is formed from the rear surface (the incidence surface) side of the substrate 61 to a predetermined depth, and the light shielding film is embedded in the groove.

The other configuration including the signal extraction units 65-1 and 65-2, five layers of the metal films M1 to M5 of the multi-layer wiring layer 811, and the like, is similar to the configuration illustrated in FIG. 36.

Figure 39:
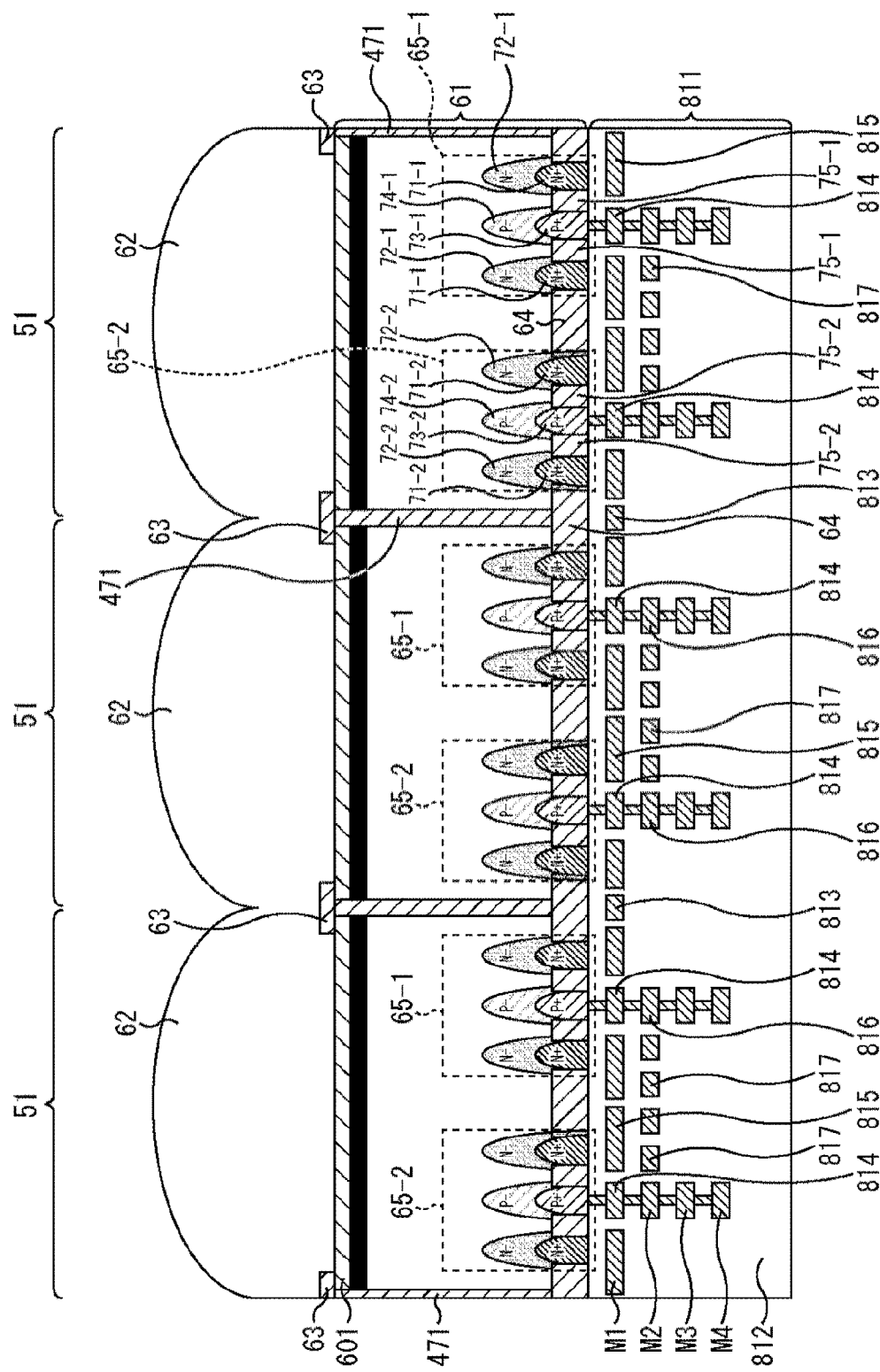
FIG. 39 is a sectional view of a plurality of pixels in Modification Example 1 of the ninth embodiment.

Sectional Configuration of Plurality of Pixels of Modification Example 1 of Ninth Embodiment FIG. 39 is a sectional view illustrating the pixel structure of Modification Example 1 of the ninth embodiment, illustrated in FIG. 23, with respect to a plurality of pixels, in which the N+ semiconductor region 71-1 and the N− semiconductor region 72-1, or the multi-layer wiring layer are not omitted.

Modification Example 1 of the ninth embodiment, illustrated in FIG. 23, is the configuration of the pixel including the separation region 471 penetrating through the entire substrate 61, on the pixel boundary in the substrate 61.

The other configuration including the signal extraction units 65-1 and 65-2, five layers of the metal films M1 to M5 of the multi-layer wiring layer 811, and the like, is similar to the configuration illustrated in FIG. 36.

Sectional Configuration of Plurality of Pixels of Fifteenth Embodiment

Figure 40:
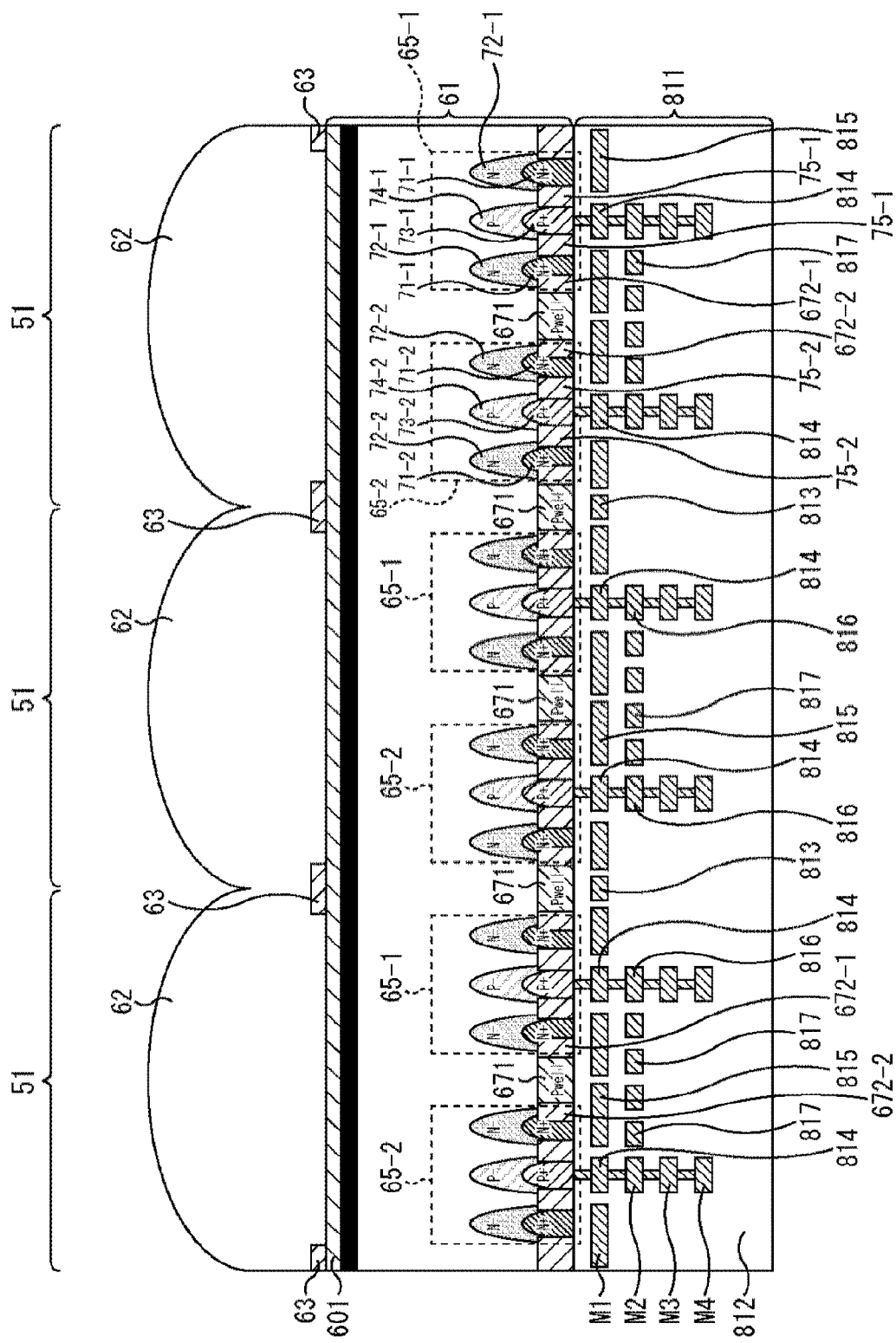
FIG. 40 is a sectional view of a plurality of pixels in a fifteenth embodiment.

FIG. 40 is a sectional view illustrating the pixel structure of the fifteenth embodiment illustrated in FIG. 29, with respect to a plurality of pixels, in which the N+ semiconductor region 71-1 and the N− semiconductor region 72-1, or the multi-layer wiring layer are not omitted.

The fifteenth embodiment illustrated in FIG. 29, is a configuration including the P well region 671 in the central portion on the surface of the substrate 61 on a side opposite to the incidence surface, that is, in the drawings, on an inner side of a surface on a lower side. In addition, the separation portion 672-1 is formed between the P well region 671 and the N+ semiconductor region 71-1, by an oxide film or the like. Similarly, the separation portion 672-2 is formed between the P well region 671 and the N+ semiconductor region 71-2, by an oxide film or the like. The P well region 671 is also formed on the pixel boundary of the surface of the substrate 61 on a lower side.

The other configuration including the signal extraction units 65-1 and 65-2, five layers of the metal films M1 to M5 of the multi-layer wiring layer 811, and the like, is similar to the configuration illustrated in FIG. 36.

Sectional Configuration of Plurality of Pixels of Tenth Embodiment

Figure 41:
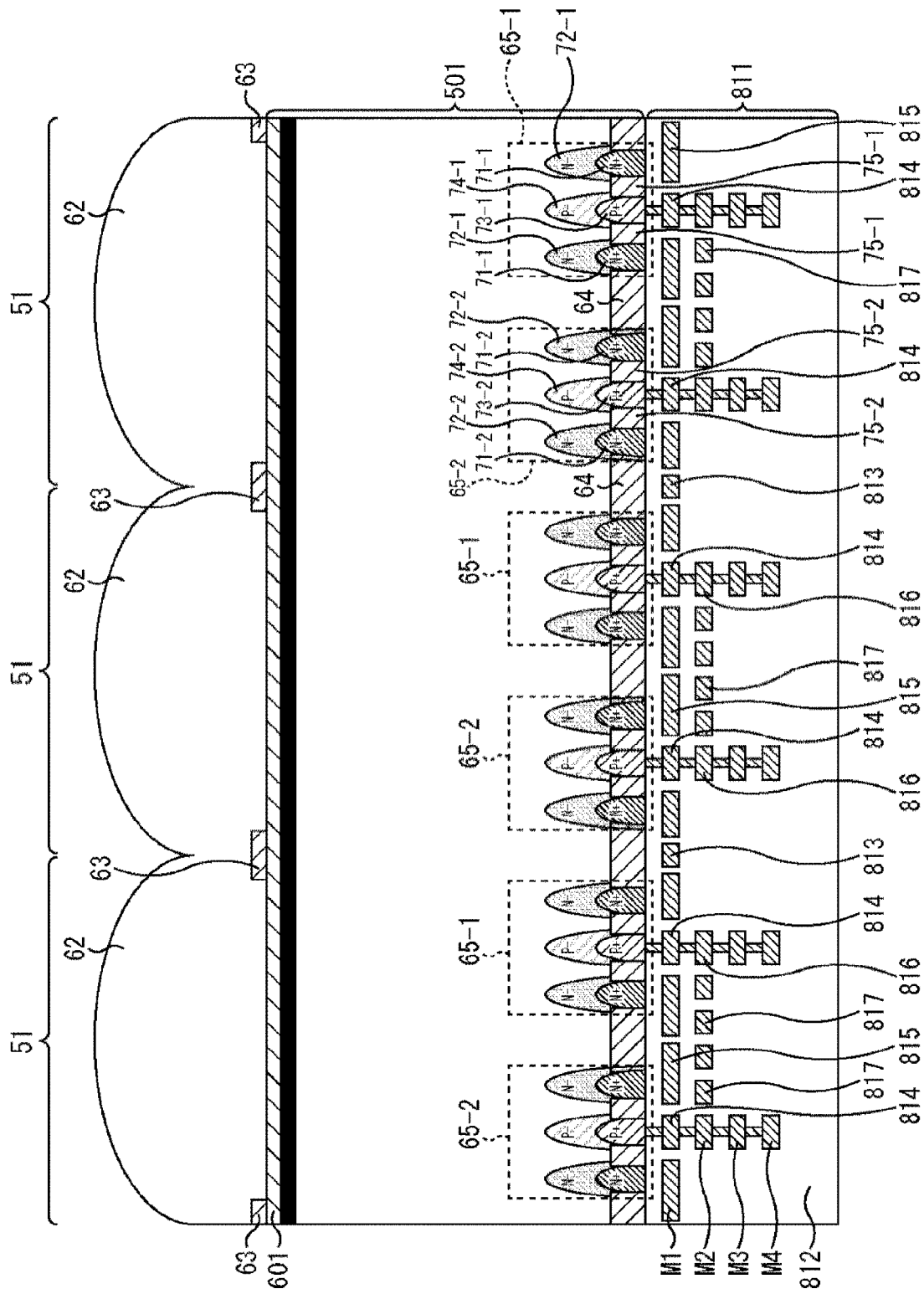
FIG. 41 is a sectional view of a plurality of pixels in a tenth embodiment.

FIG. 41 is a sectional view illustrating the pixel structure of the tenth embodiment illustrated in FIG. 24, with respect to a plurality of pixels, in which the N+ semiconductor region 71-1 and the N− semiconductor region 72-1, or the multi-layer wiring layer are not omitted.

The tenth embodiment illustrated in FIG. 24, is the configuration of the pixel, in which the substrate 501 having a large substrate thickness, is provided instead of the substrate 61.

The other configuration including the signal extraction units 65-1 and 65-2, five layers of the metal films M1 to M5 of the multi-layer wiring layer 811, and the like, is similar to the configuration illustrated in FIG. 36.

<Plane Arrangement Example of Five Layers of Metal Films M1 To M5>

Next, a plane arrangement example of five layers of the metal films M1 to M5 of the multi-layer wiring layer 811, illustrated in FIG. 36 to FIG. 41, will be described with reference to FIG. 42 and FIG. 43.

Figure 42:
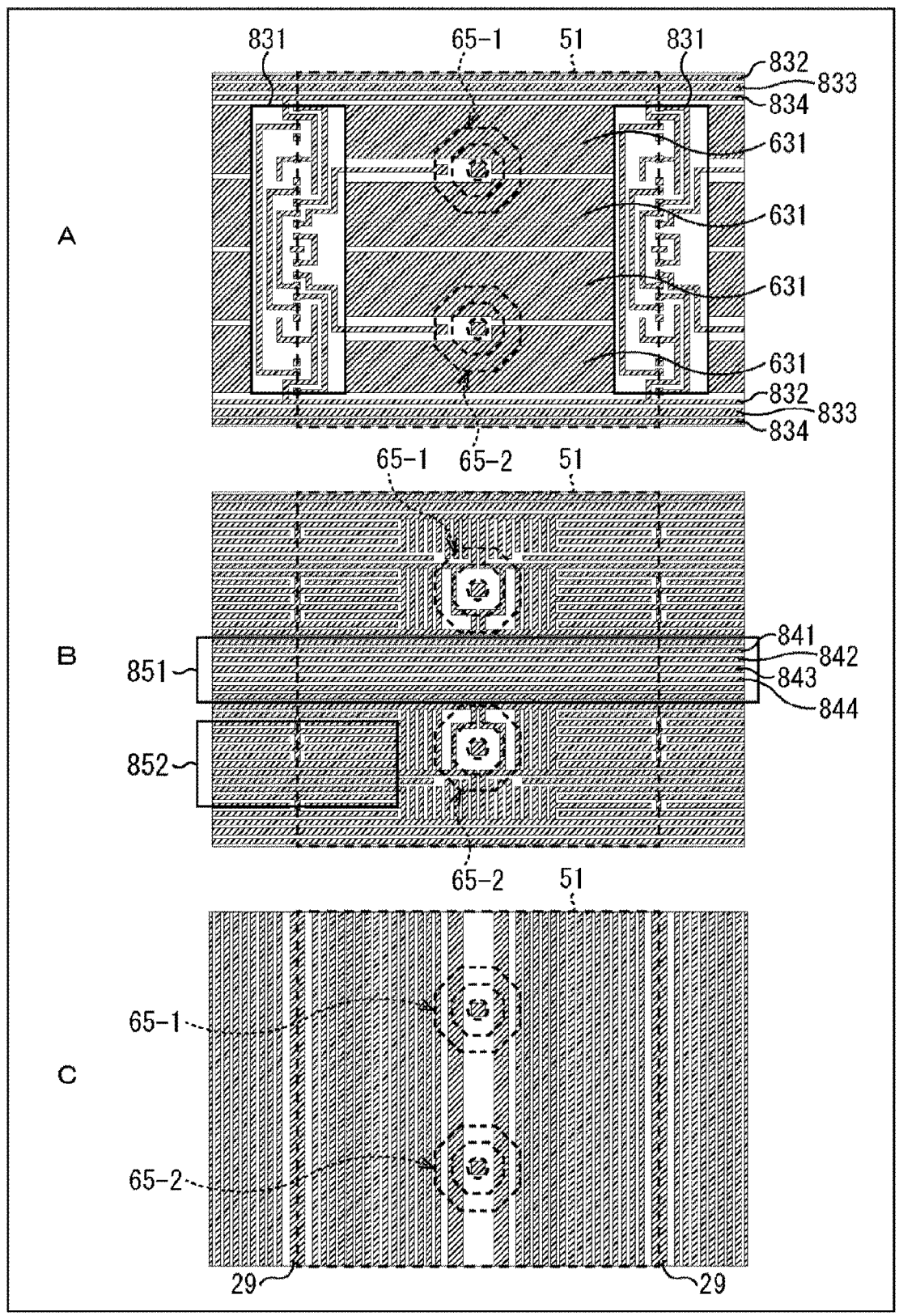
FIG. 42 is a diagram illustrating a metal film of five layers of a multi-layer wiring layer.

A of FIG. 42 illustrates a plane arrangement example of the metal film M1 that is the first layer, in five layers of the metal films M1 to M5 of the multi-layer wiring layer 811.

B of FIG. 42 illustrates a plane arrangement example of the metal film M2 that is the second layer, in five layers of the metal films M1 to M5 of the multi-layer wiring layer 811.

C of FIG. 42 illustrates a plane arrangement example of the metal film M3 that is the third layer, in five layers of the metal films M1 to M5 of the multi-layer wiring layer 811.

Figure 43:
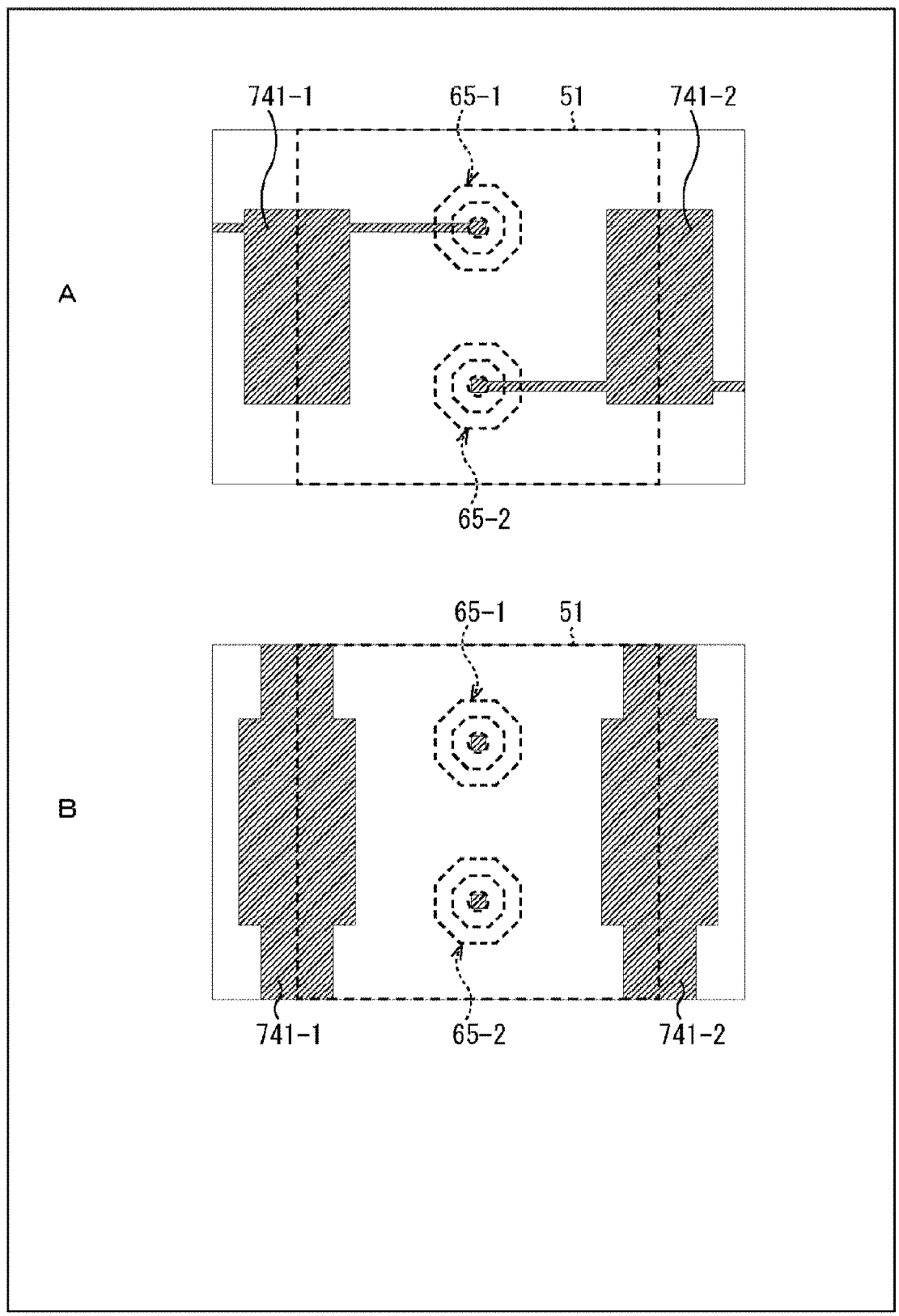
FIG. 43 is a diagram illustrating the metal film of the five layers of the multi-layer wiring layer.

A of FIG. 43 illustrates a plane arrangement example of the metal film M4 that is the fourth layer, in five layers of the metal films M1 to M5 of the multi-layer wiring layer 811.

B in FIG. 43 illustrates a plane arrangement example of the metal film M5 that is the five layers, in five layers of the metal films M1 to M5 of the multi-layer wiring layer 811.

Furthermore, in A to C of FIG. 42, and A and B of FIG. 43, the region of the pixel 51, and the region of the signal extraction units 65-1 and 65-2 having an octagonal shape illustrated in FIG. 11, are illustrated by a broken line.

In A to C of FIG. 42, and A and B of FIG. 43, the vertical direction in the drawings, is the vertical direction of the pixel array portion 21, and the horizontal direction in the drawings, is the horizontal direction of the pixel array portion 21.

As illustrated in A of FIG. 42, the reflection member 631 that reflects the infrared light, is formed in the metal film M1 that is the first layer of the multi-layer wiring layer 811. In the region of the pixel 51, two pieces of reflection members 631 are formed with respect to each of the signal extraction units 65-1 and 65-2, and two pieces of reflection members 631 of the signal extraction unit 65-1, and two pieces of reflection members 631 of the signal extraction unit 65-1, are formed symmetrically with respect to the vertical direction.

In addition, a pixel transistor wiring region 831 is arranged between the reflection members 631 of the adjacent pixels 51 in the horizontal direction. Wirings for connecting between the pixel transistors Tr of the transfer transistor 721, the reset transistor 723, the amplification transistor 724, or the selection transistor 725, are formed in the pixel transistor wiring region 831. The wiring for the pixel transistor Tr is also formed symmetrically with respect to the vertical direction, on the basis of the intermediate line (not illustrated) of two signal extraction units 65-1 and 65-2.

In addition, wirings such as a ground line 832, a power line 833, and a ground line 834, are formed between the reflection members 631 of the adjacent pixels 51 in the vertical direction. The wirings are also formed symmetrically with respect to the vertical direction, on the basis of the intermediate line of two signal extraction units 65-1 and 65-2.

Thus, the metal film M1 of the first layer is symmetrically arranged in the region on the signal extraction unit 65-1 side and the region on the signal extraction unit 65-2 side, in the pixel, and thus, a wiring load is evenly adjusted by the signal extraction units 65-1 and 65-2. With this arrangement, a driving variation in the signal extraction units 65-1 and 65-2 is reduced.

In the metal film M1 of the first layer, the reflection member 631 having a large area, is formed on a lower side of the signal extraction units 65-1 and 65-2 formed on the substrate 61, and thus, the infrared light that is incident on the substrate 61 through the on-chip lens 62, and is transmitted through the substrate 61 without being subjected to the photoelectric conversion in the substrate 61, can be incident again on the substrate 61 by being reflected on the reflection member 631. With this arrangement, the amount of infrared light to be subjected to the photoelectric conversion in the substrate 61, increases, and thus, the quantum efficiency (QE), that is, the sensitivity of the pixel 51 with respect to the infrared light can be improved.

As illustrated in B of FIG. 42, in the metal film M2 that is the second layer of the multi-layer wiring layer 811, a control line region 351 in which control lines 841 to 844 transmitting a predetermined signal in the horizontal direction, and the like are formed, is arranged in a position between the signal extraction units 65-1 and 65-2. The control lines 841 to 844, for example, are a line transmitting the driving signal TRG, the driving signal RST, the selection signal SEL, or the driving signal FDG.

In the metal film M2 of the second layer, the control line region 851 is arranged in the boundary region of the adjacent pixels 51, and an influence with respect to each of the signal extraction units 65-1 and 65-2 becomes even, and thus, a driving variation in the signal extraction units 65-1 and 65-2 can be reduced.

In addition, a capacity region 852 in which the FD 722B or the additional capacity 727A is formed, is arranged in a predetermined region different from the control line region 651. In the capacity region 852, the pattern of the metal film M2 is formed into the shape of a comb tooth, and thus, the FD 722B or the additional capacity 727A is configured.

The FD 722B or the additional capacity 727A is arranged on the metal film M2 that is the second layer, and thus, it is possible to freely arrange the pattern of the FD 722B or the additional capacity 727A, according to desired wiring capacity on design, and to improve a design freedom.

As illustrated in C of FIG. 42, in the metal film M3 that is the third layer of the multi-layer wiring layer 811, at least the vertical signal line 29 transmitting the pixel signal output from each of the pixels 51 to the column processor 23, is formed. In order to improve a reading speed of the pixel signal, three or more vertical signal lines 29 can be arranged with respect to one pixel column. In addition, shield wiring may be arranged other than the vertical signal line 29, and thus, coupling capacity may be reduced.

In the metal film M4 of the fourth layer and the metal film M5 of the fifth layer of the multi-layer wiring layer 811, the voltage supply lines 741-1 and 741-2 for applying the predetermined voltage MIX0 or MIX1 to the P+ semiconductor regions 73-1 and 73-2 of the signal extraction unit 65 of each of the pixels 51, are formed.

The metal film M4 and the metal film M5, illustrated in A and B of FIG. 43, illustrate an example in the case of adopting the voltage supply line 741 of the first arrangement example illustrated in A of FIG. 33.

The voltage supply line 741-1 of the metal film M4 is connected to the voltage application wiring 814 (for example, FIG. 36) of the metal film M1 through the metal films M3 and M2, and the voltage application wiring 814 is connected to the semiconductor region 73-1 of the signal extraction unit 65-1 of the pixel 51. Similarly, the voltage supply line 741-2 of the metal film M4 is connected to the voltage application wiring 814 (for example, FIG. 36) of the metal film M1 through the metal films M3 and M2, and the voltage application wiring 814 is connected to the P+ semiconductor region 73-2 of the signal extraction unit 65-2 of the pixel 51.

The voltage supply lines 741-1 and 741-2 of the metal film M5 are connected to the driving unit of the peripheral circuit portion in the periphery of the pixel array portion 21. The voltage supply line 741-1 of the metal film M4, and the voltage supply line 741-2 of the metal film M5 are connected to each other in a predetermined position where both of the metal films exist in a plane region, through a via (not illustrated) or the like. A predetermined voltage (the voltage MIX0 or MIX1) from the driving unit of the peripheral circuit portion in the periphery of the pixel array portion 21, is transmitted to the voltage supply lines 741-1 and 741-2 of the metal film M5, is supplied to the voltage supply lines 741-1 and 741-2 of the metal film M4 by transmitting, and is supplied to the voltage application wiring 814 of the metal film M1 from the voltage supply lines 741-1 and 741-2 through the metal films M3 and M2.

As described above, the pixel 51 can be driven only by the vertical driving unit 22, and can be controlled by the horizontal driving unit 24, or a driving unit separately provided from the vertical driving unit 22 and the horizontal driving unit 24, through a control line wired in the vertical direction.

The solid-state imaging element 11 is configured as the rear surface irradiation type CAPD sensor, and thus, for example, as illustrated in A and B of FIG. 43, the voltage supply lines 741-1 and 741-2 for applying the predetermined voltage MIX0 or MIX1 to the signal extraction unit 65 of each of the pixels 51, can be wired in the vertical direction, for example, and a wiring width and a layout of driving wiring can be freely designed. In addition, wiring suitable for high speed driving or wiring considering a load reduction, is also possible.

<Plane Arrangement Example of Pixel Transistor>

Figure 44:
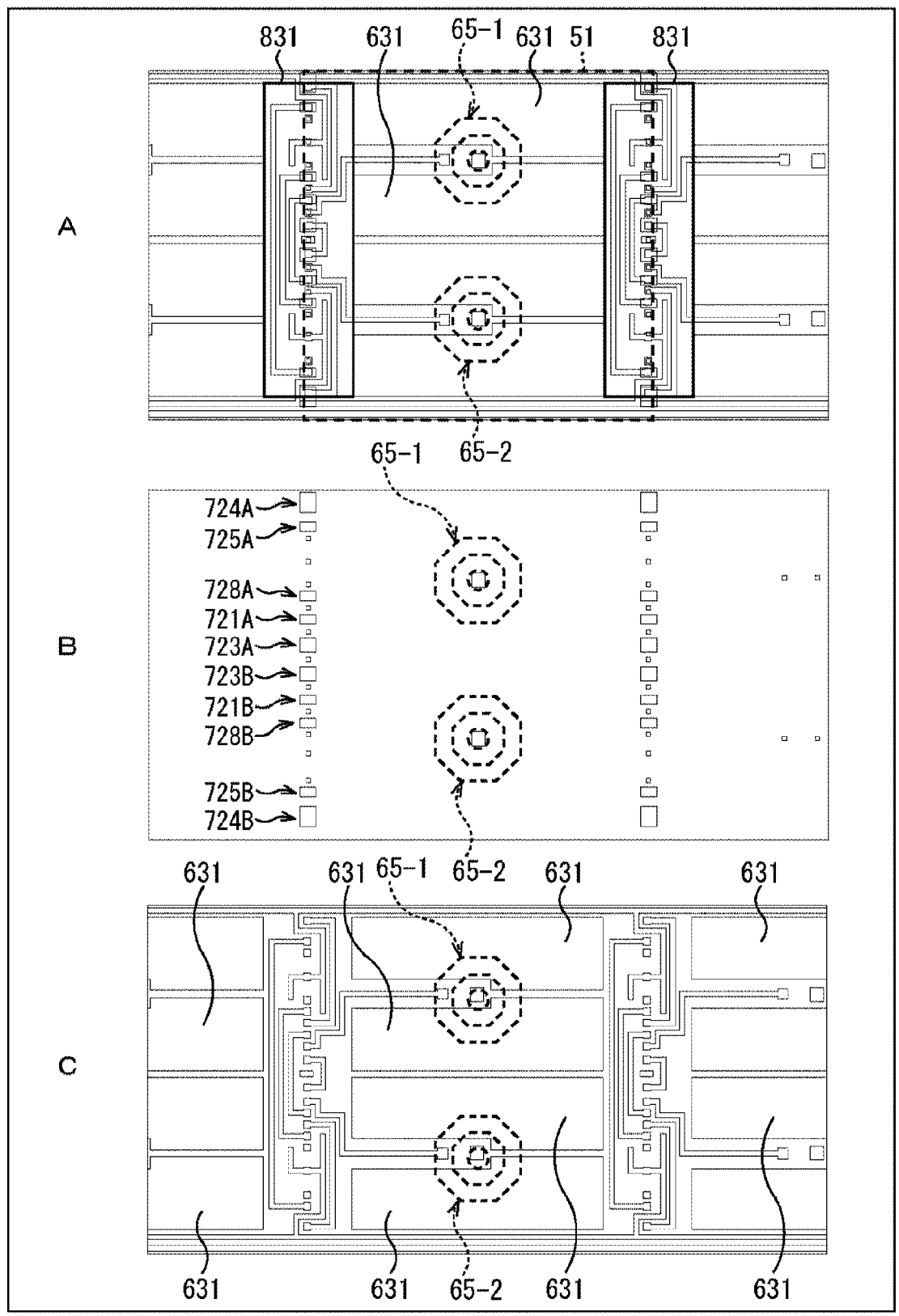
FIG. 44 is a diagram illustrating a polysilicon layer.

FIG. 44 is a plan view in which the metal film M1 of the first layer illustrated in A of FIG. 42, and a polysilicon layer forming the gate electrode or the like of the pixel transistor Tr formed on the metal film M1, overlap with each other.

A of FIG. 44 is a plan view in which the metal film M1 in C of FIG. 44 and the polysilicon layer in B of FIG. 44, overlap with each other, B of FIG. 44 is a plan view of only the polysilicon layer, and C of FIG. 44 is a plan view of only the metal film M1. The plan view of the metal film M1 in C of FIG. 44 is the same as the plan view illustrated in A of FIG. 42, but hatching is omitted.

As described with reference to A of FIG. 42, the pixel transistor wiring region 831 is formed between the reflection members 631 of each of the pixels.

As illustrated in B of FIG. 44, the pixel transistors Tr corresponding to each of the signal extraction units 65-1 and 65-2, for example, are arranged in the pixel transistor wiring region 831.

In B of FIG. 44, the gate electrodes of the reset transistors 723A and 723B, the transfer transistors 721A and 721B, the switching transistors 728A and 728B, the selection transistors 725A and 725B, and the amplification transistors 724A and 724B, are formed from a side close to the intermediate line, on the basis of the intermediate line (not illustrated) of two signal extraction units 65-1 and 65-2.

Wiring connecting between the pixel transistors Tr of the metal film M1, illustrated in C of FIG. 44, is formed symmetrically with respect to the vertical direction, on the basis of the intermediate line (not illustrated) of two signal extraction units 65-1 and 65-2.

Thus, a plurality of pixel transistors Tr in the pixel transistor wiring region 831 are symmetrically arranged in the region on the signal extraction unit 65-1 side and the region on the signal extraction unit 65-2 side, and thus, a driving variation in the signal extraction units 65-1 and 65-2 can be reduced.

<Modification Example of Reflection Member 631>

Next, a modification example of the reflection member 631 formed on the metal film M1, will be described with reference to FIG. 45 and FIG. 46.

In the example described above, as illustrated in A of FIG. 42, the reflection member 631 having a large area, is arranged in a region that is the periphery of the signal extraction unit 65 in the pixel 51.

Figure 45:
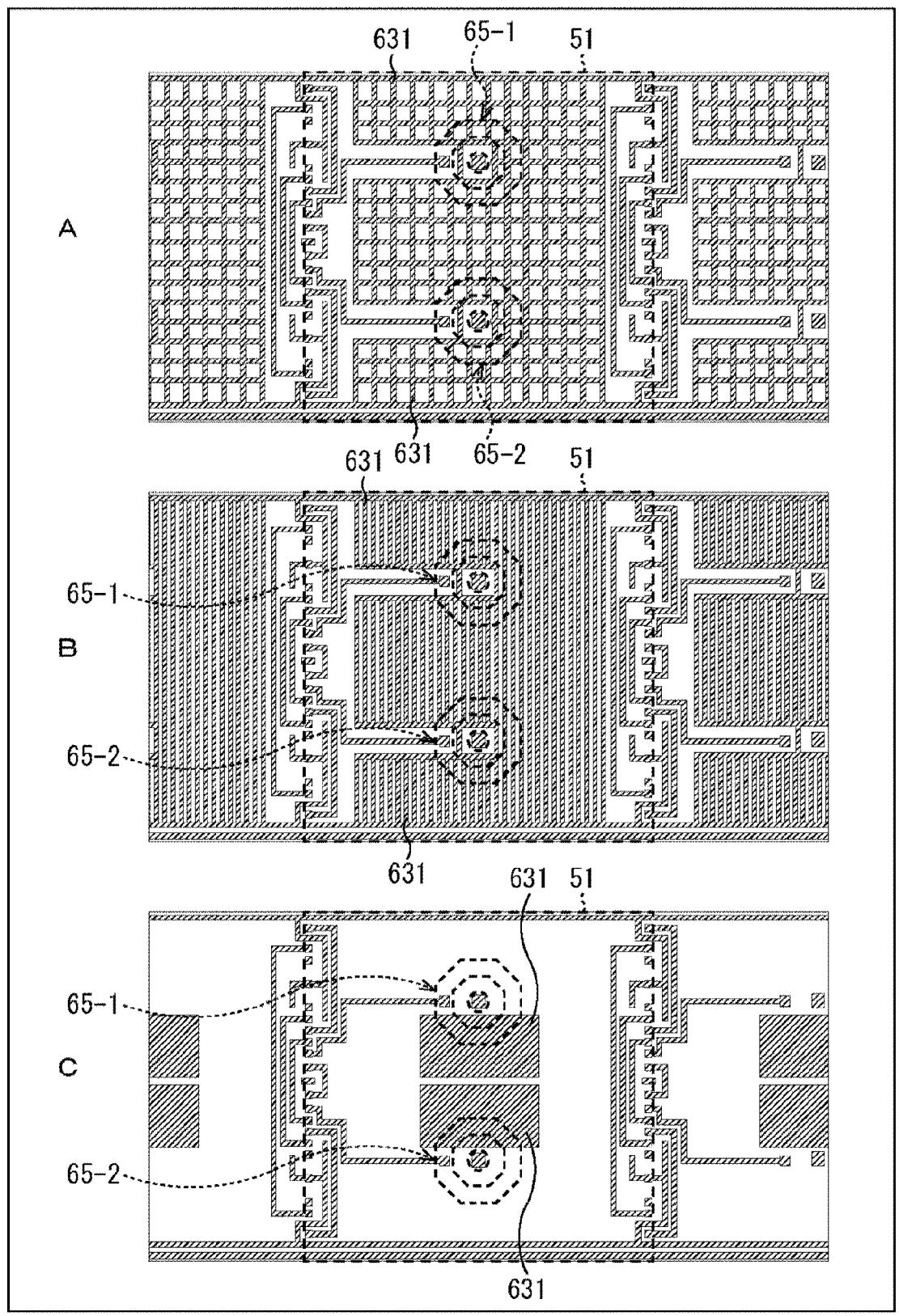
FIG. 45 is a diagram illustrating a modification example of a reflection member formed on the metal film.

In contrast, for example, as illustrated in A of FIG. 45, the reflection member 631 can be arranged in a lattice-shaped pattern. Thus, the reflection member 631 is formed in the lattice-shaped pattern, and thus, pattern anisotropy can be eliminated, and XY anisotropy of reflexibility can be reduced. In other words, the reflection member 631 is formed in the lattice-shaped pattern, and thus, the reflection of the incident light on a biased partial region can be reduced, and isotropic reflection can be easily performed, and therefore, a distance measuring accuracy is improved.

In addition, as illustrated in B of FIG. 45, the reflection member 631, for example, may be arranged in a stripe-shaped pattern. Thus, the reflection member 631 is formed in a stripe-shaped pattern, and thus, the pattern of the reflection member 631 can also be used as wiring capacity, and therefore, it is possible to realize a configuration in which a dynamic range extends to the maximum.

Furthermore, B of FIG. 45 is an example of a stripe shape in the vertical direction, but may be a stripe shape in the horizontal direction.

In addition, as illustrated in C of FIG. 45, the reflection member 631, for example, may be arranged only in a pixel center region, mere specifically, only between two signal extraction units 65. Thus, the reflection member 631 is formed in the pixel center region, and is not formed on a pixel end, and thus, it is possible to suppress a component reflected on the adjacent pixel in a case where oblique light is incident, and to realize a configuration focusing on the suppression of the color mixture, while obtaining a sensitivity improvement effect of the reflection member 631 with respect to the pixel center region.

Figure 46:
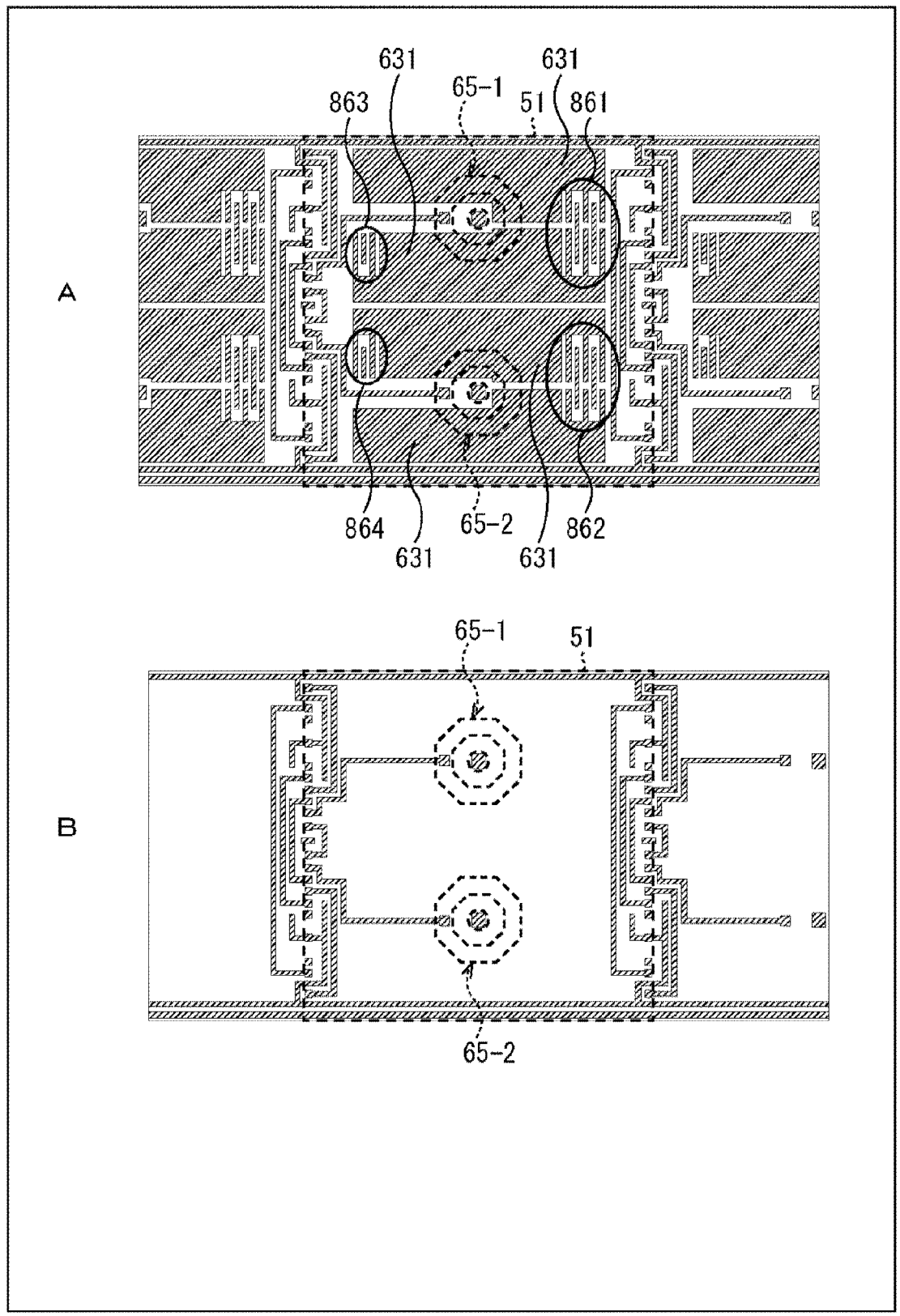
FIG. 46 is a diagram illustrating a modification example of the reflection member formed on the metal film.

In addition, as illustrated in A of FIG. 46, a part of the reflection member 631, for example, is arranged in a comb tooth-shaped pattern, and thus, a part of the metal film M1 may be allocated to the wiring capacity of the FD 722 or the additional capacity 727. In A of FIG. 46, a comb tooth shape in regions 861 to 864 surrounded by a solid line circle, configures at least a part of the FD 722 or the additional capacity 727. The FD 722 or the additional capacity 727 may be arranged by being suitably sorted into the metal film M1 and the metal film M2. The pattern of the metal film M1 can be arranged in the reflection member 631, and the capacity of the FD 722 or the additional capacity 727, with excellent balance.

B of FIG. 46 illustrates the pattern of the metal film M1 in a case where the reflection member 631 is not arranged. In order to increase the amount of infrared light to be subjected to the photoelectric conversion in the substrate 61, and to improve the sensitivity of the pixel 51, it is preferable that the reflection member 631 is arranged, but it is also possible to adopt a configuration in which the reflection member 631 is net arranged.

<Substrate Configuration Example of Solid-State Imaging Element>

Figure 47:
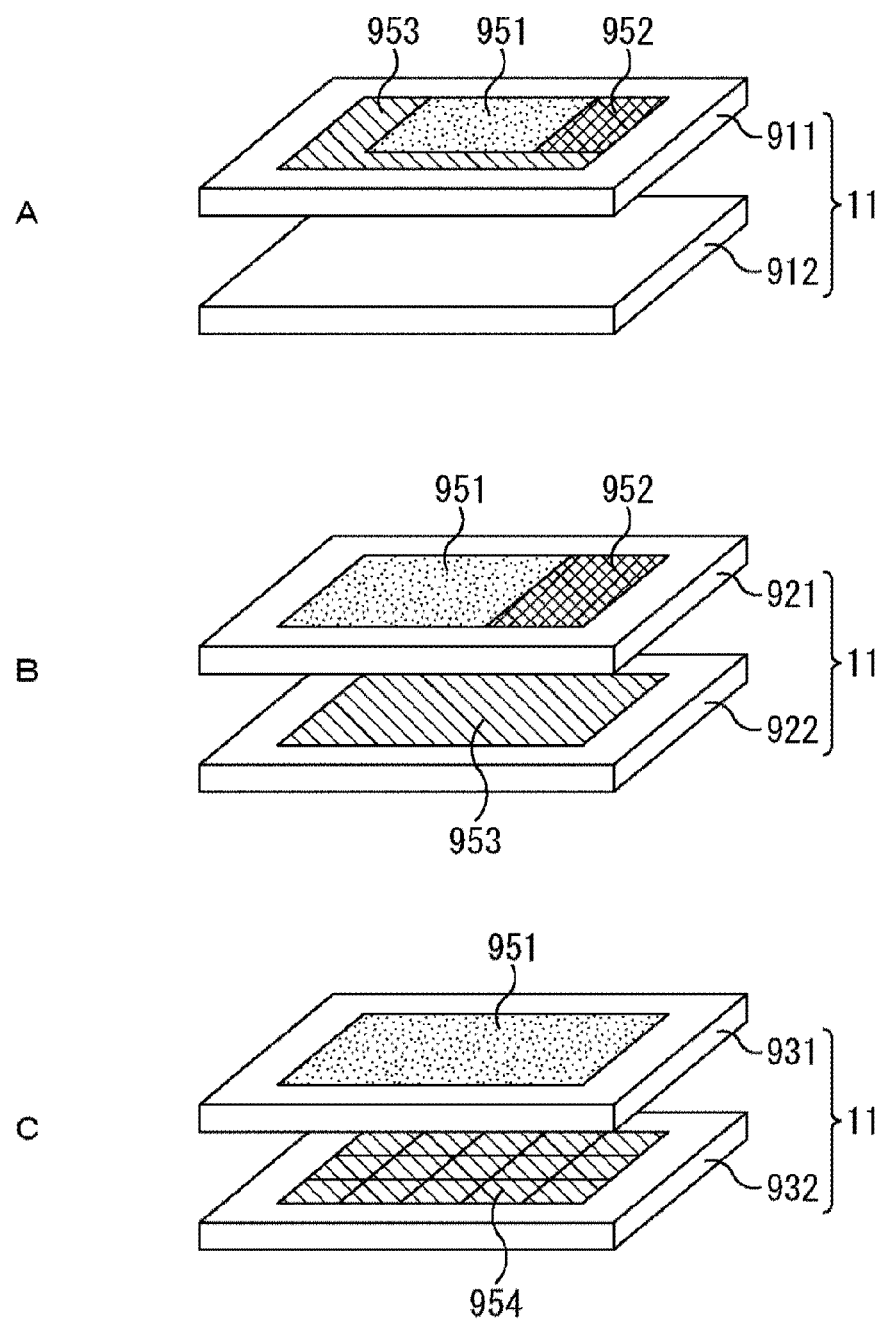
FIG. 47 is a diagram illustrating a substrate configuration of the solid-state imaging element.

In the solid-state imaging element 11 in FIG. 1, any substrate configuration of A to C of FIG. 47 can be adopted.

A of FIG. 47 illustrates an example in which the solid-state imaging element 11 includes one piece of semiconductor substrate 911, and a support substrate 912 under the semiconductor substrate 911.

In this case, a pixel array region 951 corresponding to the pixel array portion 21 described above, a control circuit 952 controlling each pixel of the pixel array region 951, and a logic circuit 953 including a signal processing circuit of a pixel signal, are formed in the semiconductor substrate 911 on an upper side.

The control circuit 952 includes the vertical driving unit 22, the horizontal driving unit 24, or the like, described above. The logic circuit 953 includes the column processor 23 performing AD conversion processing of a pixel signal, or the like, and the signal processor 26 performing distance calculate processing of calculating a distance from a ratio of pixel signals acquired in each of two or more signal extraction units 65 in the pixel, calibration processing, or the like.

In addition, as illustrated in B of FIG. 47, in the solid-state imaging element 11, a first semiconductor substrate 921 on which the pixel array region 951 and the control circuit 952 are formed, and a second semiconductor substrate 922 on which the logic circuit 953 is formed, can be laminated. Furthermore, the first semiconductor substrate 921 and the second semiconductor substrate 922, for example, are electrically connected to each other through a through via or a metallic bond of Cu—Cu.

In addition, as illustrated in C of FIG. 47, in the solid-state imaging element 11, a first semiconductor substrate 931 on which only the pixel array region 951 is formed, and a second semiconductor substrate 932 on which an area control circuit 954 provided with the control circuit controlling each of the pixels, and the signal processing circuit processing the pixel signal, in one unit or in area unit of a plurality of pixels, is formed, can be laminated. The first semiconductor substrate 931 and the second semiconductor substrate 932, for example, are electrically connected to each other through a through via or a metallic bond of Cu—Cu.

As with the solid-state imaging element 11 in C of FIG. 47, according to the configuration in which the control circuit and the signal processing circuit are provided in one pixel unit or in area unit, it is possible to set an optimal driving timing or gain in each division control unit, and to acquire optimized distance information regardless of a distance or a reflection rate. In addition, it is possible to calculate the distance information by driving only a part of the region, but not the entire pixel array region 951, and thus, it is also possible to suppress the power consumption according to an operation mode.

<Configuration Example of Distance Measuring Module>

Figure 48:
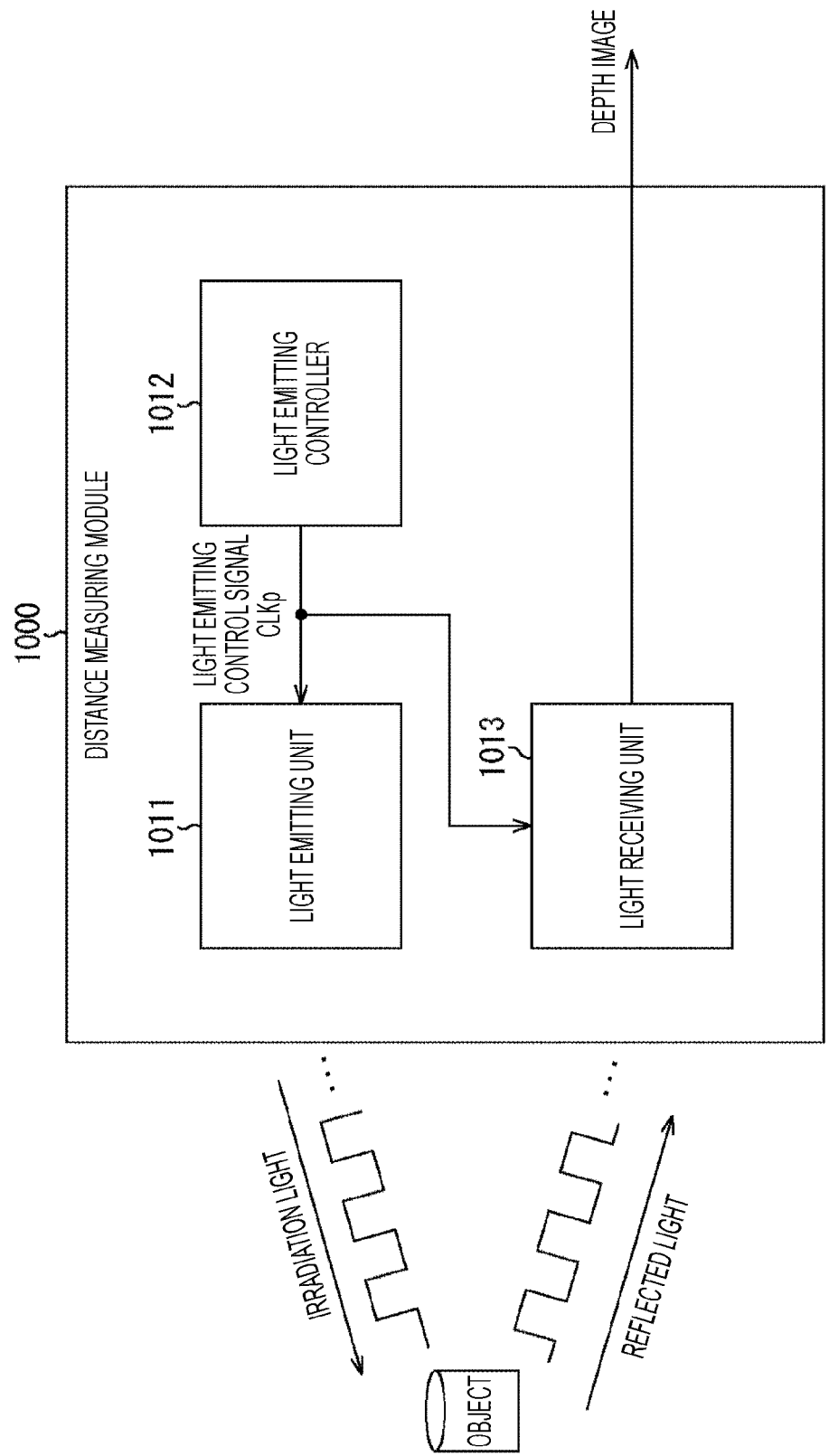
FIG. 48 is a block diagram illustrating a configuration example of a distance measuring module.

FIG. 48 is a block diagram illustrating a configuration example of a distance measuring module outputting distance measuring information by using the solid-state imaging element 11 in FIG. 1.

A distance measuring nodule 1000 includes a light emitting unit 1011, a light emitting controller 1012, and a light receiving unit 1013.

The light emitting unit 1011 includes a light source emitting light of a predetermined wavelength, emits irradiation light of which the brightness periodically fluctuates, and irradiates an object with the irradiation light. For example, the light emitting unit 1011 includes a light emitting diode emitting infrared light of which the wavelength is in a range of 780 nm to 1000 nm, as a light source, and generates the irradiation light in synchronization with a light emitting control signal CLKp of a rectangular wave to be supplied from the light emitting controller 1012.

Furthermore, the light emitting control signal CLKp is not limited to the rectangular wave, insofar as being a periodic signal. For example, the light emitting control signal CLKp may be a sine wave.

The light emitting controller 1012 supplies the light emitting control signal CLKp to the light emitting unit 1011 and the light receiving unit 1013, and controls an irradiation timing of the irradiation light. The frequency of the light emitting control signal CLKp, for example, is 20 megahertz (MHz). Furthermore, the frequency of the light emitting control signal CLKp is not United to 20 megahertz (MHz), and may be 5 megahertz (MHz) or the like.

The light receiving unit 1013 receives reflection light from the object, calculates the distance information for each of the pixels, according to a light receiving result, generates a depth image representing a distance to the object by a grayscale value for each of the pixels, and outputs the depth image.

The solid-state imaging element 11 described above is used in the light receiving unit 1013, and the solid-state imaging element 11 as the light receiving unit 1013, for example, calculates the distance information for each of the pixels, from a signal intensity detected by the charge detection unit (the N+ semiconductor region 71) of each of the signal extraction units 65-1 and 65-2 of each of the pixels 51 of the pixel array portion 21, on the basis of the light emitting control signal CLKp.

As described above, the solid-state imaging element 11 in FIG. 1, can be incorporated as the light receiving unit 1013 of the distance measuring module 1000 that obtains and outputs the distance information to a subject by the indirect ToF method. The solid-state imaging element 11 of each of the embodiments described above, specifically, a solid-state imaging element with an improved pixel sensitivity, as the rear surface irradiation type sensor, is adopted as the light receiving unit 1013 of the distance measuring module 1000, and thus, it is possible to improve distance measuring characteristics as the distance measuring module 1000.

As described above, according to the present technology, the CAPD sensor is configured as a rear surface irradiation type light receiving element, and thus, it is possible to improve the distance measuring characteristics.

Furthermore, in the present technology, it is obvious that the embodiments described above can be suitably combined. That is, for example, it is possible to suitably select the number of signal extraction units or the arrangement position of the signal extraction units to be provided in the pixel, whether or not to set the shape or a share structure of the signal extraction unit, the presence or absence of the on-chip lens, the presence or absence of the inter-pixel light shielding unit, the presence or absence of the separation region, the thickness of the on-chip lens or the substrate, the type of substrate or film design, the presence or absence of the bias with respect to the incidence surface, the presence or absence of the reflection member, and the like, according to which characteristics such as the pixel sensitivity, are prioritized.

In addition, in the above description, an example in which the electron is used as the signal carrier, has been described, but the hole generated by the photoelectric conversion, may be used as the signal carrier. In such a case, it is sufficient, the charge detection unit for detecting the signal carrier, includes the P+ semiconductor region, and voltage application unit for generating the electrical field in the substrate, includes the N+ semiconductor region, and thus, the hole as the signal carrier is detected in the charge detection unit provided in the signal extraction unit.

<Application Example with respect to Mobile Object>

The technology according to the present disclosure (the present technology), can be applied to various products. For example, the technology according to the present disclosure, may be realized as a device to be mounted on any type of mobile object of an automobile, an electric vehicle, a hybridelectric vehicle, a motorcycle, a bicycle, a personal mobility, an airplane, a drone, a ship, a robot, and the like.

Figure 49:
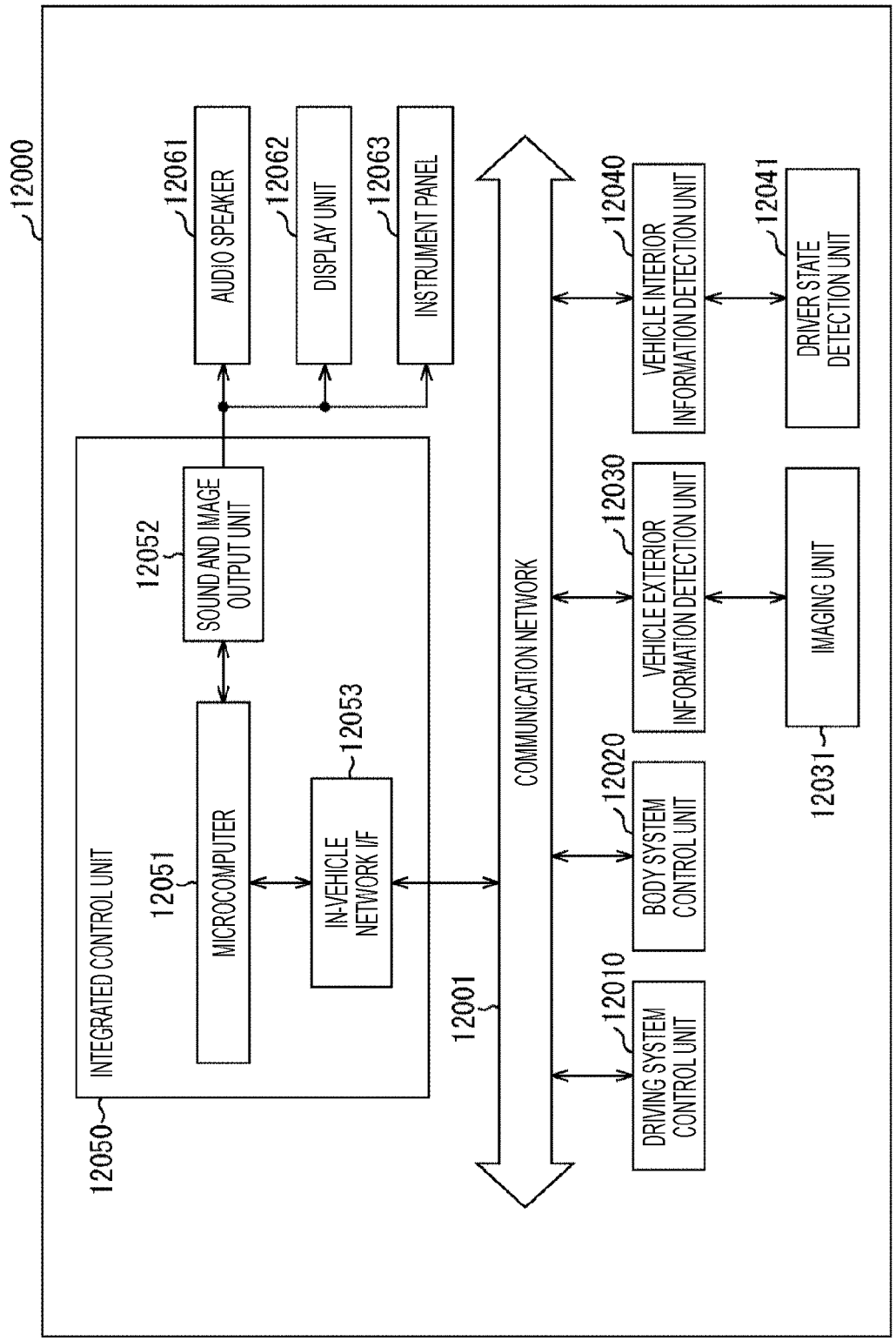
FIG. 49 is a block diagram illustrating an example of a schematic configuration of a vehicle control system.

FIG. 49 is a block diagram illustrating a schematic configuration example of a vehicle control system that is an example of a mobile object control system to which the technology according to the present disclosure can be applied.

A vehicle control system 12000 includes a plurality of electron control units connected to each other through a communication network 12001. In the example illustrated in FIG. 49, the vehicle control system 12000 includes a driving system control unit 12010, a body system control unit 12020, a vehicle exterior information detection unit 12030, a vehicle interior information detection unit 12040, and an integrated control unit 12050. In addition, a microcomputer 12051, a sound and image output unit 12052, and an in-vehicle network interface (I/F) 12053 are illustrated as a function configuration of the integrated control unit 12050.

The driving system control unit 12010 controls the operation of a device relevant to a driving system of a vehicle, according to various programs. For example, the driving system control unit 12010 functions as a control device of a driving force generating device for generating a driving force of the vehicle, such as an internal-combustion engine or a driving motor, a driving force transfer mechanism for transferring a driving force to wheels, a steering mechanism adjusting a steering angle of the vehicle, a braking device generating a braking force of the vehicle, and the like.

The body system control unit 12020 controls the operations of various devices mounted on a vehicle body, according to various programs. For example, the body system control unit 12020 functions as a control device of a keyless entry system, a smart key system, a power window device, or various lamps such as a head lamp, a back lamp, a brake lamp, an indicator, or a fog lamp. In this case, a radiowave emitted from a portable device that substitutes a key or signals of various switches can be input into the body system control unit 12020. The body system control unit 12020 receives the input of the radiowave or the signal, and controls a door locking device, the power window device, the lamp, or the like of the vehicle.

The vehicle exterior information detection unit 12030 detects exterior information of the vehicle on which the vehicle control system 12000 is mounted. For example, an imaging unit 12031 is connected to the vehicle exterior information detection unit 12030. The vehicle exterior information detection unit 12030 allows the imaging unit 12031 to image the vehicle exterior, and receives the image. The vehicle exterior information detection unit 12030 may perform object detection processing of a person, a car, an obstacle, a sign, a character on the road surface, or the like, or distance detection processing, on the basis of the received image.

The imaging unit 12031 is a light sensor that receives light, and outputs an electric signal according to the amount of received light. The imaging unit 12031 is capable of outputting the electric signal as an image, and is also capable of outputting the electric signal as the distance measuring information. In addition, the light received by the imaging unit 12031, may be visible light, or may be non-visible light such as an infrared ray.

The vehicle interior information detection unit 12040 detects vehicle interior information. For example, a driver state detection unit 12041 detecting the state of a driver, is connected to the vehicle interior information detection unit 12040. The driver state detection unit 12041, for example includes a camera imaging the driver, and the vehicle interior information detection unit 12040 may calculate the degree of fatigue or the degree of concentration of the driver, or may determine whether or not the driver dozes off, on the basis of detection information input from the driver state detection unit 12041.

The microcomputer 12051 is capable of calculating a control target value of the driving force generating device, the steering mechanism, or the braking device, and is capable of outputting a control comma/id to the driving system control unit 12010, on the basis of the vehicle interior information or the vehicle exterior information acquired by the vehicle exterior information detection unit 12030 or the vehicle interior information detection unit 12040. For example, the microcomputer 12051 is capable of performing cooperative control fox realizing the function of an advanced driver assistance system (ADAS), including collision avoidance or impact relaxation of the vehicle, follow-up traveling based on an inter-vehicular distance, vehicle speed maintaining traveling, a collision warning of the vehicle, a lane departure warning or the vehicle, or the like.

In addition, the microcomputer 12051 controls the driving force generating device, the steering mechanism, the braking device, or the like, on the basis of the information around the vehicle, acquired by the vehicle exterior information detection unit 12030 or the vehicle interior information detection unit 12040, and thus, is capable of performing cooperative control for automated driving or the like in which a vehicle autonomously travels regardless of the manipulation of the driver.

In addition, the microcomputer 12051 is capable of outputting the control command to the body system control unit 12020, on the basis of the vehicle exterior information acquired by the vehicle exterior information detection unit 12030. For example, the microcomputer 12051 is capable of performing cooperative control for controlling a head lamp according to the position of the leading vehicle or the oncoming vehicle, sensed by the vehicle exterior information detection unit 12030, and for performing antiglaring such as switching a high beam into a low beam.

The sound and image output unit 12052 transmits an output signal of at least one of a sound or an image to an output device that is capable of visually or audibly notifying information to a passenger of the vehicle or the vehicle exterior. In the example of FIG. 49, an audio speaker 12061, a display unit 12062, and an instrument panel 12063 are exemplified as the output device. The display unit 12062, for example, may include at least one of an on-board display or a head-up display.

Figure 50:
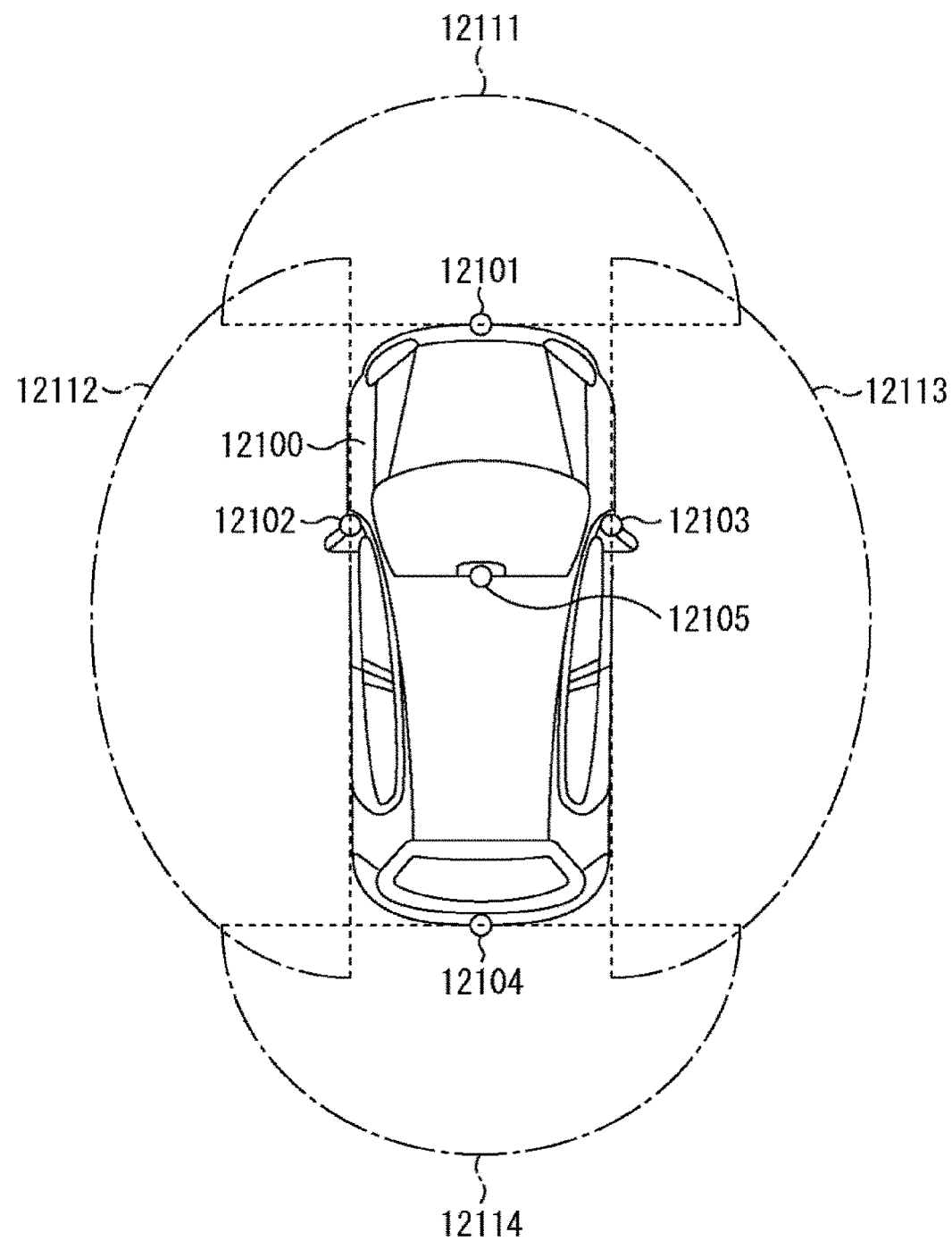
FIG. 50 is a diagram illustrating an example of an installation position of a vehicle exterior information detection unit and an imaging unit.

FIG. 50 is a diagram illustrating an example of an installation position of the imaging unit 12031.

In FIG. 50, a vehicle 12100 includes imaging units 12101, 12102, 12103, 12104, and 12105, as the imaging unit 12031.

The imaging units 12101, 12102, 12103, 12104, and 12105, for example, are provided in a position such as a front nose, a side mirror, a rear bumper, and a backdoor of the vehicle 12100, and an upper portion of a front glass in the vehicle. The imaging unit 12101 provided in the front nose and the imaging unit 12105 provided in the upper portion of the front glass in the vehicle, mainly acquire the image of the vehicle 12300 on a front side. The imaging units 12102 and 12103 provided in the side mirror, mainly acquire the image of the vehicle 12100 on a lateral side. The imaging unit 12104 provided in the rear bumper or the backdoor, mainly acquires the image of the vehicle 12100 on a rear side. The image on the front aide, acquired by the imaging units 12101 and 12105, is mainly used for detecting the leading vehicle, a pedestrian, an obstacle, a traffic light, a traffic sign, a traffic lane, or the like.

Furthermore, FIG. 50 illustrates an example of an imaging range of the imaging units 12101 to 12104. An imaging range 12111 indicates an imaging range of the imaging unit 12101 provided in the front nose, imaging ranges 12112 and 12113 indicate imaging ranges of the imaging units 12102 and 12103 respectively provided in the side mirrors, and an imaging range 12114 indicates an imaging range of the imaging unit 12104 provided in the rear bumper or the backdoor. For example, an overhead image of the vehicle 12100 seen from an upper side, is obtained by overlapping image data imaged by the imaging units 12101 to 12104.

At least one of the imaging units 12101 to 12104, may have a function of acquiring the distance information. For example, at least one of the imaging units 12101 to 12104 may be a stereo camera including s plurality of imaging elements, or may be an imaging element including a pixel for detecting a phase difference.

For example, the microcomputer 12051 obtains a distance to each solid object in the imaging ranges 12111 to 12114, and a temporal change in the distance (a relative speed with respect to the vehicle 12100), on the basis of the distance information obtained from the imaging units 12101 to 12104, and thus, in the closest solid object on a traveling path of the particularly vehicle 12100, it is possible to extract a solid object traveling at a predetermined speed (for example, greater than or equal to 0 km/h), in a direction approximately identical to the vehicle 12100, as the leading vehicle. Further, the microcomputer 12051 sets the inter-vehicular distance to be ensured in advance in front of the leading vehicle, and thus, is capable of performing automatic brake control (also including follow-up stop control), automatic acceleration control (also including follow-up start control), or the like. Thus, it is possible to perform the cooperative control for the automated driving or the like in which the vehicle autonomously travels regardless of the manipulation of the driver.

For example, the microcomputer 12051 extracts solid object data associated with the solid object, by sorting the solid object data into other solid objects such as a two-wheeled vehicle, an ordinary vehicle, a heavy-duty vehicle, a pedestrian, and a power pole, and thus, is capable of using the solid object data in automatic avoidance of the obstacle, on the basis of the distance information obtained from the imaging units 12101 to 12104. For example, the microcomputer 12051 identifies the obstacle in the periphery of the vehicle 12100, into an obstacle that is visible for the driver of the vehicle 12100, and an obstacle that is difficult to be seen by the driver. Then, the microcomputer 12051 determines collision risk indicating the degree of risk of collision with respect to each of the obstacles, and when the collision risk is greater than or equal to a setting value, and there is a possibility of collision, a warning is output to the driver through the audio speaker 12061 or the display unit 12062, or forced deceleration or avoidance steering is performed through the driving system control unit 12010, and thus, driving support for collision avoidance can be performed.

At least one of the imaging units 12101 to 12104, may be an infrared ray camera detecting an infrared ray. For example, the microcomputer 12051 determines whether or not a pedestrian exists in the images imaged by the imaging units 12101 to 12104, and thus, it is possible to recognize the pedestrian. Such recognition of the pedestrian, for example, is performed in a procedure of extracting a characteristic point in the images imaged by the imaging units 12101 to 12104 as the infrared ray camera, and a procedure of determining whether or not there is a pedestrian by performing pattern matching processing with respect to a set of characteristic points representing the outline of the object. In a case where the microcomputer 12051 determines that there is a pedestrian in the images imaged by the imaging units 12101 to 12104, and recognizes the pedestrian, the sound and image output unit 12052 controls the display unit 12062 such that a square outline for emphasis is superimposition-displayed on the recognized pedestrian. In addition, the sound and image output unit 12052 may control the display unit 12062 such that an icon or the like representing the pedestrian, is displayed in a desired position.

As described above, an example of the vehicle control system to which the technology according to the present disclosure can be applied, has been described. In the configurations described above, the technology according to the present disclosure can be applied to the imaging unit 12031. Specifically, for example, the solid-state imaging element 11 illustrated in FIG. 1 is applied to the imaging unit 12031, and thus, it is possible to improve the characteristics such as the sensitivity.

In addition, the embodiments of the present technology are not limited to the embodiments described above, and various changes can be performed within a range not departing from the gist of the present technology.

In addition, the effects described herein are merely an example, and are not limited, and other effects may be provided.

Further, the present technology is also capable of having the following configurations.

(A1)

A light receiving element, including:

an on-chip lens;

a wiring layer; and a semiconductor layer arranged between the on-chip lens and the wiring layer, in which the semiconductor layer includes
a first voltage application unit to which a first voltage is applied,
a second voltage application unit to which a second voltage is applied, the second voltage being different from the first voltage,
a first charge detection unit arranged around the first voltage application unit, and
a second charge detection unit arranged around the second voltage application unit,
the wiring layer includes
at least one layer including first voltage application wiring configured to supply the first voltage, second voltage application wiring configured to supply the second voltage, and a reflection member, and
the reflection member is provided to overlap with the first charge detection unit or the second charge detection unit, in plan view.

(A2)
The light receiving element according to (A1), in which the first voltage application unit, the second voltage application unit, the first charge detection unit, and the second charge detection unit are in contact with the wiring layer.

(A3)
The light receiving element according to (A1) or (A2), in which the one layer including the first voltage application wiring, the second voltage application wiring, and the reflection member, includes a layer closest to the semiconductor layer.

(A4)
The light receiving element according to any one of (A1) to (A3), in which the first voltage application unit or the second voltage application unit includes
a first region containing an acceptor element at a first impurity concentration, on the wiring layer side, and
a second region containing an acceptor element at a second impurity concentration lower than the first impurity concentration, on the on-chip lens side.

(A5)
The light receiving element according to any one of (A1) to (A4), in which the first charge detection unit or the second charge detection unit includes
a third region containing a donor element at a third impurity concentration, on the wiring layer side, and
a fourth region containing a donor element at a second impurity concentration lower than the third impurity 1 concentration, on the on-chip lens side.

(A6)
The light receiving element according to any one of (A1) to (A5), in which the reflection member includes a metal film.

(A7)
The light receiving element according to any one of (A1) to (A6), in which the reflection member is symmetrically arranged in a region on the first charge detection unit side and a region on the second charge detection unit side.

(A8)
The light receiving element according to any one of (A1) to (A7), in which the reflection member is arranged in a lattice-shaped pattern.

(A9)
The light receiving element according to any one of (A1) to (A7), in which the reflection member is arranged in a stripe-shaped pattern.

(A10)
The light receiving element according to any one of (A1) to (A7), in which the reflection member is arranged only in a pixel center region.

(A11)
The light receiving element according to any one of (A1) to (A7), in which the wiring layer further includes wiring capacity on a same layer as that of the reflection member.

(A12)
The light receiving element according to any one of (A1) to (A11), in which the wiring layer further includes wiring capacity on a layer different from that of the reflection member.

(A13)
The light receiving element according to any one of (A1) to (A12), in which the wiring Layer further includes a voltage supply line configured to supply the first voltage or the second voltage to the first voltage application wiring and the second voltage application wiring.

(A14)
The light receiving element according to (A13), in which the voltage supply line is arranged in Mirror arrangement in which connection destinations with respect to two pixels vertically adjacent to each other are mirror-inverted.

(A15)
The light receiving element according to (A13), in which the voltage supply line is arranged in Periodic arrangement periodically repeated with respect to pixels arranged in a vertical direction.

(A16)
The light receiving element according to any one of (A13) to (A15), in which two of the voltage supply lines are arranged with respect to two columns of pixels.

(A17)
The light receiving element according to any one of (A13) to (A15), in which four of the voltage supply lines are arranged with respect to two columns of pixels.

(A18)
The light receiving element according to any one of (A1) to (A17), in which the wiring layer further includes
a first pixel transistor configured to drive the first charge detection unit, and
a second pixel transistor configured to drive the second charge detection unit, and
the first pixel transistor and the second pixel transistor are symmetrically arranged.

(B1)
An imaging element, including:
a pixel array portion including a plurality of pixels configured to perform photoelectric conversion with respect to incident light,
in which the pixel includes
a substrate configured to perform the photoelectric conversion with respect to the incident light, and
a signal extract ion unit including a voltage application unit for generating an electrical field by applying a voltage to the substrate, and a charge detection unit for detecting a signal carrier generated by the photoelectric conversion, the signal extraction unit being provided on a surface of the substrate on a side opposite to an incidence surface on which the light is incident, in the substrate.

(B2)
The imaging element according to (B1), in which two of the signal extraction units are formed in the pixel.

(B3)
The imaging element according to (B1), in which one of the signal extraction units is formed in the pixel.

(B4)
The imaging element according to (B1), in which three or more of the signal extraction units are formed in the pixel.
(B5)
The imaging element according to (B1), in which the signal extraction unit is shared between the pixel, and another pixel adjacent to the pixel.
(B6)
The imaging element according to (B1), in which the voltage application unit is shared between the pixel, and another pixel adjacent to the pixel.
(B7)
The imaging element according to any one of (B1) to (B6), in which the signal extraction unit includes a P type semiconductor region as the voltage application unit, and an N type semiconductor region as the charge detection unit, the N type semiconductor region being formed to surround the P type semiconductor region.
(B8)
The imaging element according to any one of (B1) to (B6), in which the signal extraction unit includes an N type semiconductor region as the charge detection unit, and a P type semiconductor region as the voltage application unit, the P type semiconductor region being formed to surround the N type semiconductor region.
(B9)
The imaging element according to any one of (B1) to (B6), in which the signal extraction unit includes a first N type semiconductor region and a second N type semiconductor region as the charge detection unit, and a P type semiconductor region as the voltage application unit, the P type semiconductor region being formed in a position interposed between the first N type semiconductor region and the second N type semiconductor region.
(B10)
The imaging element according to any one of (B1) to (B6), in which the signal extraction unit includes a first P type semiconductor region and a second P type semiconductor region as the voltage application unit, and an N type semiconductor region as the charge detection unit, the N type semiconductor region being formed in a position interposed between the first P type semiconductor region and the second P type semiconductor region.
(B11)
The imaging element according to anyone of (B1) to (B10), in which a voltage is applied to the incidence surface side in the substrate.
(B12)
The imaging element according to any one of (B1) to (B11), in which the pixel further includes a reflection member configured to reflect the light incident on the substrate from the incidence surface, the reflection member being formed on a surface of the substrate on a side opposite to the incidence surface.
(B13)
The imaging element according to any one of (B1) to (B12), in which the signal carrier includes an electron.
(B14)
The imaging element according to any one of (B1) to (B12), in which the signal carrier includes a hole.
(B15)
The imaging element according to any one of (B1) to (B14), in which the pixel further includes a lens configured to condense the light and to allow the light to be incident on the substrate.

(B16)
The imaging element according to any one of (B1) to (B15), in which the pixel further includes an inter-pixel light shielding unit configured to shield the incident light, the inter-pixel light shielding unit being formed in a pixel end portion on the incidence surface of the substrate.
(B17)
The imaging element according to any one of (B1) to (B17), in which the pixel further includes a pixel separation region configured to penetrate through at least a part of the substrate and to shield the incident light, the pixel separation region being formed in a pixel end portion in the substrate.
(B18)
The imaging element according to any one of (B1) to (B17), in which the substrate includes a P type semiconductor substrate having resistance of greater than or equal to 500 [$\Omega$cm].
(B19)
The imaging element according to any one of (B1) to (B17), in which the substrate includes an N type semiconductor substrate having resistance of greater than or equal to 500 [$\Omega$cm].
(B20)
An imaging device, including:
a pixel array portion including a plurality of pixels configured to perform photoelectric conversion with respect to incident light; and
a signal processor configured to calculate distance information to a target, on a basis of a signal output from the pixel,
in which the pixel includes
a substrate configured to perform the photoelectric conversion with respect to the incident light, and
a signal extraction unit including a voltage application unit for generating an electrical field by applying a voltage to the substrate, and a charge detection unit for detecting a signal carrier generated by the photoelectric conversion, the signal extraction unit being provided on a surface of the substrate on a side opposite to an incidence surface on which the light is incident, in the substrate.

REFERENCE SIGNS LIST

11 Solid-state imaging element
21 Pixel array portion
22 Vertical driving unit
51 Pixel
61 Substrate
62 On-chip lens
71-1, 71-2, 71 N+ semiconductor region
73-1, 73-2, 73 P+ semiconductor region
441-1, 441-2, 441 Separated region
471-1, 471-2, 471 Separated region
631 Reflection member
721 Transfer transistor
722 FD
723 Reset transistor
724 Amplification transistor
725 Selection transistor
727 Additional capacity
728 Switching transistor
741 Voltage supply line
811 Multi-layer wiring layer
812 Interlayer insulating film
813 Power line
814 Voltage application wiring
815 Reflection member 816 Voltage application wiring
817 Control line
M1 to M5 Metal film

The invention claimed is:

1. A light receiving element, comprising:
an on-chip lens;
a multi-layer wiring layer; and
a semiconductor layer arranged between the on-chip lens and the multi-layer wiring layer,
wherein the semiconductor layer includes:
a first voltage application unit to which a first voltage is applied;
a second voltage application unit to which a second voltage is applied, the second voltage being different from the first voltage;
a first charge detection unit arranged around the first voltage application unit; and
a second charge detection unit arranged around the second voltage application unit;
wherein the multi-layer wiring layer includes a first wiring layer and a second wiring layer, the first wiring layer including first voltage application wiring configured to supply the first voltage, second voltage application wiring configured to supply the second voltage, and a reflection member,
wherein the first wiring layer is disposed closest to the semiconductor layer and
wherein a part of the reflection member is provided directly under an N-type semiconductor region of the first charge detection unit or an N-type semiconductor region of the second charge detection unit in a plan view.

2. The light receiving element according to claim 1, wherein the first voltage application unit, the second voltage application unit, the first charge detection unit, and the second charge detection unit are in contact with the multi-layer wiring layer.

3. The light receiving element according to claim 1, wherein the first wiring layer including the first voltage application wiring, the second voltage application wiring, and the reflection member, is between a control line included in the second wiring layer and the semiconductor layer.

4. The light receiving element according to claim 1, wherein the first voltage application unit or the second voltage application unit includes,
a first region containing an acceptor element at a first impurity concentration, on the multi-layer wiring layer side, and
a second region containing an acceptor element at a second impurity concentration lower than the first impurity concentration, on the on-chip lens side.

5. The light receiving element according to claim 1, wherein the first charge detection unit or the second charge detection unit includes,
a third region containing a donor element at a third impurity concentration, on the multi-layer wiring layer side, and
a fourth region containing a donor element at a second impurity concentration lower than the third impurity concentration, on the on-chip lens side.

6. The light receiving element according to claim 1, wherein the reflection member includes a metal film.

7. The light receiving element according to claim 1, wherein the reflection member is symmetrically arranged in a region on the first charge detection unit side and a region on the second charge detection unit side.

8. The light receiving element according to claim 1, wherein the reflection member is arranged in a lattice-shaped pattern.

9. The light receiving element according to claim 1, wherein the reflection member is arranged in a stripe-shaped pattern.

10. The light receiving element according to claim 1, wherein the reflection member is arranged only in a pixel center region.

11. The light receiving element according to claim 1, wherein the multi-layer wiring layer further includes wiring capacity on a same layer as that of the reflection member.

12. The light receiving element according to claim 1, wherein the multi-layer wiring layer further includes wiring capacity on a layer different from that of the reflection member.

13. The light receiving element according to claim 1, wherein the multi-layer wiring layer further includes a voltage supply line configured to supply the first voltage or the second voltage to the first voltage application wiring and the second voltage application wiring.

14. The light receiving element according to claim 13, wherein the voltage supply line is arranged in a mirror arrangement in which connection destinations with respect to two pixels vertically adjacent to each other are mirror-inverted.

15. The light receiving element according to claim 13, wherein the voltage supply line is periodically repeated with respect to pixels arranged in a vertical direction.

16. The light receiving element according to claim 13, wherein two voltage supply lines are arranged with respect to two columns of pixels.

17. The light receiving element according to claim 13, wherein four voltage supply lines are arranged with respect to two columns of pixels.

18. The light receiving element according to claim 1, wherein the multi-layer wiring layer further includes,
a first pixel transistor configured to drive the first charge detection unit, and
a second pixel transistor configured to drive the second charge detection unit, and
the first pixel transistor and the second pixel transistor are symmetrically arranged.

19. The light receiving element according to claim 1, wherein the reflection member is dummy wiring.

20. A light receiving element, comprising:
an on-chip lens;
a multi-layer wiring layer; and
a semiconductor layer arranged between the on-chip lens and the multi-layer wiring layer,
wherein the semiconductor layer includes:
a first voltage application unit to which a first voltage is applied;
a second voltage application unit to which a second voltage is applied, the second voltage being different from the first voltage;
a first charge detection unit arranged around the first voltage application unit; and
a second charge detection unit arranged around the second voltage application unit;
wherein the multi-layer wiring layer includes a first wiring layer and a voltage supply line, the first wiring layer including first voltage application wiring configured to supply the first voltage, second voltage application wiring configured to supply the second voltage, and a reflection member, the first wiring layer is a wiring layer disposed closest to the semiconductor layer, the voltage supply line configured to supply the first voltage or the second voltage to the first voltage application wiring and the second voltage application wiring, wherein four voltage supply lines are arranged with respect to two columns of pixels, and wherein a part of the reflection member is provided directly under an N-type semiconductor region of the first charge detection unit or an N-type semiconductor region of the second charge detection unit in a plan view.

* * * * *